(12) United States Patent
Tanaka et al.

(10) Patent No.: US 12,555,531 B2
(45) Date of Patent: Feb. 17, 2026

(54) DISPLAY DEVICE AND DRIVING METHOD OF DISPLAY DEVICE

(71) Applicant: Japan Display Inc., Tokyo (JP)

(72) Inventors: Yukio Tanaka, Tokyo (JP); Tetsuo Morita, Tokyo (JP); Kenji Harada, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 18/768,362

(22) Filed: Jul. 10, 2024

(65) Prior Publication Data
US 2025/0022419 A1 Jan. 16, 2025

(30) Foreign Application Priority Data

Jul. 12, 2023 (JP) ................................ 2023-114455

(51) Int. Cl.
*G09G 3/3233* (2016.01)
*H10K 59/12* (2023.01)
*H10K 59/121* (2023.01)

(52) U.S. Cl.
CPC ....... *G09G 3/3233* (2013.01); *H10K 59/1201* (2023.02); *H10K 59/1213* (2023.02); *G09G 2300/0426* (2013.01); *G09G 2300/0819* (2013.01); *G09G 2300/0842* (2013.01); *G09G 2300/0861* (2013.01); *G09G 2310/08* (2013.01); *G09G 2320/0233* (2013.01)

(58) Field of Classification Search
CPC ......... G09G 3/3233; G09G 2300/0426; G09G 2300/0819; G09G 2300/0842; G09G 2300/0861; G09G 2310/08; G09G 2320/0233; H10K 59/1201; H10K 59/1213
See application file for complete search history.

(56) References Cited

U.S. PATENT DOCUMENTS

| | | | |
|---|---|---|---|
| 2016/0284276 A1 | 9/2016 | Gupta et al. | |
| 2021/0376041 A1* | 12/2021 | Lee | H10K 59/1213 |
| 2022/0399407 A1* | 12/2022 | Cha | H10K 77/111 |
| 2023/0290307 A1* | 9/2023 | Shin | G09G 3/3233 |

* cited by examiner

*Primary Examiner* — Stacy Khoo
(74) *Attorney, Agent, or Firm* — Maier & Maier, PLLC

(57) ABSTRACT

A display device includes a substrate including a display region; and a first pixel arranged in a first region on an outer edge of the display region, and a second pixel arranged in a second region surrounded by the first region. Each of the first pixel and the second pixel includes a first transistor, a second transistor, a first capacitor, a third transistor, and a seventh transistor. A capacitance of a capacitor connected to the gate electrode of the second transistor of the first pixel is different from a capacitance of a capacitor connected to the gate electrode of the second transistor of the second pixel.

12 Claims, 34 Drawing Sheets

DISPLAY DEVICE AND DRIVING METHOD OF DISPLAY DEVICE

CROSS-REFERENCE TO RELATED APPLICATIONS

This application claims the benefit of priority to Japanese Patent Application No. 2023-114455 filed on Jul. 12, 2023, the entire contents of which are incorporated herein by reference.

FIELD

An embodiment of the present invention relates to a display device and a driving method of the display device.

BACKGROUND

In recent years, self-luminous display devices have been mounted on televisions, smart phones, digital signage (electronic signboards, electronic advertising boards, and the like) and are becoming popular. The self-luminous display device includes, for example, a plurality of pixels and a driver for driving the plurality of pixels. Each of the plurality of pixels includes, for example, a plurality of transistors, a capacitive element, and a light emitting element. The light emitting element is, for example, a light emitting diode (Light Emitting Diode: LED), a micro light emitting diode (micro LED), or an organic electroluminescence (Electro Luminescence: EL) element. In a self-luminous display device, a driver supplies a voltage to each of a plurality of pixels, so that a current corresponding to the supplied voltage value flows to a light emitting element included in each of the plurality of pixels. Each of the light emitting elements emits light with a luminance corresponding to a current flowing through the light emitting element, and a pixel including the light emitting element can display an image with a gradation corresponding to the luminance. On the other hand, there is increasing demand for in-plane uniformity of the self-luminous display device.

For example, U.S. Patent Application Publication No. 2016/0284276 discloses a pixel including six transistors, one capacitive element, and one light emitting element, and a self-luminous display device including the pixel.

SUMMARY

A display device according to an embodiment of the present invention includes a substrate including a display region; and a first pixel arranged in a first region on an outer edge of the display region, and a second pixel arranged in a second region surrounded by the first region. Each of the first pixel and the second pixel includes a first transistor controlled using a second control signal to which a first control signal has been shifted, the first transistor electrically connected between an image data signal line and a first node, a second transistor electrically connected between the first node and a second node, a first capacitor electrically connected to a gate electrode of the second transistor, a third transistor controlled to supply a threshold voltage of the second transistor to the gate electrode of the second transistor and the first capacitor using the first control signal to which a third control signal has been shifted, the third transistor electrically connected between the second node and a gate electrode of the second transistor, and a seventh transistor controlled to supply a reset voltage to the gate electrode of the second transistor and the first capacitor using the third control signal, the seventh transistor electrically connected to the second node. A capacitance of a capacitor connected to the gate electrode of the second transistor of the first pixel is different from a capacitance of a capacitor connected to the gate electrode of the second transistor of the second pixel.

A display device according to an embodiment of the present invention includes a substrate including a display region; and a third pixel arranged in a third region including one end of the display region, and a fourth pixel arranged in a fourth region adjacent to the third region. Each of the first pixel and the second pixel includes a first transistor controlled using a second control signal to which a first control signal has been shifted, the first transistor electrically connected between an image data signal line and a first node, a second transistor electrically connected between the first node and a second node, a first capacitor electrically connected to a gate electrode of the second transistor, a third transistor controlled to supply a threshold voltage of the second transistor to the gate electrode of the second transistor and the first capacitor using the first control signal to which a third control signal has been shifted, the third transistor electrically connected between the second node and a gate electrode of the second transistor, and a seventh transistor controlled to supply a reset voltage to the gate electrode of the second transistor and the first capacitor using the third control signal, the seventh transistor electrically connected to the second node. A capacitance of a capacitor connected to the image data signal line connected to the third pixel is different from a capacitance of a capacitor connected to the image data signal line connected to the fourth pixel.

A driving method of display device according to an embodiment of the present invention is a driving method of a display device including a substrate including a display region; and a sixth pixel arranged in a sixth region including one end of the display region, and a seventh pixel arranged in a seventh region adjacent to the sixth region. Each of the sixth pixel and the seventh pixel includes a first transistor controlled using a second control signal to which a first control signal has been shifted, the first transistor electrically connected between an image data signal line and a first node, a second transistor electrically connected between the first node and a second node, a first capacitor electrically connected to a gate electrode of the second transistor, a third transistor controlled to supply a threshold voltage of the second transistor to the gate electrode of the second transistor and the first capacitor using the first control signal to which a third control signal has been shifted, the third transistor electrically connected between the second node and a gate electrode of the second transistor, and a seventh transistor controlled to supply a reset voltage to the gate electrode of the second transistor and the first capacitor using the third control signal, the seventh transistor electrically connected to the second node. A time during which the first control signal and the second control signal supplied to the sixth pixel overlap is longer than a time during which the second control signal and a fifth control signal to which the second control signal has been shifted supplied to the seventh pixel overlap.

A driving method of display device according to an embodiment of the present invention is a driving method of a display device including a substrate including a display region; and a sixth pixel arranged in a sixth region including one end of the display region, and a seventh pixel arranged in a seventh region adjacent to the sixth region. Each of the sixth pixel and the seventh pixel includes a first transistor controlled using a second control signal to which a first control signal has been shifted, the first transistor electrically connected between an image data signal line and a first node, a second transistor electrically connected between the first node and a second node, a first capacitor electrically connected to a gate electrode of the second transistor, a third transistor controlled to supply a threshold voltage of the second transistor to the gate electrode of the second transistor and the first capacitor using the first control signal to which a third control signal has been shifted, the third transistor electrically connected between the second node and a gate electrode of the second transistor, and a seventh transistor controlled to supply a reset voltage to the gate electrode of the second transistor and the first capacitor using the third control signal, the seventh transistor electrically connected to the second node. A voltage supplied during a time during which the first control signal and the second control signal supplied to the sixth pixel overlap is bigger than a voltage supplied during a time during which the second control signal and a fifth control signal to which the second control signal has been shifted supplied to the seventh pixel overlap.

DESCRIPTION OF EMBODIMENTS

Hereinafter, embodiments of the present invention will be described with reference to the drawings and the like. However, the present invention can be implemented in many different aspects, and should not be construed as being limited to the description of the embodiments exemplified below. Further, in order to make the description clearer, the drawings may be schematically represented with respect to the width, thickness, shape, configuration and the like of each part as compared with the actual embodiment. However, the drawings are merely examples, and do not limit the interpretation of the present invention. It should be noted that the terms "first" and "second" for each element are convenient labels used to distinguish each element, and do not have any further meaning unless otherwise described.

In addition, in the present specification, the expression "a includes A, B, or C," "a includes any of A, B, or C," "a includes one selected from the group consisting of A, B, and C," and the like does not exclude cases where a includes a plurality of combinations of A to C unless otherwise specified. Furthermore, these expressions do not exclude the case where a includes other elements.

For example, a phenomenon in which an outermost circumference of a display region emits light more brightly at low brightness than other areas has been confirmed in the self-luminous display device.

In view of such a problem, an object of an embodiment of the present invention is to provide a self-luminous display device and a driving method of the self-luminous display device capable of in plane uniformization of a light emitting element (self-luminous display device).

A self-luminous display device according to an embodiment of the present invention is, for example, a light emitting device using an EL element as a light emitting element.

1. First Embodiment

[1-1. Overview of Self-Luminous Display Device 10]

Figure 1:
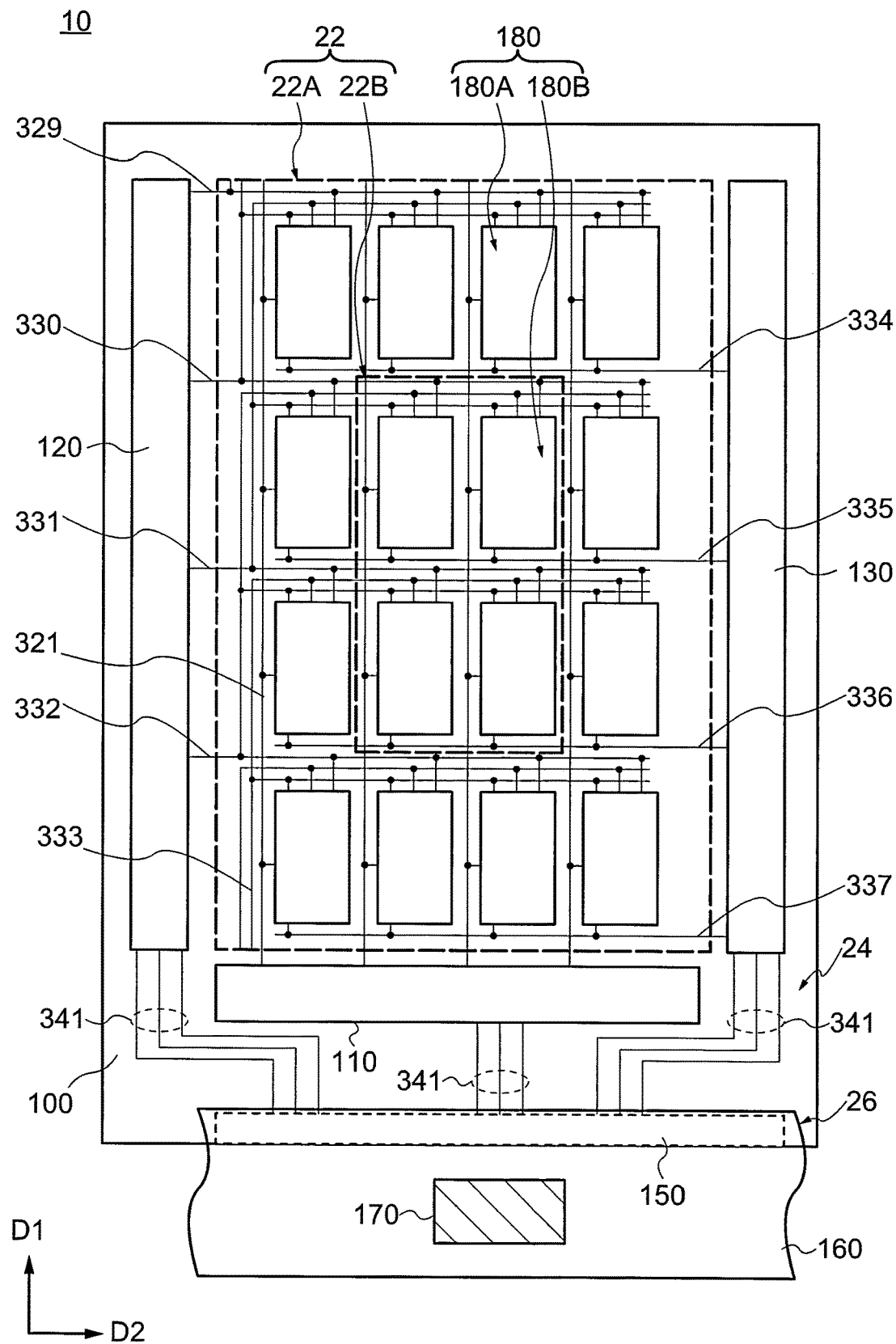
FIG. 1 is a schematic diagram showing a configuration of a self-luminous display device according to a first embodiment of the present invention.
Figure 2:
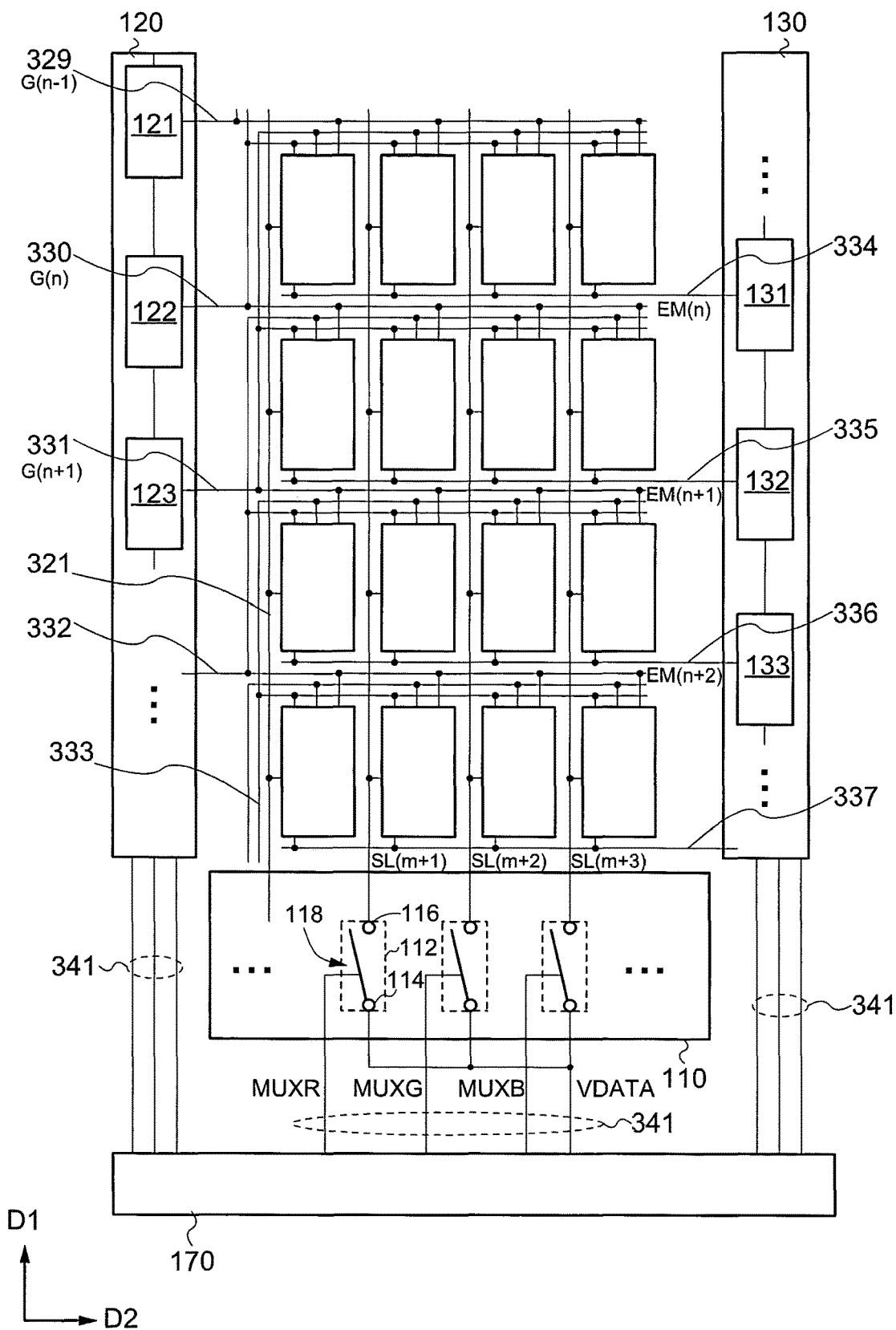
FIG. 2 is a schematic diagram showing a configuration of the self-luminous display device according to the first embodiment of the present invention.

An overview of a self-luminous display device 10 according to a first embodiment will be described with reference to FIG. 1 and FIG. 2. FIG. 1 and FIG. 2 are schematic diagrams showing a configuration of the self-luminous display device 10 according to the first embodiment. The configuration of the self-luminous display device 10 shown in FIG. 1 and FIG. 2 is an example, and the configuration of the self-luminous display device 10 is not limited to the configuration shown in FIG. 1 and FIG. 2.

As shown in FIG. 1 or FIG. 2, the self-luminous display device 10 includes an array substrate 100, a flexible printed circuit substrate 160 (FPC 160), and an IC chip 170. The self-luminous display device 10 includes a display region 22 arranged on the array substrate 100, a peripheral region 24 surrounding the display region 22, and a terminal region 26.

A plurality of pixels 180 in the display region 22 is arranged in a matrix. The pixel 180 is the smallest unit constituting a part of the image to be displayed in the display region 22. For example, each of the plurality of pixels 180 may correspond to a sub-pixel R, a sub-pixel G, and a sub-pixel B. One pixel may be formed by three sub-pixels. The arrangement of the pixels 180 is not limited. For example, the arrangement of the plurality of pixels 180 is a stripe arrangement. The arrangement of the self-luminous display device 10 may be a delta arrangement, or a pentile arrangement, or the like.

The display region 22 includes a region 22A and a region 22B. The region 22A is arranged at an outer edge of the display region 22 so as to surround the region 22B. The region 22A may include a plurality of pixels 180A of one row and one column arranged at the outermost periphery of the display region 22, and may include a plurality of rows and a plurality of columns of the plurality of pixels 180A. Here, in the case where the pixel 180A and the pixel 180B are not distinguished from each other, they are referred to as the pixel 180. Although details will be described later, a capacitance of the pixel 180A is different from a capacitance of the pixel 180B in the present embodiment. A capacitance of a capacitor connected to a gate electrode 622 of a second transistor T2 of the pixel 180A is different from a capacitance of a capacitor connected to the gate electrode 622 of the second transistor T2 of the pixel 180B.

The sub-pixel R, the sub-pixel G, and the sub-pixel B are configured to display images of different colors. For example, each of the sub-pixel R, the sub-pixel G, and the sub-pixel B may include a light emitting element including a light emitting layer that emits three primary colors of red, green, and blue. An arbitrary voltage or current is supplied to each of the three sub-pixels, and the self-luminous display device 10 can display an image.

A source driver circuit 110, a gate driver circuit 120, and a light emission control circuit 130 are arranged in the peripheral region 24. Each of the source driver circuit 110, the gate driver circuit 120 and the light emission control circuit 130 is connected to a terminal part 150 using a connection wiring 341. The peripheral region 24 may be referred to as a frame region. The connection wiring 341 may be referred to as the connection wiring 341 alone, and a bundle of a plurality of connection wirings 341 may be referred to as the connection wiring 341.

The terminal part 150 and the FPC 160 electrically connected to the terminal part 150 are arranged in the terminal region 26. The terminal region 26 is a region opposed to a region in which the display region 22 is arranged with respect to the peripheral region 24 in a first direction D1.

The FPC 160 is connected to an external device (not shown) on an outer side of the self-luminous display device 10. The self-luminous display device 10 is connected to the external device via the FPC 160 and the terminal part 150 connected to the FPC. A control signal and a voltage are transmitted from the external device to the self-luminous display device 10 via the FPC 160 and the terminal part 150 connected to the FPC. The self-luminous display device 10 drives each pixel 180 arranged in the self-luminous display device 10 by using the received control signal and voltage from the external device. As a result, the self-luminous display device 10 can display an image in the display region 22.

For example, the IC chip 170 is arranged on the FPC 160. The IC chip 170 supplies signals, voltages, and the like for driving the respective pixels 180 to the source driver circuit 110, the gate driver circuit 120, the light emission control circuit 130 and the pixel 180 (a pixel circuit) via the FPC 160, the terminal part 150 and the connection wiring 341.

Each of the source driver circuit 110, the gate driver circuit 120, the light emission control circuit 130 and the IC chip 170 may be referred to as a control circuit alone in the first embodiment, and a circuit group including some or all of the source driver circuit 110, the gate driver circuit 120, the light emission control circuit 130 and the IC chip 170 may be referred to as a control circuit in the first embodiment.

[1-2. Configuration of Source Driver Circuit 110]

An overview of the source driver circuit 110 will be described with reference to FIG. 1 and FIG. 2. As shown in FIG. 1 or FIG. 2, the source driver circuit 110 is arranged at a position adjacent to the display region 22 in the first direction D1 (column direction). An image data signal line 321 extends from the source driver circuit 110 in the first direction D1 and is connected to the plurality of pixels 180 arranged in the first direction D1.

As shown in FIG. 2, the source driver circuit 110 includes a plurality of selection circuits 112. For example, each of the plurality of selection circuits 112 is controlled based on an on-signal and an off-signal supplied to a selection signal MUXR, a selection signal MUXG and a selection signal MUXB. The selection circuit 112 is selected by the on-signal supplied to the selection signal (for example, the selection signal MUXR). The pixel 180 is electrically connected to the image data signal line 321. In addition, the selection circuit 112 supplies the pixel 180 with an image data signal SL (m+1) including a data signal VDATA supplied to an input terminal 114. For example, the data signal VDATA may include a voltage RDATA (n), a voltage GDATA (n), or a voltage BDATA (n).

For example, the selection circuit 112 is a switch 118 including the input terminal 114 and an output terminal 116. For example, an on-signal supplied from the IC chip 170 to the selection signal MUXR causes the input terminal 114 and the output terminal 116 to be conductive (connected), and the input terminal 114 and the output terminal 116 are cut off (disconnected) by an off-signal supplied from the IC chip 170 to the selection signal MUXR. The on-signal is a signal including a voltage that conducts between the input terminal 114 and the output terminal 116, and the off-signal is a signal including a voltage that blocks the input terminal 114 and the output terminal 116.

The on-signal may be high level (High, HI), and the off-signal may be low level (Low, LO) in the present invention. Further, the on-signal may be low level (Low, LO), and the off-signal may be high level (High, HI) in the present invention.

[1-3. Configuration of Gate Driver Circuit 120]

An overview of the gate driver circuit 120 will be described with reference to FIG. 1 and FIG. 2. As shown in FIG. 1 or FIG. 2, the gate driver circuit 120 is arranged at a position adjacent to the display region 22 in a second direction D2 (row direction). Scanning signal lines 329, 330, 331, and 332 extend from the gate driver circuit 120 in the second direction D2 and are connected to the plurality of pixels 180 arranged in the second direction D2.

As shown in FIG. 2, the gate driver circuit 120 includes a plurality of shift registers (for example, shift registers 121, 122, and 123). For example, the shift registers 121, 122, and 123 sequentially supply different scanning signals of timing (for example, a scanning signal G (n−1), a scanning signal G (n), a scanning signal G (n+1), and the like) to each of the scanning signal lines 329, 330, 331, and 332 based on the control signal such as a clock signal and a start pulse supplied from the IC chip 170 and have a role of driving the pixel 180 (pixel circuit) which is electrically connected to each of the scanning signal lines. The scanning signal G (n) may be referred to as a first control signal, the scanning signal G (n+1) may be referred to as a second control signal, and the scanning signal G (n−1) may be referred to as a third control signal.

For example, the shift register 121 is electrically connected to the shift register 122 and the shift register 122 is electrically connected to the shift register 123. For example, the shift register 121 is electrically connected to the scanning signal line 329 and supplies the scanning signal G (n−1) to the scanning signal line 329. Similar to the shift register 121, for example, the shift register 122 is electrically connected to the scanning signal line 330 and supplies the scanning signal G (n) to the scanning signal line 330, and the shift register 123 is electrically connected to the scanning signal line 331 and supplies the scanning signal G (n+1) to the scanning signal line 331. In addition, although not shown, a shift register of a next stage electrically connected to the shift register 123 is electrically connected to the scanning signal line 332. The scanning signal G (n) includes the same pulse width as the scanning signal G (n−1), and is a signal in which the scanning signal G (n−1) is shifted. The scanning signal G (n+1) includes the same pulse width as the scanning signal G (n), and is a signal in which the scanning signal G (n) is shifted. Similar to the scanning signal G (n+1), the scanning signal G (n+2) includes the same pulse width as the scanning signal G (n+1), and is a signal in which the scanning signal G (n+1) is shifted.

[1-4. Configuration of Light Emission Control Circuit 130]

An overview of the light emission control circuit 130 will be described with reference to FIG. 1 and FIG. 2. As shown in FIG. 1 or FIG. 2, the light emission control circuit 130 is arranged adjacent to the display region 22 in the second direction D2 (row direction) and opposite to a position where the gate driver circuit 120 is arranged with respect to the display region 22. Light emission control signal lines 334, 335, 336, and 337 extend from the light emission control circuit 130 in the second direction D2 and are connected to the plurality of pixels 180 (pixel circuits 181) arranged in the second direction D2.

As shown in FIG. 2, the light emission control circuit 130 includes a plurality of shift registers (for example, shift registers 131, 132, and 133). For example, the shift registers 131, 132 and 133 sequentially supply different emission control signals of timing (for example, an emission control signal EM (n), an emission control signal EM (n+1), an emission control signal EM (n+2), and the like) to each of the emission control signal lines 334, 335, 336 and 337 based on a control signal such as a clock signal and a start pulse supplied from the IC chip 170, and have a role of driving the pixel 180 (pixel circuit) which is electrically connected to each of the emission control signal lines.

For example, the shift register 131 is electrically connected to the shift register 132 and the shift register 132 is electrically connected to the shift register 133. For example, the shift register 131 is electrically connected to the light emission control signal line 334 and supplies the light emission control signal EM (n) to the light emission control signal line 334. Similar to the shift register 131, for example, the shift register 132 is electrically connected to the light emission control signal line 335 and supplies the light emission control signal EM (n+1) to the light emission control signal line 335, and the shift register 133 is electrically connected to the light emission control signal line 336, and supplies the light emission control signal EM (n+2) to the light emission control signal line 336. Although not shown, the shift register of the next stage electrically connected to the shift register 133 is electrically connected to the light emission control signal 337. A pulse width of the light emission control signal EM (n+1) is the same as the light emission control signal EM (n), and the light emission control signal (n+1) is a signal in which the light emission control signal EM (n) is shifted. Similarly, a pulse width of the light emission control signal EM (n+2) is the same as the light emission control signal EM (n+1), and the light emission control signal EM (n+2) is a signal in which the light emission control signal EM (n+1) is shifted. The light emission control signal EM may be referred to as a fourth control signal.

[1-5. Configuration of Pixel 180]

Figure 3:
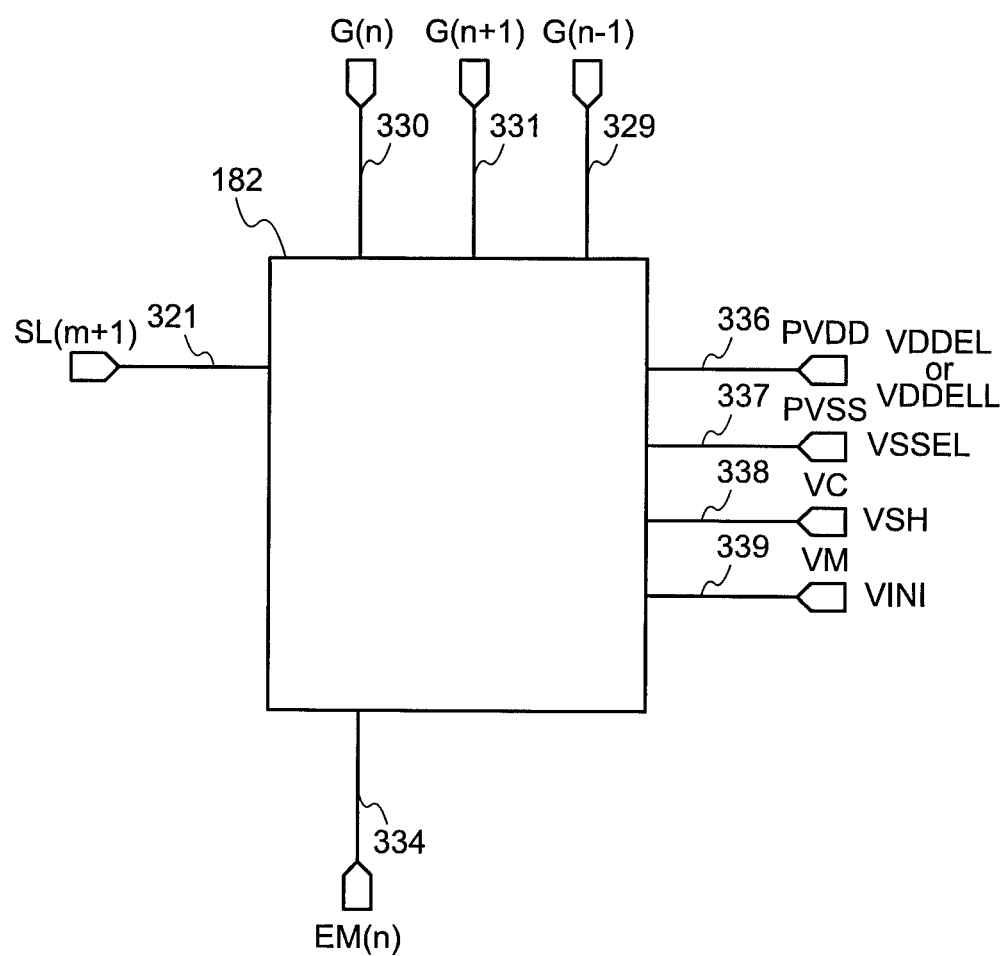
FIG. 3 is a schematic diagram showing an input signal to a pixel circuit according to the first embodiment of the present invention.
Figure 4:
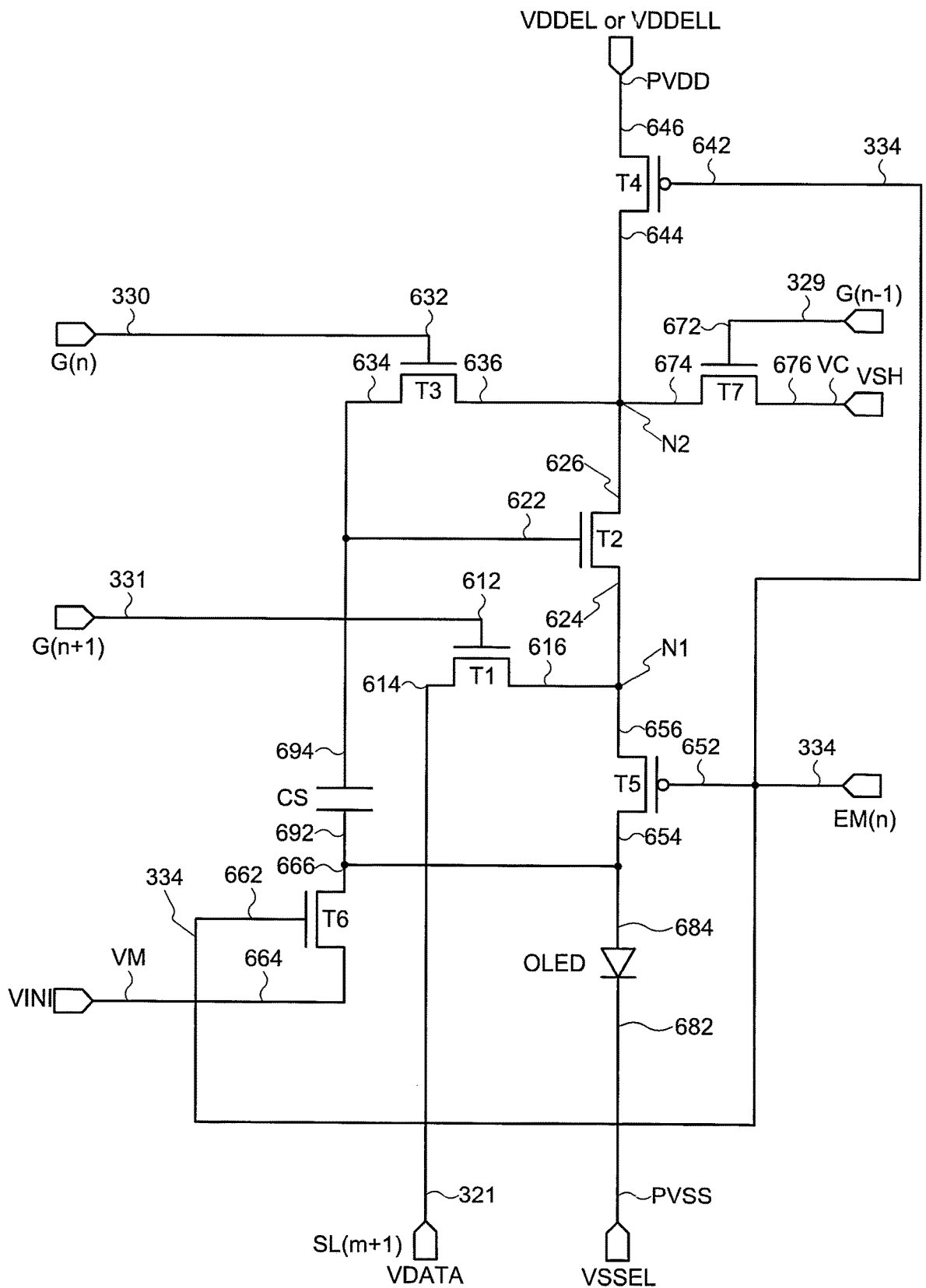
FIG. 4 is a circuit diagram showing a configuration of a pixel circuit according to the first embodiment of the present invention.

An overview of the pixel 180 will be described with reference to FIG. 3 and FIG. 4. FIG. 3 is a schematic diagram showing an input signal to a pixel circuit 181 included in the pixel 180. FIG. 4 is a circuit diagram showing a configuration of the pixel circuit 181. FIG. 3 and FIG. 4 show the configuration of the pixel circuit 181 of the pixel 180 shown in FIG. 1 and FIG. 2 as an example. The configuration of the pixel 180 and the pixel circuit 181 is not limited to the configuration shown in FIG. 3 and FIG. 4. The same or similar configurations as those in FIG. 1 and FIG. 2 will not be described here.

The pixel circuit 181 is a circuit for driving the pixel 180. Pixel circuits of the sub-pixel R, the sub-pixel G, and the sub-pixel B included in the pixel 180 are the same as those of the pixel circuit 181, and differ in colors emitted by light emitting elements OLED. In the following explanation, a light emitting element OLED that emits red will be mainly described as an example.

As shown in FIG. 3, the pixel circuit 181 is supplied with the scanning signal G (n−1), the scanning signal G (n), the scanning signal G (n+1), the image data signal SL (m+1), the light emission control signal EM (n), a reset voltage VSH, and an initialization voltage VINI. Further, a driving voltage VDDEL or a driving voltage VDDELL, and a reference voltage VSSEL are supplied to the pixel circuit 181 as a power source for driving the pixel 180.

The reset voltage VSH is supplied to a reset voltage line VC, the initialization voltage VINI is supplied to an initialization voltage line VM, the driving voltage VDDEL and the driving voltage VDDELL are supplied to a driving power supply line PVDD, and the reference voltage VSSEL is supplied to a reference voltage line PVSS. For example, each of the reset voltage line VC, the initialization voltage line VM, the driving power supply line PVDD, and the reference voltage line PVSS may be electrically connected to a different connection line 341 or may be different connection lines 341. The rest voltage line VSH, the initialization voltage VINI, the driving voltage VDDEL, the driving voltage VDDELL, and the reference voltage VSSEL may be supplied from an external circuit to the plurality of pixels 180 (the pixel circuit 181) via the FPC 160, the terminal part 150, the reset voltage line VC, the initialization voltage line VM, the driving power supply line PVDD, and the reference voltage line PVSS. In addition, the reset voltage VSH, the initialization voltage VINI, the driving voltage VDDEL, the driving voltage VDDELL, and the reference voltage VSSEL may be supplied from the IC chip 170 to the plurality of pixels 180 (pixel circuits 181) via the FPC 160, the terminal part 150, the reset voltage line VC, the initialization voltage line VM, the driving power supply line PVDD, and the reference voltage line PVSS. The reset voltage line VSH and the initialization voltage VINI are smaller than the driving voltage VDDEL and the driving voltage VDDELL. The driving voltage VDDELL is smaller than the driving voltage VDDEL. The reference voltage VSSEL is smaller than the drive voltage VDDELL. For example, the reset voltage VSH is larger than the voltage included in the data signal DATA (for example, the voltage RDATA (n), the voltage GDATA (n), or the voltage BDATA (n).

As shown in FIG. 4, the pixel circuit 181 includes a first transistor T1, a second transistor T2, a third transistor T3, a fourth transistor T4, a fifth transistor T5, a sixth transistor T6, a seventh transistor T7, a capacitor CS, and the light emitting element OLED. Each of these transistors includes a gate electrode and a pair of electrodes (a source electrode and a drain electrode) consisting of a first electrode and a second electrode. Each of the capacitor CS and the light emitting element OLED has a pair of electrodes consisting of the first electrode and the second electrode. The fourth transistor T4 and the fifth transistor T5 are p-channel field effect transistors.

The first transistor T1 has a function of supplying the image data signal SL (m+1) to the second transistor T2.

For example, the second transistor T2 is a driving transistor. The second transistor T2 has a function for causing the light emitting element OLED to emit light by supplying a current to the light emitting element OLED using the input image data signal SL (m+1).

The third transistor T3 conducts a second node N2 and a gate electrode 622 of the second transistor T2 (and a second electrode 694 of the capacitor CS). In addition, the third transistor T3 has a function of supplying the reset voltage VSH to the gate electrode 622 of the second transistor T2 and the second electrode 694 of the capacitor CS, and resetting the gate electrode 622 of the second transistor T2 and the second electrode 694 of the capacitor CS. Further, the third transistor T3 has a function of accumulating charges corresponding to a threshold voltage Vth of the second transistor T2 in the gate electrode 622 of the second transistor T2 and the second electrode 694 of the capacitor CS.

The fourth transistor T4 controls connection and disconnection between the driving power supply line PVDD and the second transistor T2. That is, the fourth transistor T4 has a function of supplying the driving voltage VDDEL to the second transistor T2.

The fifth transistor T5 controls connection and disconnection between the second transistor T2 and the light emitting element OLED. In other words, the fifth transistor T5 has a function of controlling connection and disconnection between the second transistor T2 and the light emitting element OLED, and supplying a current to the light emitting element OLED to control light emission and non-light emission of the light emitting element OLED.

The sixth transistor T6 has a function of supplying the initialization voltage VINI to a first electrode 654 of the fifth transistor T5, a second electrode 684 of the light emitting element OLED, and a first electrode 692 of the capacitor CS, and initializing the first electrode 654 of the fifth transistor T5, the second electrode 684 of the light emitting element OLED, and the first electrode 692 of the capacitor CS.

The transistor T7 has a function of supplying the reset voltage VSH to a first electrode 644 of the transistor T4, a second electrode 626 of the transistor T2, a second electrode 636 of the transistor T3, and the like, and resetting the first electrode 644 of the transistor T4, the second electrode 626 of the transistor T2, and the second electrode 636 of the transistor T3.

For example, the capacitor CS has a function of holding a charge (first charge) corresponding to the threshold voltage Vth of the second transistor T2. In addition, the capacitor CS has a function of holding a charge (second charge) corresponding to the data voltage (for example, RDATA (n) (see FIG. 6)) included in the image data signal SL (m+1) input to the gate electrode 622 of the second transistor T2.

The light emitting element OLED has a diode characteristic and has a function of emitting light based on a current flowing through the light emitting element OLED (that is, a drain current of the second transistor T2).

The first transistor T1 includes a gate electrode 612, a first electrode 614, and a second electrode 616. The gate electrode 612 is electrically connected to the scanning signal line 331. The first electrode 614 is electrically connected to the image data signal line 321. The second electrode 616 is electrically connected to a first node N1, a first electrode 624 of the second transistor T2, and a second electrode 656 of the fifth transistor T5. The scanning signal G (n+1) is supplied to the scanning signal line 331. A conductive-state (on-state) and a non-conductive-state (off-state) are controlled by the scanning signal G (n+1) in the first transistor T1. The first transistor T1 becomes non-conductive when the signal supplied to the scanning signal G (n+1) is low level (LO). The first transistor T1 becomes conductive when the signal supplied to the scanning signal G (n+1) is high level (HI).

The second transistor T2 includes the gate electrode 622, the first electrode 624, and the second electrode 626. The gate electrode 622 is electrically connected to a first electrode 634 of the third transistor T3 and the second electrode 694 of the capacitor CS. The second electrode 626 is electrically connected to the second node N2, the second electrode 636 of the third transistor T3, a first electrode 674 of the seventh transistor T7, and the first electrode 644 of the fourth transistor T4.

The third transistor T3 includes a gate electrode 632, the first electrode 634, and the second electrode 636. The gate electrode 632 is electrically connected to the scanning signal line 330. The scanning signal G (n) is supplied to the scanning signal line 330. The conductive-state (on-state) and the non-conductive state (off-state) are controlled by the scanning signal G (n) in the third transistor T3. The third transistor T3 becomes non-conductive when the signal supplied to the scanning signal G (n) is low level (LO). The third transistor T3 becomes conductive when the signal supplied to the scanning signal G (n) is high level (HI).

The fourth transistor T4 is a p-channel field effect transistor. The fourth transistor T4 includes a gate electrode 642, the first electrode 644, and a second electrode 646. The gate electrode 642 is electrically connected to the light emission control signal line 334. The second electrode 646 is electrically connected to the driving power supply line PVDD. The driving voltage VDDEL is supplied to the driving power supply line PVDD. The light emission control signal EM (n) is supplied to the light emission control signal line 334. The conductive state (on-state) and the non-conductive-state (off-state) are controlled by the light emission control signal EM (n) in the fourth transistor T4. The fourth transistor T4 becomes conductive when the signal supplied to the light emission control signal EM (n) is low level (LO). The fourth transistor T4 becomes non-conductive when the signal supplied to the second light emission control signal EM (n) is high level (HI).

The fifth transistor T5 is a p-channel field effect transistor. The fifth transistor T5 includes a gate electrode 652, the first electrode 654, and a second electrode 656. The gate electrode 652 is electrically connected to the light emission control signal line 334.

The first electrode 654 is electrically connected to a second electrode 666 of the sixth transistor T6, the first electrode 692 of the capacitor CS, and the second electrode 684 of the light emitting element OLED. The light emission control signal EM (n) is supplied to the light emission control signal line 334. The conductive-state (on-state) and the non-conductive state (off-state) are controlled by the light emission control signal EM (n) in the fifth transistor T5. The fifth transistor T5 becomes conductive when the signal supplied to the light emission control signal EM (n) is low level (LO), and the fifth transistor T5 becomes non-conductive when the signal supplied to the light emission control signal EM (n) is high level (HI).

The sixth transistor T6 includes a gate electrode 662, a first electrode 664, and the second electrode 666. The gate electrode 662 is electrically connected to the light emission control signal line 334. The first electrode 664 is electrically connected to the initialization voltage line VM. The light emission control signal EM (n) is supplied to the light emission control signal line 334, and the initialization voltage VINI is supplied to the initialization voltage line VM. Similar to the fourth transistor T4 and the fifth transistor T5, the conductive state (on-state) and the non-conductive state (off-state) are controlled by the light emission control signal EM (n) in the sixth transistor T6. The sixth transistor T6 becomes non-conductive when the signal supplied to the light emission control signal EM (n) is low level (LO), and the sixth transistor T6 becomes conductive when the signal supplied to the light emission control signal EM (n) is high level (HI).

The seventh transistor T7 includes a gate electrode 672, the first electrode 674, and a second electrode 676. The gate electrode 672 is electrically connected to the scanning signal line 329. The scanning signal G (n−1) is supplied to the scanning signal line 329. The second electrode 676 is electrically connected to the reset voltage line VC. As described above, the reset voltage VSH is supplied to the reset voltage line VC. The conductive state (on-state) or the non-conductive state (off-state) are controlled by the scanning signal G (n−1) in the seventh transistor T7. The seventh transistor T7 becomes non-conductive when the signal supplied to the scanning signal G (n−1) is low (LO). The seventh transistor T7 becomes conductive when the signal supplied to the scanning signal G (n−1) is high (HI).

The capacitor CS includes the first electrode 692 and the second electrode 694. The first electrode 692 is electrically connected to the second electrode 666 of the sixth transistor T6, the first electrode 654 of the fifth transistor T5, and the second electrode 684 of the light emitting element OLED. The second electrode 694 is electrically connected to the first electrode 634 of the third transistor T3 and the gate electrode 622 of the second transistor T2.

In the present embodiment, the capacitance of the capacitor CS of the pixel 180A arranged in the region 22A is smaller than the capacitance of the capacitor CS of the pixel 180B arranged in the region 22B. The capacitance of the capacitor CS of the pixel 180A is preferably 0.9 times or less of the capacitance of the capacitor CS of the pixel 180B. For example, areas of the electrode of the capacitor CS of the pixel 180A and the electrode of the capacitor CS of the pixel 180B may be different. The electrode of the capacitor CS of the pixel 180A may be smaller than the electrode of the capacitor CS of the pixel 180B. The area of the electrode of the capacitor CS of the pixel 180A may be 0.9 times or less than the area of the electrode of the capacitor CS of the pixel 180B.

The region 22A may include a plurality of rows and a plurality of columns of the pixel 180A, and in this case, the capacitance of the capacitor CS of the pixel 180A arranged on the outermost periphery may be different from the capacitance of the capacitor CS of the pixel 180A adjacent to the pixel 180B in the region 22B. The capacitance of the capacitor CS of the pixel 180A arranged on the outermost periphery may be smaller than the capacitance of the capacitor CS of the pixel 180A adjacent to the pixel 180B in the region 22B. Within the region 22A, the capacitance of the capacitor CS may have a positive gradient from the pixel 180A arranged on the outermost periphery to the pixel 180A adjacent to the pixel 180B in the region 22B.

A first electrode 682 of the light emitting element OLED is electrically connected to the reference voltage line PVSS. As described above, the reference voltage VSSEL is supplied to the reference voltage line PVSS. For example, the first electrode 682 of the light emitting element OLED is a cathode electrode, and the second electrode 684 of the light emitting element OLED is an anode electrode.

For example, the conductive state of the transistor in the self-luminous display device 10 is assumed to indicate a state in which the source electrode and the drain electrode of the transistor are conductive and the transistor is in an on-state (ON), and the non-conductive state of the transistor in the self-luminous display device 10 is assumed to indicate a state in which the source electrode and the drain electrode of the transistor are non-conductive and the transistor is in an off-state (OFF). In addition, the source electrode and the drain electrode may be interchanged in each transistor depending on a voltage or a potential supplied to each electrode. In addition, it can be easily understood by people skilled in the art that even if the transistor is in the off-state, a small amount of current flows, such as a leakage current.

Each transistor shown in FIG. 4 may have a Group 14 element, such as silicon or germanium, or an oxide exhibiting semiconductor characteristics in a channel region. For example, the channel region of each of the transistors has low-temperature polysilicon (LTPS). In the self-luminous display device 10, the transistors are formed using thin film transistors (TFT), the fourth transistor T4 and the fifth transistor T5 are p-channel field-effect transistors, and the other transistors are n-channel field-effect transistors. Each transistor may be either the n-channel field effect transistor or the p-channel field effect transistor. In the self-luminous display device 10, a configuration of the transistor, a connection of a storage capacitor, a power supply voltage, and the like may be appropriately adapted according to the application and specifications.

[1-6. Driving Method of Self-Luminous Display Device 10]

Figure 13:
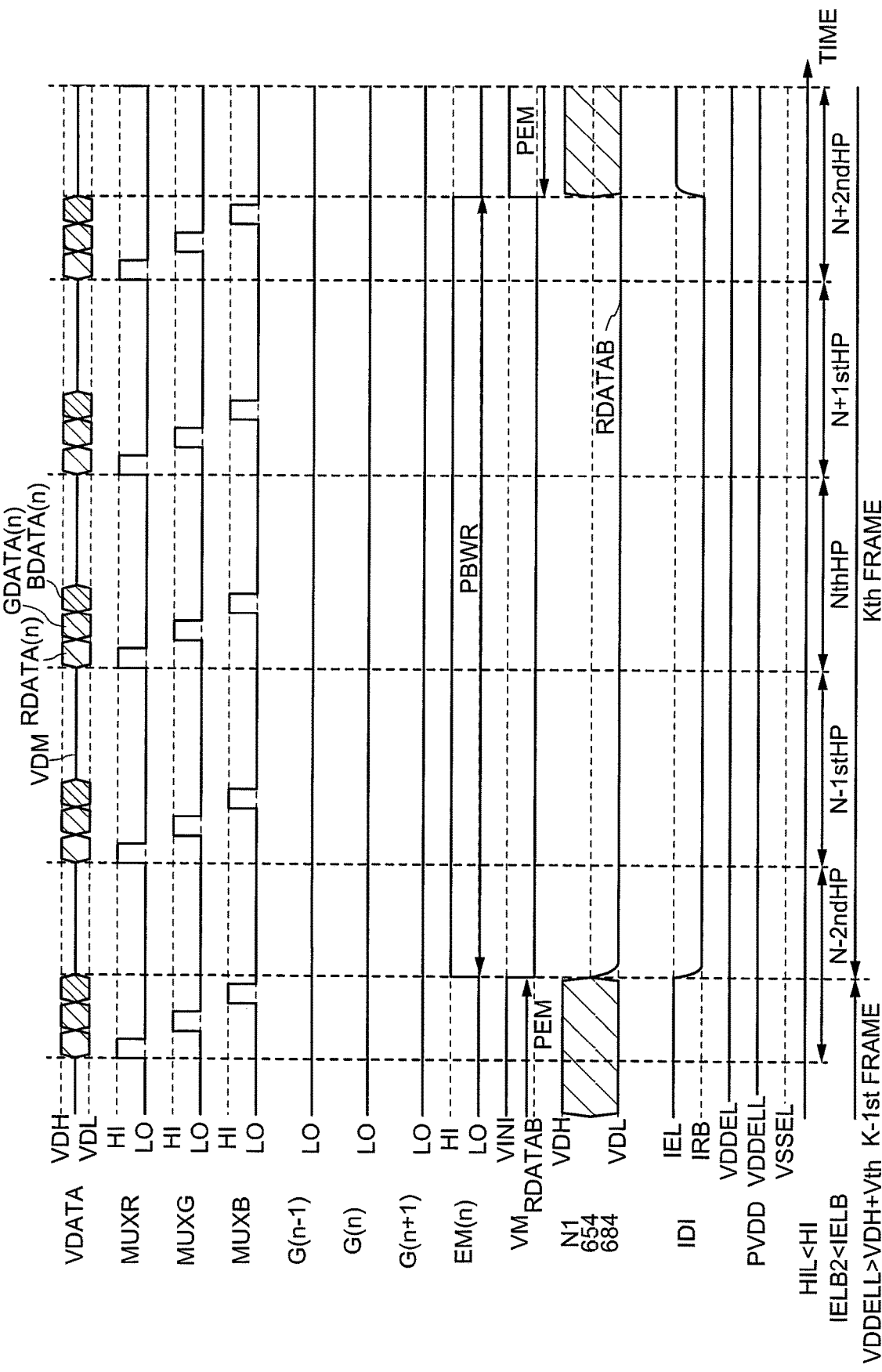
FIG. 13 is a schematic diagram showing a timing chart of a self-luminous display device according to the first embodiment of the present invention.
Figure 14:
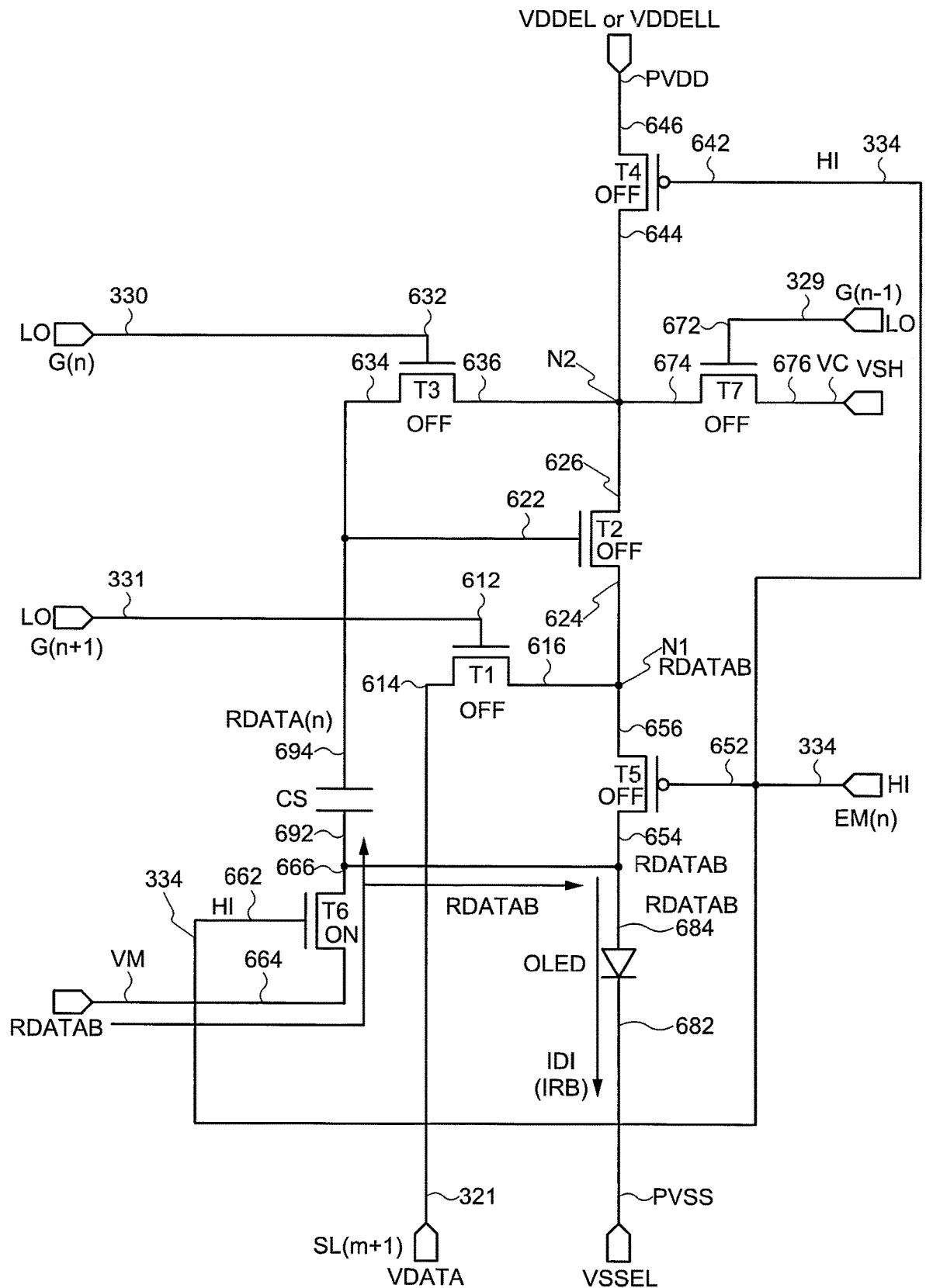
FIG. 14 is a schematic diagram showing an operation-state of a pixel at the timing shown in FIG. 13.

A driving method of the self-luminous display 10 will be described with reference to FIG. 5A to FIG. 14. FIG. 5A, FIG. 5B, FIG. 6, and FIG. 13 are schematic diagrams showing timing charts of the self-luminous display device 10. FIG. 7 to FIG. 12 are schematic diagrams showing an operation-state of the pixel 180 (the pixel circuit 181) at the timing shown in FIG. 6. FIG. 14 is a schematic diagram showing an operation-state of the pixel 180 (the pixel circuit 181) at the timing shown in FIG. 13. The driving method of the self-luminous display device 10 is not limited to the driving method shown in FIG. 5A to FIG. 14. Descriptions of the same or similar configurations as those in FIG. 1 to FIG. 4 will be omitted. In addition, the horizontal axis of the timing charts indicates times (TIME).

Figure 5A:
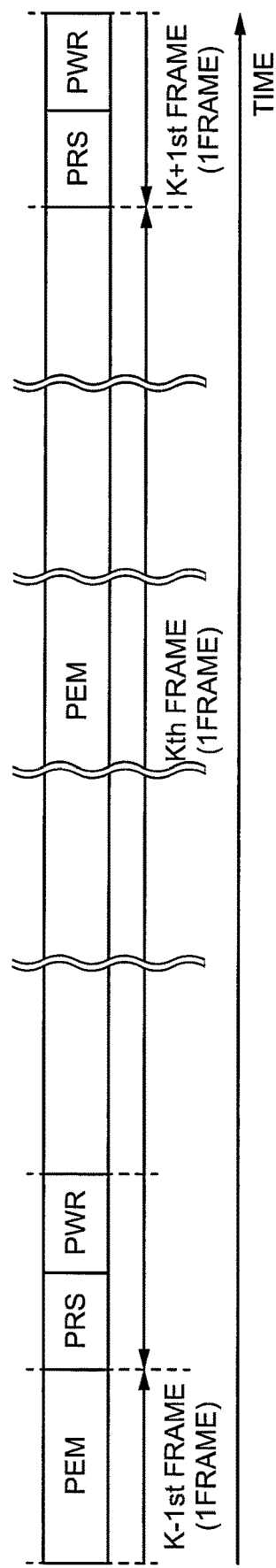
FIG. 5A is a schematic diagram showing a timing chart of a self-luminous display device according to the first embodiment of the present invention.

FIG. 5A is an example of a timing chart of a driving method of the self-luminous display device 10 in the case where the self-luminous display device 10 is driven at a high frequency. For example, the high frequency is 60 Hz, and is a frequency at which one frame (1 FRAME) is driven at 60 Hz. For example, FIG. 5A shows a current frame (Kth FRAME), a part of a previous frame of the current frame (K−1st FRAME), and a part of a subsequent frame of the current frame (K+1st FRAME). For example, the driving method shown in FIG. 5A is referred to as high-frequency driving.

As shown in FIG. 5A, the driving method of the self-luminous display device 10 includes at least a reset period PRS, a sampling period PWR, and a light emission period PEM in one frame. The sampling period PWR is executed after the reset period PRS, and the light emission period PEM is executed after the sampling period PWR in the pixel 180 (the pixel circuit 181) included in the self-luminous display device 10. Further, after the light emission period PEM of the previous frame of the current frame, the reset period PRS of the current frame is executed, and after the light emission period PEM of the current frame, the reset period PRS and the sampling period PWR of the subsequent frame of the current frame are executed.

Figure 5B:
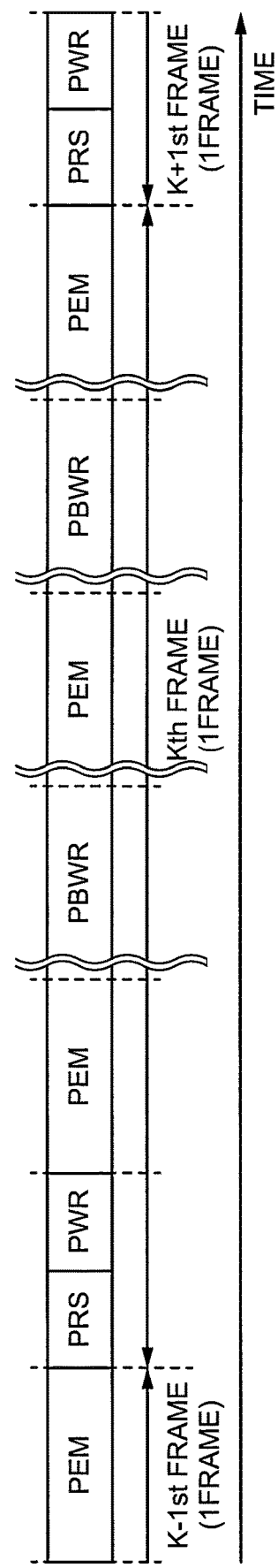
FIG. 5B is a schematic diagram showing a timing chart of a self-luminous display device according to the first embodiment of the present invention.

FIG. 5B is an example of a timing chart of a driving method of the self-luminous display device 10 in the case where the self-luminous display device 10 is driven at a low frequency. For example, the low frequency is 1 Hz, and is a frequency at which one frame (1 FRAME) is driven at 1 Hz. For example, the driving method shown in FIG. 5B is referred to as low-frequency driving. The low-frequency driving is a driving method in which a period for displaying black (black period PBWR) is executed a plurality of times in the light emission period PEM as compared with the high-frequency driving. In the low-frequency driving, the driving other than the black period PBWR is the same as the high-frequency driving.

Figure 6:
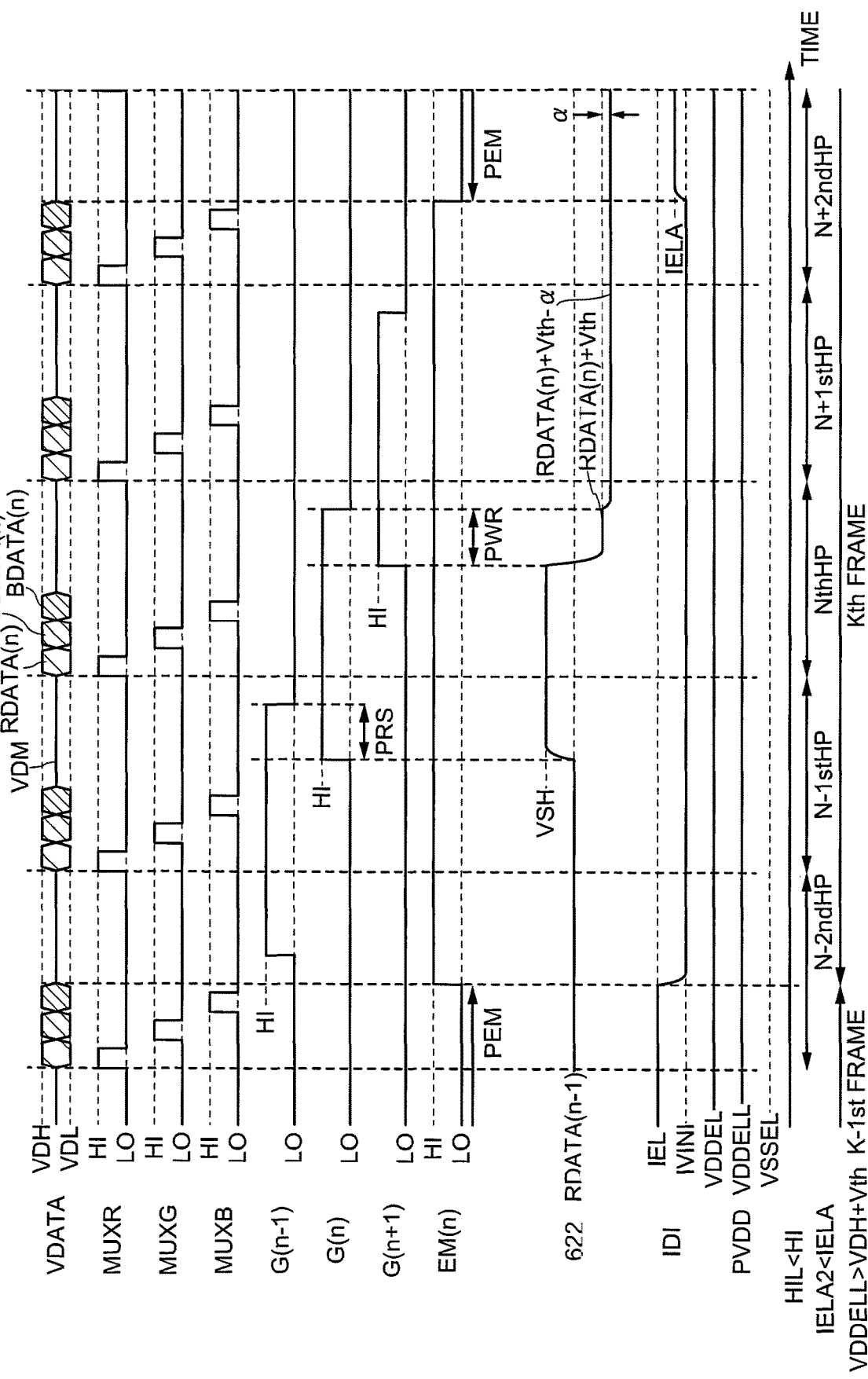
FIG. 6 is a schematic diagram showing a timing chart of a self-luminous display device according to the first embodiment of the present invention.

FIG. 6 is a diagram for describing the reset period PRS, the sampling period PWR, and the light emission period PEM of the driving method of the pixels 180 (the pixel circuits 181) of the self-luminous display device 10. FIG. 6 shows the light emission period PEM of the previous frame of the current frame (K−1st FRAME), the reset period PRS, the sampling period PWR, and the light emission period PEM of the current frame (Kth FRAME). Further, FIG. 6 shows a plurality of one horizontal periods (horizontal period N−2nd HP, horizontal period N−1st HP, horizontal period Nth HP, horizontal period N+1st HP, horizontal period N+2nd HP). For example, the one horizontal period is a period in which the image data signal SL (m+1) including the data signal VDATA is input to a pixel (pixel circuit) electrically connected to one scanning signal line, the image data signal SL (m+1) including the data signal VDATA is input to a pixel (pixel circuit) electrically connected to all the scanning signal lines, and an image of the frame corresponding to 1 FRAME is displayed.

An example of driving methods in which the pixel 180 (pixel circuit 181) displays an image based on the voltage RDATA (n) included in the data signal VDATA input to one horizontal period N+1st HP will be described with reference to FIG. 6 to FIG. 12. In addition, in the description of the driving method according to the first embodiment, the driving voltage VDDEL or the driving voltage VDDELL is supplied to the driving power supply line PVDD and the reference voltage VSSEL is supplied to the reference voltage line PVSS.

First, the data signal VDATA, the selection signal MUXR, the selection signal MUXG, and the selection signal MUXB will be described. The image data signal SL (m+1) including the data signal VDATA is input to each pixel 180 (pixel circuit 181) in accordance with each horizontal period. For example, the data signal VDATA is analog data including a voltage between a voltage VDH and a voltage VDL that is lower than the voltage VDH. A voltage VDM is the voltage between the voltage VDH and the voltage VDL that is lower than the voltage VDH. For example, in the respective horizontal periods, the voltage RDATA is selected and supplied to the image data signal line using the selection signal MUXR, the voltage GDATA is selected and supplied to the image data signal line using the selection signal MUXG, and the voltage BDATA is selected and supplied to the image data signal line using the selection signal MUXB. For example, the data signal VDATA is kept at the voltage VDM during periods in which no data is selected using the selection signal MUXG.

Figure 7:
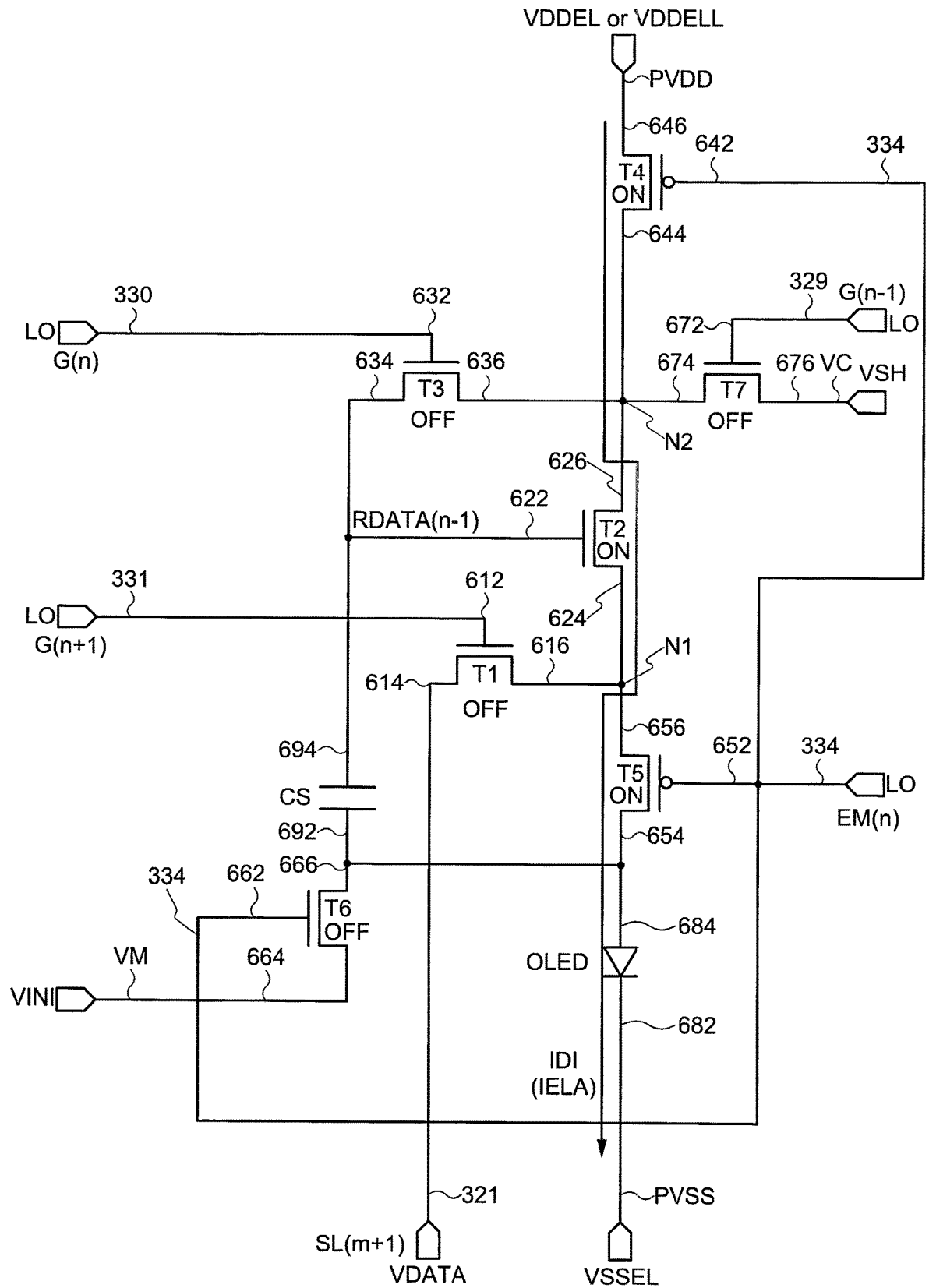
FIG. 7 is a schematic diagram showing an operation-state of a pixel at the timing shown in FIG. 6.

Next, a driving method of the pixel 180 (the pixel circuit 181) in the light emission period PEM of the previous frame of the current frame (K−1st FRAME) will be described with reference to FIG. 6 and FIG. 7. The light emission period PEM of the previous frame of the current frame (K−1st FRAME) is a period in which the pixel 180 (pixel circuit 181) emits light in accordance with the voltage RDATA (n−1).

The gate electrode 622 of the second transistor T2 is supplied with the voltage RDATA (n−1). The scanning signal G (n−1), the scanning signal G (n), and the scanning signal G (n+1) are supplied with a low level (LO), and the first transistor T1, the third transistor T3, the sixth transistor T6, and the seventh transistor T7 are in the off-state. Further, the fourth transistor T4, the fifth transistor T5, and the sixth transistor T6 are supplied with a low level (LO) from the light emission control signal EM (n), the fourth transistor T4 and the fifth transistor T5 are in the on-state, and the sixth transistor T6 is in the off-state.

The second transistor T2 is in the on-state based on the voltage RDATA (n−1). Consequently, the second transistor T2 can conduct a current IELA based on a gate/source voltage Vgs and a source/drain voltage Vds according to the voltage RDATA (n−1).

The fourth transistor T4, the second transistor T2, and the fifth transistor T5 are in the on-state, and the current IELA flows from the driving power supply line PVDD to the reference voltage line PVSS. Consequently, the current IELA flows to the light emitting element OLED, and the light emitting element OLED emits light.

Next, a method for driving the pixel 180 (pixel circuit 181) in a period between the light emission period PEM of the previous frame of the current frame (K−1st FRAME) and the reset period PRS of the current frame will be described with reference to FIG. 6. The period between the emission period PEM of the previous frame of the current frame (K−1st FRAME) and the reset period PRS of the current frame is a period overlapping a part of the single horizontal period N−2nd HP and a part of the single horizontal period N−1st HP. In this period, the light emission control signal EM (n) is supplied from a low level (LO) to a high level (HI), the transistor T5 and the transistor T4 are in the off-state, and the sixth transistor T6 is in the on-state. In addition, the scanning signal G (n−1) is supplied from a low level (LO) to a high level (HI), and the transistor T7 is in the on-state. The transistor T1 and the transistor T3 remain in the off-state.

Based on the sixth transistor T6 being turned on, the initialization voltage VINI is supplied to the first electrode 692 of the capacitor CS, the respective electrodes electrically connected to the first electrode 692, and the second electrode 684 of the light emitting element OLED. Consequently, the first electrode 692 of the capacitor CS, the respective electrodes electrically connected to the first electrode 692, and the second electrode 684 of the light emitting element OLED are initialized. In addition, the fourth transistor T4 and the fifth transistor T5 are in the off-state, and no current flows from the driving power supply line PVDD to the reference voltage line PVSS, and a current IINI flows from the initialization voltage line VM to the reference voltage line PVSS. The current IINI flowing through the light emitting element OLED is a current (approximately 0) corresponding to the potential difference (voltage VINI−reference voltage VSSEL) between the voltage of the second electrode 684 and the voltage of the first electrode 682 of the light emitting element OLED, and the light emitting element OLED is non-light emitting (does not emit light).

Next, a driving method of the pixel 180 (pixel circuit 181) in the reset period PRS of the current frame will be described with reference to FIG. 6 and FIG. 8. The reset period PRS is a period in which the reset voltage VSH and the initialization voltage VINI are supplied to the pixel 180 (the pixel circuit 181), and the pixel 180 (the pixel circuit 181) is reset. The reset period PRS of the current frame is a period overlapping a part of one horizontal period N−1st HP.

The scanning signal G (n) is supplied from a low level (LO) to a high level (HI), and the third transistor T3 is in the on-state in the reset period PRS. The sixth transistor T6 and the seventh transistor T7 remain in the on-state. Also, the first transistor T1, the fourth transistor T4, and the fifth transistor T5 remain in the off-state.

Based on the seventh transistor T7 and the third transistor T3 being in the on-state, the reset voltage VSH is supplied to the first node N1, the second node N2, each electrode electrically connected to the first node N1, each electrode electrically connected to the second node N2, the gate electrode 622 of the second transistor T2, and the second electrode 694 of the capacitor CS. Consequently, the first node N1, the second node N2, each electrode electrically connected to the first node N1, each electrode electrically connected to the second node N2, the gate electrode 622 of the second transistor T2, and the second electrode 694 of the capacitor CS are reset. In addition, since the sixth transistor T6 remains in the on-state, the first electrode 692 of the capacitor CS, each electrode electrically connected to the first electrode 692, and the second electrode 684 of the light emitting element OLED are kept at the initialization voltage VINI. As a result, a voltage of the reset voltage VSH−the initialization voltage VINI (VSH−VINI) is applied to the capacitor CS.

Since the fourth transistor T4 and the fifth transistor T5 remain in the off-state, no current flows from the driving power supply line PVDD to the reference voltage line PVSS, and the current IINI flows from the initialization voltage line VM to the reference voltage line PVSS. As described above, the current IINI flowing through the light emitting element OLED is approximately 0 and the light emitting element OLED is non-light emitting (does not emit light).

Figure 8:
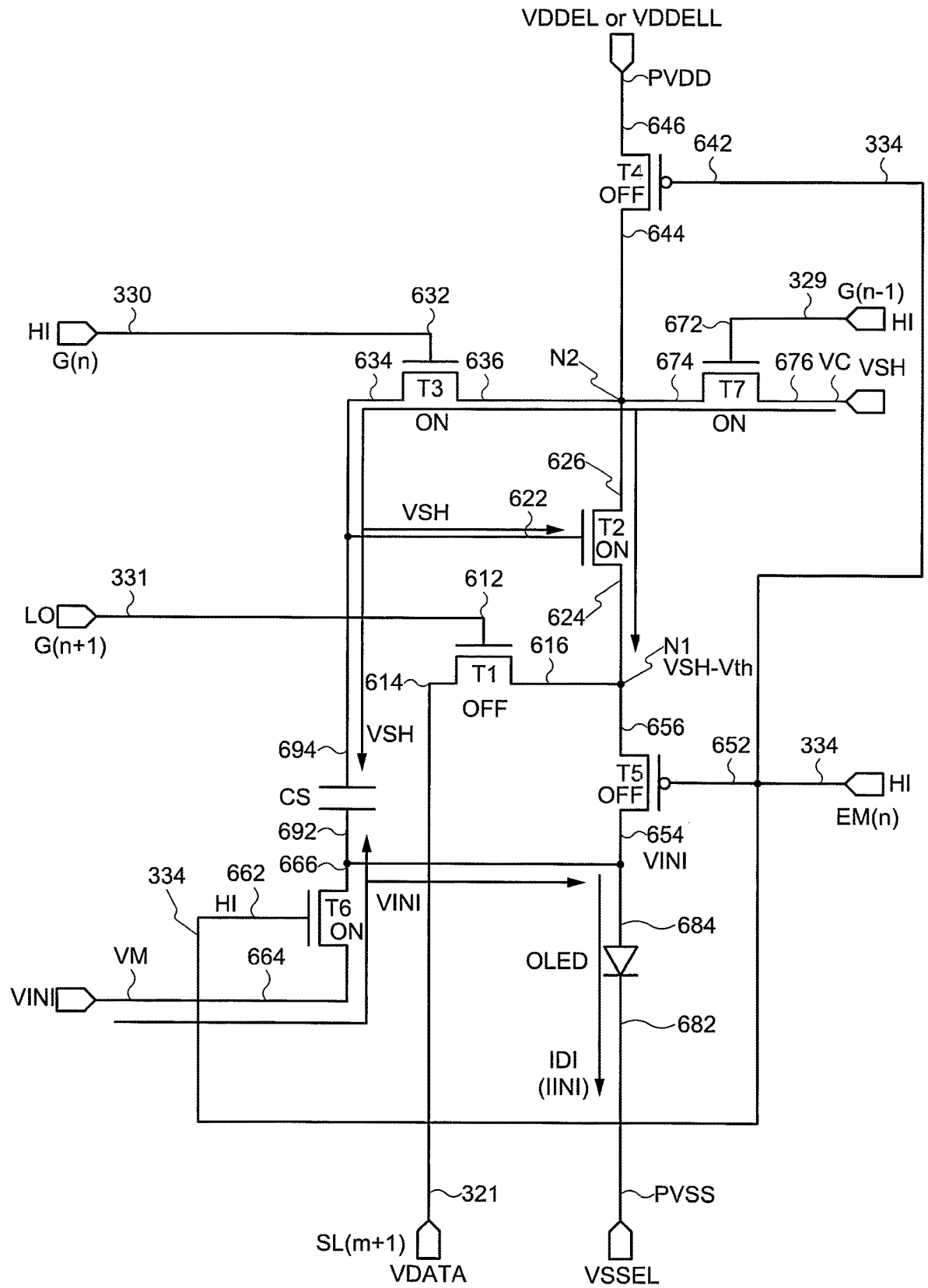
FIG. 8 is a schematic diagram showing an operation-state of a pixel at the timing shown in FIG. 6.

Although a detailed illustration is omitted, the second transistor T2 shown in FIG. 8 is in the on-state, and if a potential difference between the gate electrode 622 of the second transistor T2 and the first electrode 624 (a potential difference between the gate electrode 622 and the first node N1) becomes the same as the threshold voltage Vth of the second transistor T2, the second transistor T2 switches to the off-state. Consequently, a difference between the reset voltage VSH and the threshold voltage Vth (VSH−Vth) is held by the first node N1 and each electrode electrically connected to the first node N1, and the reset voltage VSH is held by the second node N2, each electrode electrically connected to the second node N2, the gate electrode 622 of the second transistor T2, and the second electrode 694 of the capacitor CS.

Figure 9:
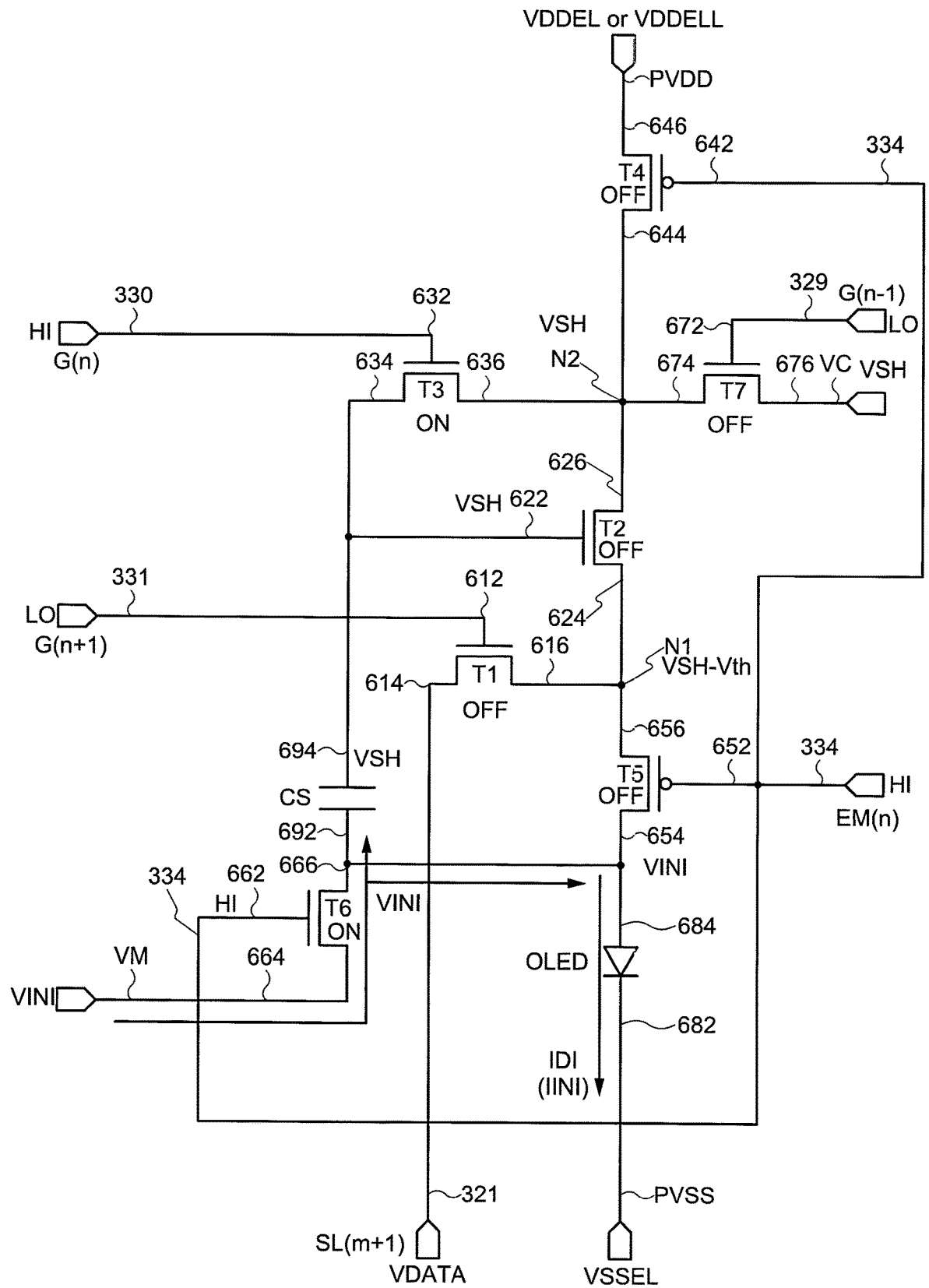
FIG. 9 is a schematic diagram showing an operation-state of a pixel at the timing shown in FIG. 6.

Next, a driving method of the pixel 180 (pixel circuit 181) in a period between the reset period PRS and the sampling period PWR of the current frame will be described with reference to FIG. 6 and FIG. 9. The period between the reset period PRS and the sampling period PWR of the current frame is a period overlapping a part of one horizontal period N−1st HP and a part of one horizontal period Nth HP.

The light emission control signal G (n−1) is supplied from a high level (HI) to a low level (LO), and the seventh transistor T7 is in the off-state in the period between the reset period PRS and the sampling period PWR of the current frame. In addition, the third transistor T3 and the sixth transistor T6 remain in the on-state, and the first transistor T1, the second transistor T2, the fourth transistor T4, and the fifth transistor T5 remain in the off-state.

Further, in the period between the reset period PRS and the sampling period PWR of the current frame, the reset voltage is held in the second node N2, each electrode electrically connected to the second node N2, the gate electrode 622 of the second transistor T2, and the second electrode 694 of the capacitor CS. In addition, since the sixth transistor T6 remains in the on-state, the initialization voltage VINI is supplied to the first electrode 692 of the capacitor CS, the respective electrodes electrically connected to the first electrode 692, and the second electrode 684 of the light emitting element OLED. Further, since the fourth transistor T4 and the fifth transistor T5 are in the off-state, no current flows from the driving power supply line PVDD to the reference voltage line PVSS, and the light emitting element OLED is non-light emitting (does not emit light).

In addition, the voltage RDATA (n) is selected based on the on-signal being supplied to the selection signal MUXR, in the period between the reset period PRS and the sampling period PWR of the current frame. Therefore, the image data signal SL (m+1) includes the voltage RDATA (n). Further, the image data signal SL (m+1) including the voltage RDATA (n) is supplied to the image data signal line 321. The image data signal line 321 holds the voltage RDATA (n) on the basis of the off-signal being supplied to the selection signal MUXR.

Figure 10:
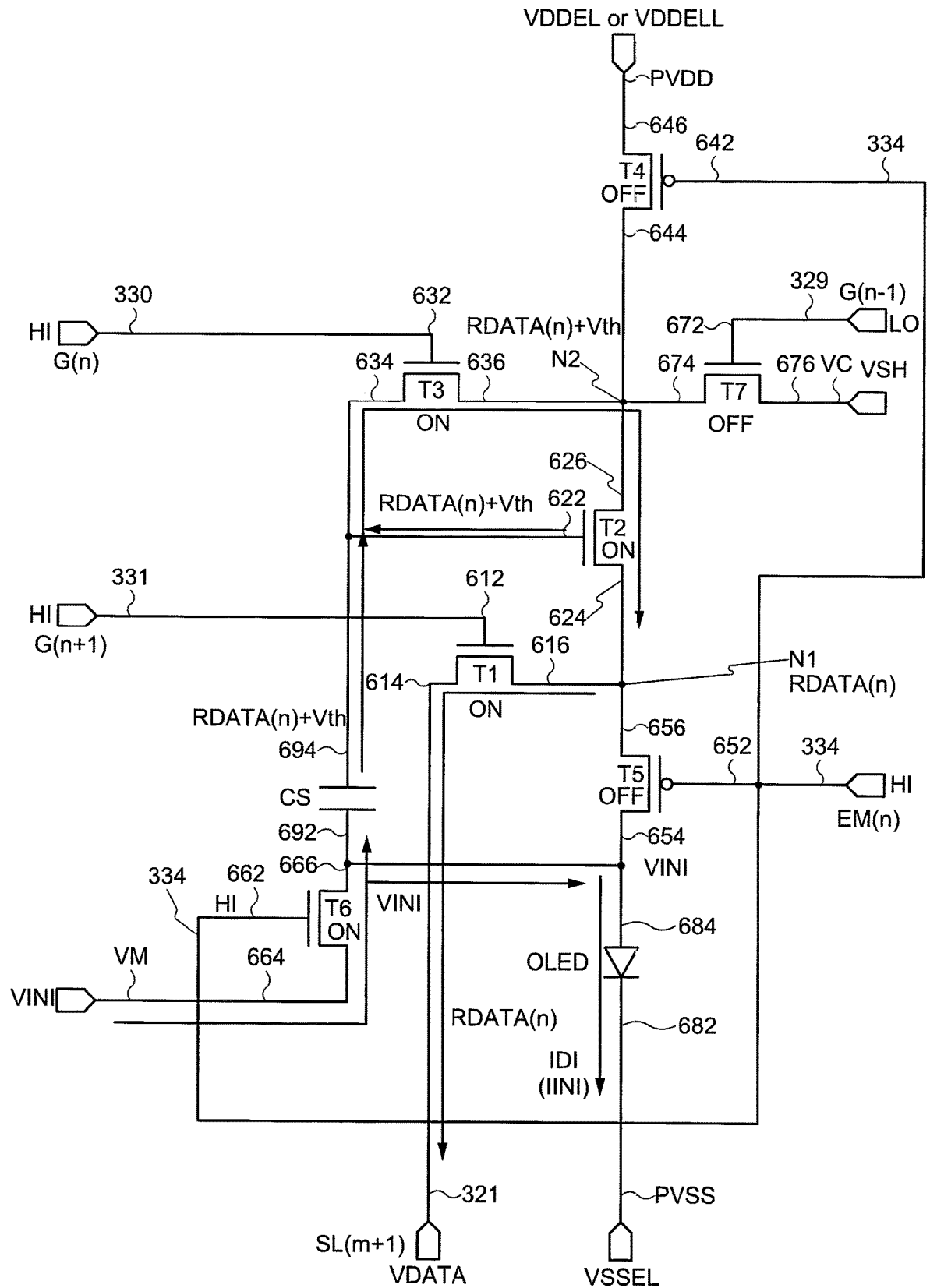
FIG. 10 is a schematic diagram showing an operation-state of a pixel at the timing shown in FIG. 6.

Next, a driving method of the pixel 180 (pixel circuit 181) in the sampling period PWR of the current frame will be described with reference to FIG. 6 and FIG. 10. The sampling period PWR is a period in which a voltage corresponding to image data to be displayed by the pixel 180 (the pixel circuit 181) is written to the pixel 180 (the pixel circuit 181). The sampling period PWR of the current frame is a period overlapping a part of the horizontal period Nth HP.

The scanning signal G (n+1) from a low level (LO) to a high level (HI) is supplied, and the first transistor T1 is in the on-state, in the sampling period PWR of the current frame. In addition, the third transistor T3 and the sixth transistor T6 remain in the on-state, and the fourth transistor T4, the fifth transistor T5, and the seventh transistor T7 remain in the off-state.

Based on the first transistor T1 being in the on-state, the voltage RDATA (n) is supplied to the first node N1 and the respective electrodes electrically connected to the first node N1. Further, if the voltage RDATA (n) is supplied to the first node N1, the voltage between the gate/source of the second transistor T2 also changes, and the second transistor T2 switches to the on-state. Consequently, the voltage supplied to the second node N2, the respective electrodes electrically connected to the second node N2, the gate electrode 622 of the second transistor T2, and the second electrode 694 of the capacitor CS decrease from the voltage VSH, and switch to the voltage RDATA (n)+the threshold voltage Vth (RDATA (n)+Vth). Therefore, a potential difference between the gate electrode 622 and the first electrode 624 of the second transistor T2 becomes the same as the threshold voltage Vth of the second transistor T2, the voltage decreases (discharges) in the second node N2 or the like ends, and the second transistor T2 switches to the off-state.

In the present embodiment, the capacitance of the capacitor CS of the pixel 180A arranged in the region 22A is smaller than the capacitance of the capacitor CS of the pixel 180B arranged in the region 22B. When the capacitance of the capacitor CS is small, discharging in the sampling period PWR proceeds quickly. Therefore, the voltage held in the capacitor CS of the pixel 180A arranged in the region 22A is smaller than the voltage held in the capacitor CS of the pixel 180B arranged in the region 22B.

In addition, since the sixth transistor T6 remains in the on-state, the initialization voltage VINI is supplied to the first electrode 692 of the capacitor CS, the respective electrodes electrically connected to the first electrode 692, and the second electrode 684 of the light emitting element OLED. Further, since the fourth transistor T4 and the fifth transistor T5 remain in the off-state, no current flows from the driving power supply line PVDD to the reference voltage line PVSS, and the light emitting element OLED is non-light emitting (does not emit light).

Although a detailed illustration is omitted, since the first transistor T1 remains in the on-state at this time, the voltages of the first node N1 and the respective electrodes electrically connected to the first node N1 are fixed to the voltage RDATA (n). In addition, a charge corresponding to the threshold voltage Vth is held between the gate electrode 622 and the first electrode 624 of the second transistor T2. Therefore, the sampling period PWR of the current frame is a period in which the voltage corresponding to the image data displayed by the pixel 180 (the pixel circuit 181) is written to the pixel 180 (the pixel circuit 181), and is also a period (threshold correction period) in which the charge corresponding to the threshold voltage Vth of the second transistor T2 is held and the threshold value of the second transistor T2 is corrected.

Next, a driving method of the pixel 180 (pixel circuit 181) after the sampling period PWR of the current frame will be described with reference to FIG. 6 and FIG. 11. A period after the sampling period PWR of the current frame is a period overlapping a part of the horizontal period Nth HP and the horizontal period N+1st HP.

The scanning signal G (n) is supplied from a high level (HI) to a low level (LO), and the third transistor T3 is in the off-state, in a period after the sampling period PWR of the current frame. In addition, the first transistor T1 and the sixth transistor T6 remain in the on-state, and the second transistor T2, the fourth transistor T4, the fifth transistor T5, and the seventh transistor T7 remain in the off-state. The high level (HI) is supplied to the scanning signal G (n+1) and the first transistor T1 is in the on-state. Both the voltage of the first electrode 614 and the voltage of the second electrode 616 are the voltage RDATA (n). That is, the voltage of the first electrode T1 and the voltage of the second electrode 616 of the first transistor T1 are the same. Therefore, no current flows through the first transistor T1.

Since the second transistor T2 and the seventh transistor T7 are in the off-state, the voltage RDATA (n)+the threshold voltage Vth (RDATA (n)+Vth) is held by the second node N2, the respective electrodes electrically connected to the second node N2, the gate electrode 622 of the second transistor T2, and the second electrode 694 of the capacitor CS. Further, when the third transistor T3 is turned off, the voltages of the gate electrode 622 of the second transistor T2 and the second electrode 694 of the capacitor CS are reduced (penetrated) to the voltage RDATA (n)+the threshold voltage Vth−the voltage α (RDATA (n)+Vth−α) by the capacitive coupling between the gate and the drain of the third transistor T3 (the gate electrode 632 and the first electrode 634). In this case, for example, the voltage α is a positive value, and is a voltage value that changes in accordance with the capacitance of the capacitor CS. For example, when the capacitance of the capacitor CS increases (becomes larger), the voltage α decreases (becomes smaller), and when the capacitance of the capacitor CS decreases (becomes smaller), the voltage α increases (becomes larger). In the present embodiment, the capacitance of the capacitor CS of the pixel 180A arranged in the region 22A is smaller than the capacitance of the capacitor CS of the pixel 180B arranged in the region 22B. When the capacitance of the capacitor CS is small, the penetration of the voltage α in the sampling period PWR increases. Therefore, the voltage held in the capacitor CS of the pixel 180A arranged in the region 22A is smaller than the voltage held in the capacitor CS of the pixel 180B arranged in the region 22B.

In addition, since the sixth transistor T6 is in the on-state, the initialization voltage VINI is supplied to the first electrode 692 of the capacitor CS, the respective electrodes electrically connected to the first electrode 692, and the second electrode 684 of the light emitting element OLED. As a result, the voltage of the voltage RDATA (n)+the threshold voltage Vth−voltage α−the initialization voltage VINI (RDATA (n)+Vth−α−VINI) is held in the capacitor CS. Similar to the sampling period PWR of the current frame, the current IINI flows from the initialization voltage line VM to the reference voltage line PVSS even in a period after the sampling period PWR of the current frame. The current IINI flowing through the light emitting element OLED is approximately 0 and the light emitting element OLED is non-light emitting (does not emit light).

As shown in FIG. 6, the scanning signal G (n) is supplied from a high level (HI) to a low level (LO), and after the third transistor T3 switches to the off-state, the scanning signal G (n+1) is supplied from a high level (HI) to a low level (LO), and the first transistor T1 switches to the off-state.

In this case, since the first transistor T1 is in the off-state, the voltage RDATA (n) is held in the first node N1 and the respective electrodes electrically connected to the first node N1. In addition, since the second transistor T2, the third transistor T3, and the seventh transistor T7 are in the off-state, the voltage RDATA (n)+the voltage Vth−the voltage α (RDATA (n)+Vth−α) is held in the second node N2, the respective electrodes electrically connected to the second node N2, the gate electrode 622 of the second transistor T2, and the second electrode 694 of the capacitor CS. In addition, since the sixth transistor T6 is in the on-state, the initialization voltage VINI is supplied to the first electrode 692 of the capacitor CS, the respective electrodes electrically connected to the first electrode 692, and the second electrode 684 of the light emitting element OLED. Therefore, the current IINI flows from the initialization voltage line VM to the reference voltage line PVSS following the period after the sampling period PWR of the current frame. The current IINI flowing through the light emitting element OLED is approximately 0 and the light emitting element OLED is non-light emitting (does not emit light).

Next, a method of driving the pixel 180 (pixel circuit 181) in the light emission period PEM of the current frame will be described with reference to FIG. 6, FIG. 11 and FIG. 12. The light emission period PEM of the current frame is a period in which the pixel 180 (the pixel circuit 181) emits light in accordance with the voltage RDATA (n). The light emission period PEM of the current frame is a period overlapping the horizontal period N+2nd HP.

Figure 12:
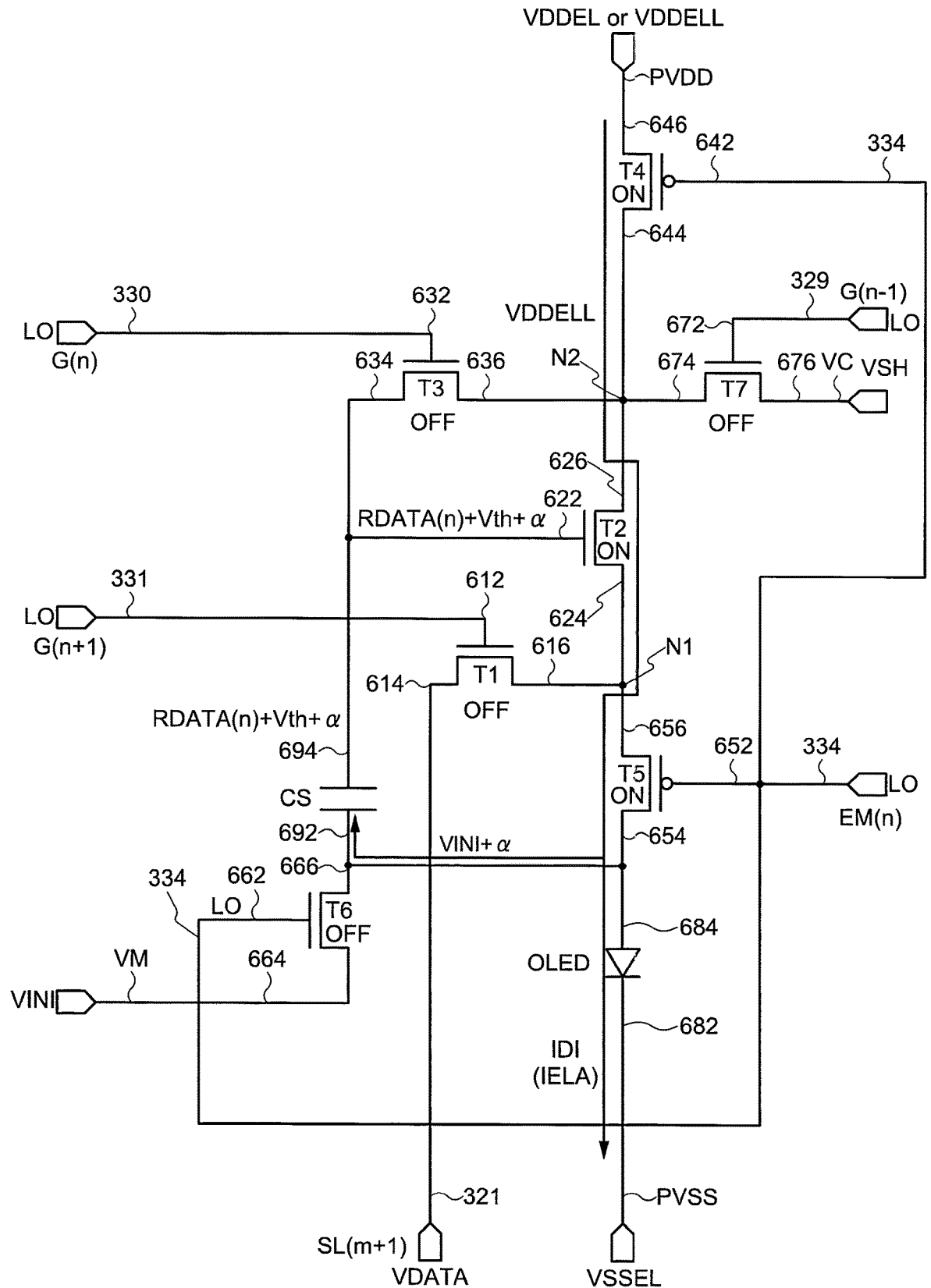
FIG. 12 is a schematic diagram showing an operation-state of a pixel at the timing shown in FIG. 6.

As shown in FIG. 6 and FIG. 12, the scanning signal G (n−1), the scanning signal G (n) and the scanning signal G (n+1) are supplied with a low level (LO), and the transistor T1, transistor T3, transistor T6 and transistor T7 are in the off-state. Further, the transistor T4, the fifth transistor T5, and the sixth transistor T6 are supplied with a low level (LO) from the light emission control signal EM (n), the transistor T4 and the transistor T5 are in the on-state, and the sixth transistor T6 is in the off-state.

Figure 11:
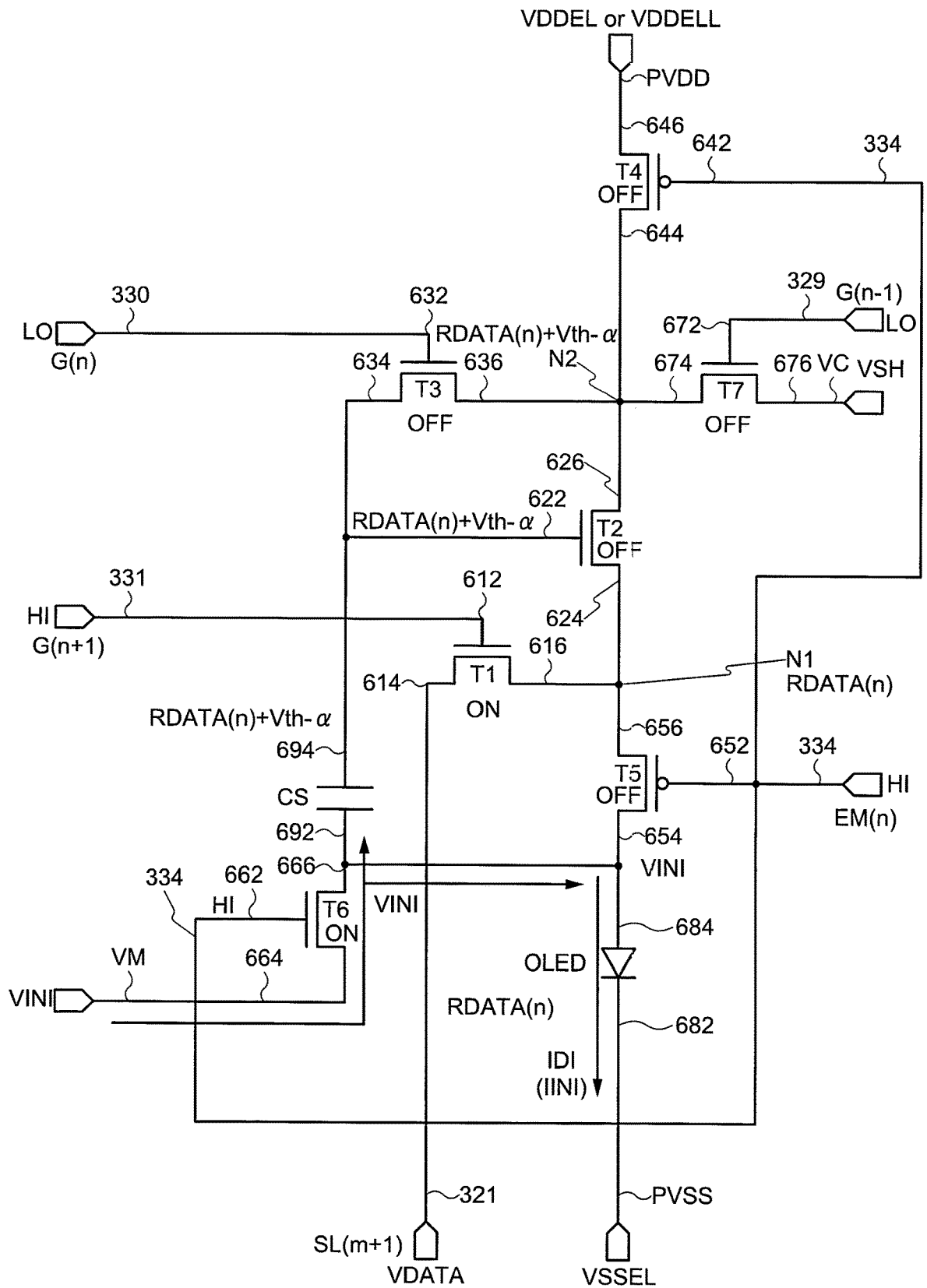
FIG. 11 is a schematic diagram showing an operation-state of a pixel at the timing shown in FIG. 6.

As shown in FIG. 11, a voltage held by the second electrode 656 of the transistor T5 is RDATA (n), and a voltage held by the first electrode 654 of the transistor T5 are the initialization voltages VINI.

In the case where the transistor T5 shown in FIG. 6 and FIG. 12 is in the on-state from a state in which a voltage of the second electrode 656 and the voltage of the first electrode 654 of the transistor T5 are the voltage RDATA (n) and the initialization voltage VINI, a current flows from the second electrode 656 to the first electrode 654 of the transistor T5, a redistribution of charges occurs, and the voltage of the second electrode 656 and the voltage of the first electrode 654 switch to the initialization voltage VINI. In this case, the gate electrode 622 of the transistor T2 and the second electrode 694 of the capacitor CS become the voltage RDATA (n)+the threshold voltage Vth−the voltage α−the initialization voltage VINI (RDATA (n)+Vth−α−VINI). Depending on a value of the voltage RDATA (n), the transistor T2 may be in the on state or the off-state.

Further, for example, as shown in FIG. 6 and FIG. 12, a current flows from the second electrode 656 to the first electrode 654 of the transistor T5 based on the transistor T5 being in the on-state, and if the voltages of the first electrode 654 and the respective electrodes electrically connected to the first electrode 654 (the second electrode 684 of the light emitting element OLED, the second electrode 666 of the transistor T6, and the first electrode 692 of the capacitor CS) increase from the voltage VINI to the voltage VINI+voltage β, a voltage held by the first node N1 (the second electrode 656 of the transistor T5 and the first electrode 624 of the transistor T2) decreases from RDATA (n). As the first electrode 692 of the capacitor CS increases to the voltage VINI+voltage β, a voltage of the gate electrode 622 of the transistor T2 and a voltage of the second electrode 694 of the capacitor CS increase from the voltage RDATA (n)+the threshold voltage Vth−voltage α (RDATA (n)+Vth−α) to the voltage RDATA (n)+the threshold voltage Vth−voltage α+voltage β (RDATA (n)+Vth−α+β). Consequently, since a gate/source voltage between the gate electrode 622 and the first electrode 624 of the transistor T2 is higher than the threshold voltage Vth of the transistor T2, the transistor T2 switches to the on-state.

The fourth transistor T4, the second transistor T2, and the fifth transistor T5 are in the on-state, and the current IELA flows from the driving power supply line PVDD to the reference voltage line PVSS. As a result, the current IELA flows through the light emitting element OLED, and the light emitting element OLED emits light. For example, the current IELA is a current based on the voltage RDATA (n)+the threshold voltage Vth−the voltage α+the voltage β (RDATA (n)+Vth−α+β) written in the transistor T2. When this voltage is applied between the gate and the source of the gate electrode 622 and the first electrode 624 of the second transistor T2, a current in which an influence caused by a variation in the threshold voltage Vth between the respective second transistors T2 of the pixels 180 (the pixel circuits 181) is cancelled out flows to the light emitting element OLED, thereby improving in-plane uniformity. Here, for example, the voltage β is a positive value, and is a voltage value that changes in accordance with the voltage RDATA (n). For example, if the voltage RDATA (n) increases, the voltage β increases, and if the voltage RDATA (n) decreases, the voltage β decreases. For example, the voltage β is determined such that a current value that the second transistor T2 supplies in accordance with the gate electrode 622, the first electrode 624, and the second electrode 626 is the same as the current value that the light emitting element OLED supplies.

On the other hand, in the present embodiment, the capacitance of the capacitor CS of the pixel 180A arranged in the region 22A is smaller than the capacitance of the capacitor CS of the pixel 180B arranged in the region 22B. When the capacitance of the capacitor CS is small, discharging in the sampling period PWR proceeds quickly, and the penetration of the voltage α increases. Therefore, the voltage held in the capacitor CS of the pixel 180A arranged in the region 22A is smaller than the voltage held in the capacitor CS of the pixel 180B arranged in the region 22B. By applying this voltage between the gate/source of the second transistor 622 and the first electrode 624 of the second transistor T2, a current smaller than the current flowing through the light emitting element OLED of the pixel 180B arranged in the region 22B flows through the light emitting element OLED of the pixel 180A arranged in the region 22A. In this way, it is possible to eliminate the phenomenon in which the outermost periphery of the display region emits light more brightly at low brightness, and further improve in-plane uniformity.

The self-luminous display device 10 is driven as described above, and image data corresponding to each pixel 180 (the pixel circuit 181) is supplied to each pixel 180 (the pixel circuit 181), a current corresponding to the image data is supplied to the light emitting element OLED included in each pixel 180 (the pixel circuit 181), and each light emitting element OLED emits light with a brightness corresponding to the image data. As a result, the self-luminous display device 10 can display a desired image.

Next, an example of driving methods in which the pixel 180 (the pixel circuit 181) displays black based on a voltage RDATAB included in the data signal VDATA that is input to the horizontal period Nth HP will be described with reference to FIG. 5B, FIG. 13, and FIG. 14. As described above, driving other than the black period PBWR in the low-frequency driving is the same as the high-frequency driving. Thus, driving of the pixel 180 (the pixel circuit 181) in the black period PBWR will mainly be described here. The same or similar configurations as those in FIG. 1 to FIG. 5A and FIG. 6 to FIG. 12 will not be described here. The horizontal axis of the timing charts indicates times (TIME).

First, the data signal VDATA, the selection signal MUXR, the selection signal MUXG, and the selection signal MUXB will be described. The image data signal SL (m+1) including the data signal VDATA is input to each pixel 180 (pixel circuit 181) in accordance with each horizontal period. For example, the data signal VDATA is analog data including the voltage VDL for displaying black. The voltage VDM is the voltage between the voltage VDH and the voltage VDL that is lower than the voltage VDH. For example, in each of the horizontal periods the voltage VDL is selected using the selection signal MUXR and is supplied to the image data signal line, the voltage VDL is selected using the selection signal MUXG and is supplied to the image data signal line, and the voltage VDL is selected using the selection signal MUXB and is supplied to the image data signal line. For example, in the periods in which no data is selected using the select signal MUXG, the data signal VDATA is kept at the voltage VDM.

A method for driving the pixel 180 (pixel circuit 181) in the light emission period PEM of the previous frame of the current frame (K−1st FRAME) is the same as the driving method described with reference to FIG. 1 to FIG. 5A and FIG. 6 to FIG. 12. Therefore, a description thereof will be omitted. The voltages of the first node N1, the first electrode 654 of the transistor T5, and the second electrode 684 of the light emitting element OLED from the light emission period PEM of the previous frame of the current frame (K−1st FRAME) are voltages between the voltage VDL and the voltage VDH.

Next, a driving method of the pixel 180 (the pixel circuit 181) in the black period PBWR, which is executed following the emission period PEM of the previous frame of the current frame (K−1st RAME), will be described. The black period PBWR of the current frame is a period overlapping a part of the horizontal period N−2nd HP, the horizontal period N−1st HP, the horizontal period Nth HP, the horizontal period N+1st HP, and a part of the horizontal period N+2nd HP.

The scanning signal G (n−1), the scanning signal G (n) and the scanning signal G (n+1) are supplied with a low level (LO) and the light emission control signal EM (n) is supplied with a high level (HI). The first transistor T1, the second transistor T2, the third transistor T3, the fourth transistor T4, the fifth transistor T5, and the seventh transistor T7 are in the off-state, and the sixth transistor T6 is in the on-state.

Since the sixth transistor T6 is in the on-state, the voltage RDATAB is supplied to the first electrode 692 of the capacitor CS, the respective electrodes electrically connected to the first electrode 692, and the second electrode 684 of the light emitting element OLED. Thus, a current IRB flows from the initialization voltage line VM toward the reference voltage line PVSS. The current IRB flowing through the light emitting element OLED is a current for displaying black based on the voltage RDATAB, and the light emitting element OLED emits almost no light (does not emit light). Therefore, the pixel 180 displays black.

A method for driving the pixel 180 (pixel circuit 181) in the light emission period PEM of the current frame (Kth FRAME) is the same as the method for driving the pixel 180 (pixel circuit 181) in the light emission period PEM of the previous frame of the current frame (K−1st FRAME). Therefore, a description thereof will be omitted. A voltage supplied to the first node N1, the first electrode 654 of the transistor T5, and the second electrode 684 of the light emitting element OLED of the light emission period PEM of the current frame (Kth FRAME) is a voltage between the voltage VDL and the voltage VDH.

In the black period PBWR of the self-luminous display device 10, the self-luminous display device 10 can display black by being supplied with the voltage RDATAB from the initialization voltage line VM to the second electrode 684 of the light emitting element OLED.

2. Second Embodiment

A self-luminous display device according to a second embodiment will be described with reference to FIG. 15. A configuration of the self-luminous display device is similar to the configuration of the self-luminous display device 10 described in the first embodiment except that the configuration of the pixel circuit is different. The same or similar configurations as those of the self-luminous display device described in the first embodiment and the same or similar configurations as those of FIG. 1 to FIG. 14 will not be described here. In the present embodiment, the capacitance of the pixel 180A is different from the capacitance of the pixel 180B. The capacitance connected to the gate electrode 622 of the second transistor T2 of the pixel 180A is different from the capacitance connected to the gate electrode 622 of the second transistor T2 of the pixel 180B.

[2-1. Configuration of Pixel 180]

An overview of the pixel 180 will be described with reference to FIG. 15. FIG. 15 is a circuit diagram showing a configuration of the pixel circuit 182. FIG. 15 shows an example of the configuration of the pixel circuit 182 of the pixel 180 shown in FIG. 2. The configurations of the pixel 180 and the pixel circuit 182 are not limited to the configurations shown in FIG. 15. Descriptions of the same or similar configurations as those in FIG. 1 to FIG. 14 will be omitted.

The pixel circuit 182 is a circuit for driving the pixel 180 in the same manner as the pixel circuit 181, and has the same configuration and function as the pixel circuit 181 except for the third transistor T3. In the description of the pixel circuit 182, differences from the pixel circuit 181 will mainly be described.

Figure 15:
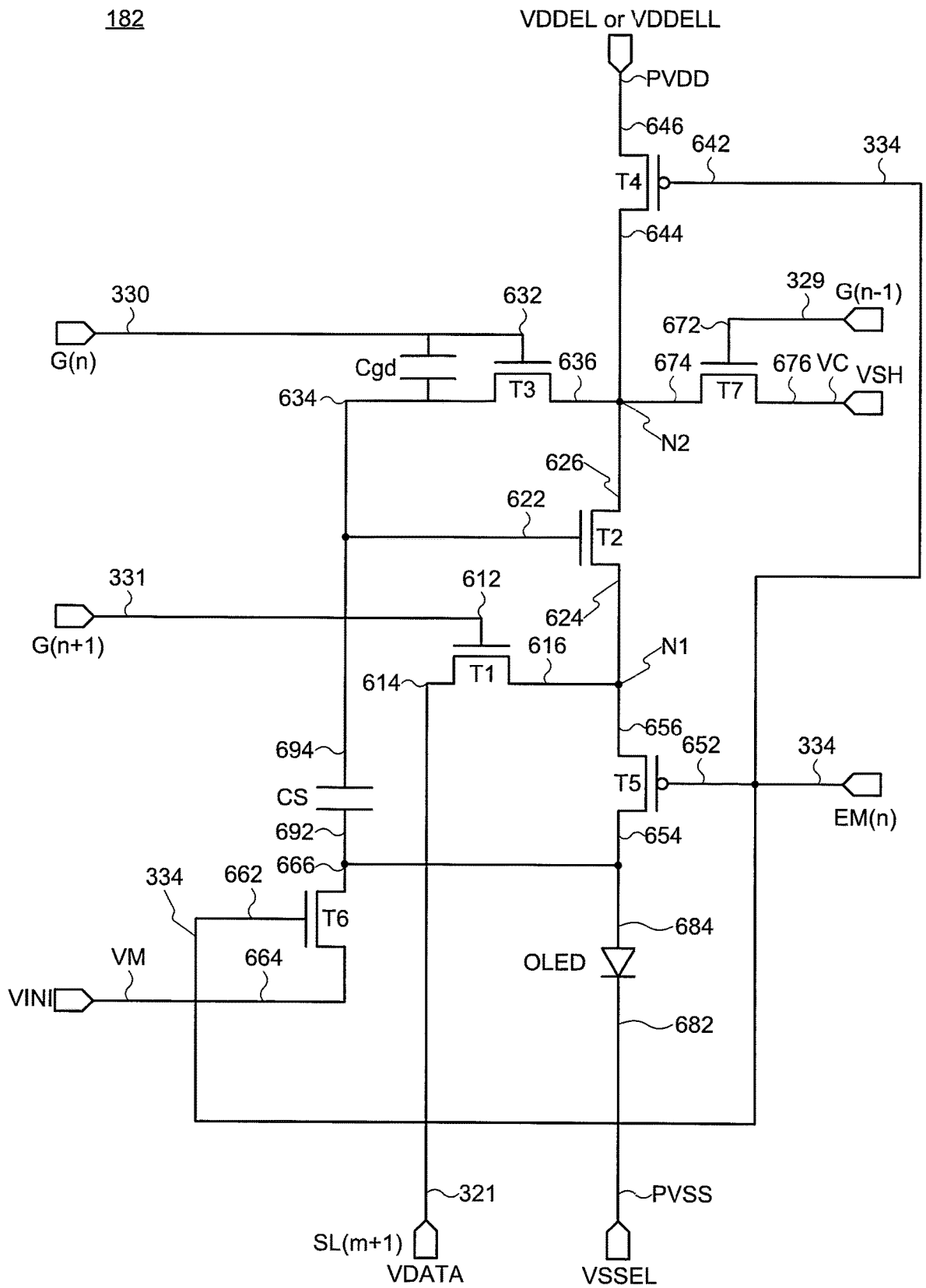
FIG. 15 is a circuit diagram showing a configuration of a pixel circuit according to a second embodiment of the present invention.

As shown in FIG. 15, the pixel circuit 182 includes the transistor T1, the transistor T2, the transistor T3, the transistor T4, the transistor T5, the transistor T6, the transistor T7, the capacitive element CS, and the light emitting element OLED in the same manner as the pixel circuit 181. In the pixel circuit 182, the fourth transistor T4 and the fifth transistor T5 are p-channel field effect transistors as in the pixel circuit 181.

In the present embodiment, the capacitance of the capacitor CS of the pixel 180A arranged in the region 22A and the capacitance of the capacitor CS of the pixel 180B arranged in the region 22B are substantially the same. On the other hand, the capacitance between the gate and the drain of the third transistor T3 of the pixel 180A arranged in the region 22A is larger than the capacitance between the gate and the drain of the third transistor T3 of the pixel 180B arranged in the region 22B. The capacitance between the gate and the drain of the third transistor T3 of the pixel 180A is preferably 1.1 times or more of the capacitance between the gate and the drain of the third transistor T3 of the pixel 180B. For example, the layout of the electrodes of the third transistor T3 of the pixel 180A may be different from that of the third transistor T3 of the pixel 180B. For example, in the pixel 180A, a capacitance Cgd may be adjusted by appropriately adjusting the area of the region where the gate electrode 632 of the third transistor T3 or the wiring connected to the gate electrode 632 overlaps the first electrode 634 or the wiring connected to the first electrode 634. Further, in the pixel 180B, the capacitance Cgd may be adjusted by appropriately adjusting the area of the region where the gate electrode 632 of the third transistor T3 or the wiring connected to the gate electrode 632 overlaps the first electrode 634 or the wiring connected to the first electrode 634. In this case, the capacitance Cgd of the pixel 180A may be larger than the capacitance Cgd of the pixel 180B.

The region 22A may include a plurality of rows and a plurality of columns of the pixels 180A, and in this case, the capacitance between the gate and the drain of the transistor T3 of the pixel 180A arranged at the outermost periphery and the capacitance between the gate and the drain of the transistor T3 of the pixel 180A adjacent to the pixel 180B in the region 22B may be different from each other. The capacitance between the gate and the drain of the transistor T3 of the pixel 180A arranged at the outermost periphery may be larger than the capacitance between the gate and the drain of the transistor T3 of the pixel 180A adjacent to the pixel 180B in the region 22B. Within the region 22A, the capacitance between the gate and the drain of the transistor T3 may have a negative gradient from the pixel 180A arranged at the outermost periphery to the pixel 180A adjacent to the pixel 180B in the region 22B.

In the present embodiment, the capacitance between the gate and the drain of the transistor T3 of the pixel 180A arranged in the region 22A is larger than the capacitance between the gate and the drain of the transistor T3 of the pixel 180B arranged in the region 22B. When the capacitance between the gate and the drain of the transistor T3 is large, the penetration of the voltage α in the sampling period PWR increases. Therefore, the voltage held at the capacitor CS of the pixel 180A arranged in the region 22A is smaller than the voltage held at the capacitor CS of the pixel 180B arranged in the region 22B. By applying this voltage between the gate and the source of the gate electrode 622 and the first electrode 624 of the second transistor T2 in the light-emitting period PEM, a current smaller than the current flowing through the light emitting element OLED of the pixel 180B arranged in the region 22B flows through the light emitting element OLED of the pixel 180A arranged in the region 22A. In this way, it is possible to eliminate the phenomenon in which the outermost periphery of the display region emits light more brightly at low brightness, and further improve in-plane uniformity.

3. Third Embodiment

A self-luminous display device according to a third embodiment will be described with reference to FIG. 16. The self-luminous display device 11 according to the third embodiment is similar to the configuration of the self-luminous display device 10 described in the first embodiment, except that the capacitance of the pixel 180 is substantially the same, and instead, the capacitance connected to the image data signal line 321 at the left and right ends is different from the other capacitances. Configurations that are the same as or similar to those of the self-luminous display device described in the first embodiment, and configurations that are the same as or similar to those in FIG. 1 to FIG. 15 will not be described here.

[3-1. Overview of Self-Emission Display Device 11>

An overview of a self-luminous display device 11 according to the third embodiment will be described with reference to FIG. 16. FIG. 16 is a schematic diagram showing a configuration of the self-luminous display device 11 according to the third embodiment. The configuration of the self-luminous display device 11 shown in FIG. 16 is an example, and the configuration of the self-luminous display device 11 is not limited to the configuration shown in FIG. 16.

Figure 16:
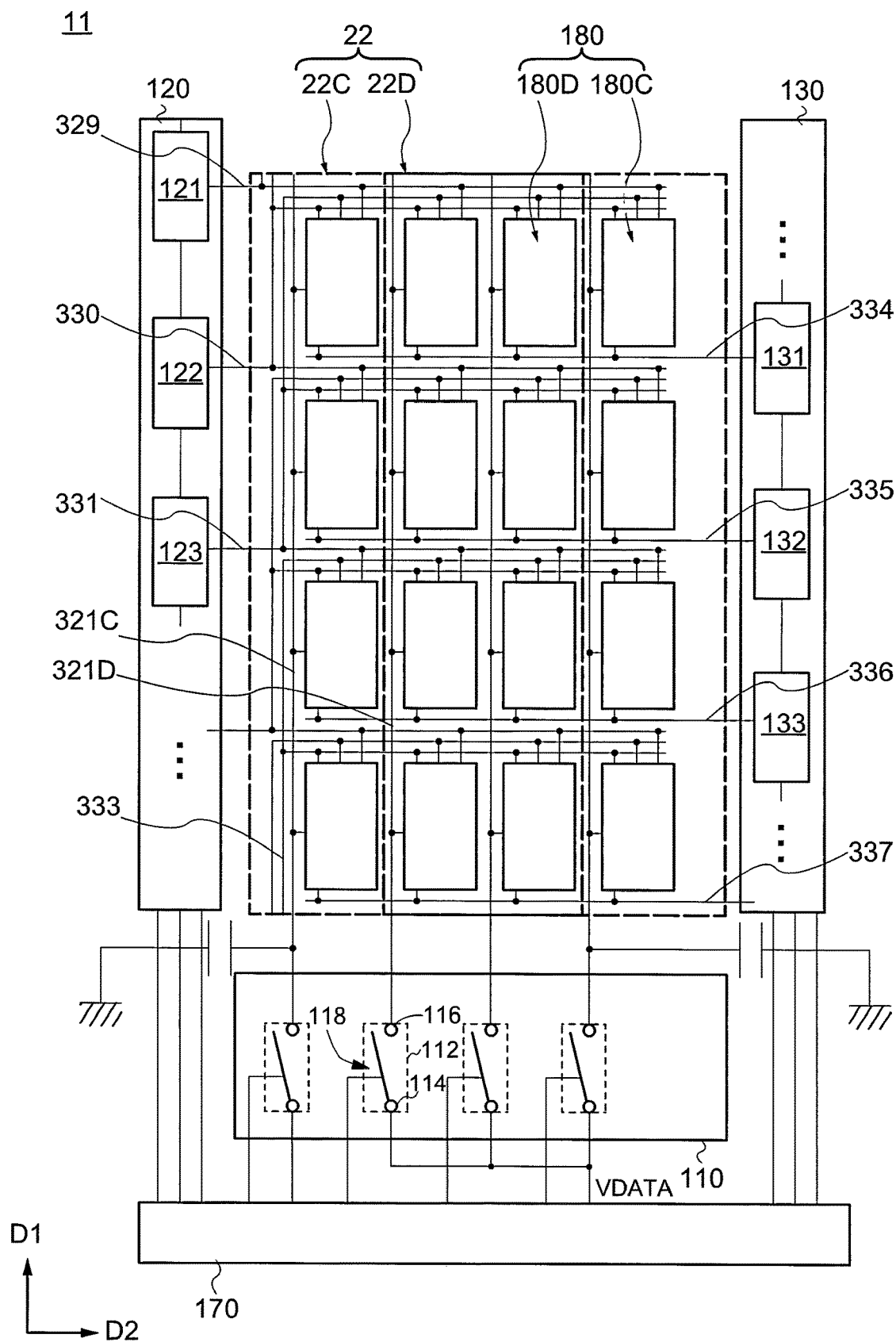
FIG. 16 is a schematic diagram showing a timing chart of a self-luminous display device according to a third embodiment of the present invention.

As shown in FIG. 16, the self-luminous display device 11 includes the plurality of pixels 180, the source driver circuit 110, the gate driver circuit 120, and the light emission control circuit 130. Each of the source driver circuit 110, the gate driver circuit 120, and the light emission control circuit 130 is connected to the terminal part 150 using the connection wiring 341.

The plurality of pixels 180 of the display region 22 is arranged in a matrix. The display region 22 includes a region 22C and a region 22D. The region 22C is adjacent to the region 22D in the second direction D2 (row direction) and the regions are arranged opposite each other on both the left and right ends of the display region 22. However, the present invention is not limited to this, and the region 22C is adjacent to the region 22D in the second direction D2 (row direction) and may be arranged on only one of the left and right sides of the display region 22. The region 22D is arranged so as to be sandwiched between the region 22C in the second direction D2 (row direction). The region 22C may include a column of pixels 180C arranged in the first direction D1 (column direction) of an outer edge of the display region 22, and may include a plurality of columns of pixels 180C. The plurality of pixels 180C arranged in the first direction D1 (column direction) of the region 22C shares one image data signal line 321C. In addition, since the capacitance of the pixel 180C and a capacitance of a pixel 180D are the same in the present embodiment, in the case where the pixel 180C and the pixel 180D are not distinguished from each other, they are referred to as the pixel 180.

The source driver circuit 110 is arranged at a position adjacent to the display region 22 in the first direction D1 (column direction). The image data signal line 321 extends from the source driver circuit 110 in the first direction D1 and is connected to the plurality of pixels 180 arranged in the first direction D1. The source driver circuit 110 includes the plurality of selection circuits 112 as in the first embodiment, and supplies the image data signal SL (m+1) including the data signal VDATA selected by the on-signal supplied to the selection signal and supplied to the input terminal 114, to the image data signal line 321 and the pixel 180 electrically connected to the image data signal line 321.

In the present embodiment, the capacitance of the capacitor CS of the pixel 180C arranged in the region 22C and the capacitance of the capacitor CS of the pixel 180D arranged in the region 22D are substantially the same. On the other hand, the capacitance of the image data signal line 321C connected to the pixel 180O arranged in the region 22C is larger than the capacitance of an image data signal line 321D connected to the pixel 180D arranged in the region 22D. The capacitance of the image data signal line 321C connected to the pixel 180C is preferably 1.2 times or more of the capacitance of the image data signal line 321D connected to the pixel 180D. For example, the signal line 321C may have a dummy capacitance connected to ground (GND). In addition, the signal line 321D may also have a dummy capacitance connected to ground (GND). In this case, the capacitance of the dummy capacitance of the pixel 180C may be larger than the capacitance of the dummy capacitance of the pixel 180D.

Each of the left and right end of the region 22C may include a plurality of columns of pixel 180O, and in this case, the capacitance of the image data signal line 321C connected to the pixel 180C arranged at the very end may be different from the capacitance of the image data signal line 321C connected to the pixel 180C adjacent to the pixel 180D in the region 22D. The capacitance of the image data signal line 321C connected to the pixel 180O arranged at the very end may be larger than the capacitance of the image data signal line 321C connected to the pixel 180C adjacent to the pixel 180D in the region 22D. Within the region 22C, the capacitance may have a negative gradient from the image data signal line 321C connected to the pixel 180O arranged at the very end to the image data signal line 321C connected to the pixel 180C adjacent to the pixel 180D in the region 22D.

In the present embodiment, the capacitance of the image data signal line 321C connected to the pixel 180C arranged in the region 22C is larger than the capacitance of the image data signal line 321D connected to the pixel 180D arranged in the region 22D. When the capacitance of the image data signal line 321C is large, it is possible to suppress an increase in the potential due to the flow of charges into the image data signal line 321C of the capacitor CS during the sampling period PWR. Therefore, the voltage held in the capacitor CS of the pixel 180C arranged in the region 22C sharing the image data signal line 321C is smaller than the voltage held in the capacitor CS of the pixel 180D arranged in the region 22D sharing the image data signal line 321D. By applying this voltage between the gate and the source of the second transistor 622 and the first electrode 624 of the second transistor T2, a current smaller than the current flowing through the light emitting element OLED of the pixel 180D arranged in the region 22D flows though the light emitting element OLED of the pixel 180C arranged in the region 22C. In this way, it is possible to eliminate the phenomenon in which the outermost end of the display region emits light more brightly at low brightness, and further improve in-plane uniformity.

4. Fourth Embodiment

A self-luminous display device according to a fourth embodiment will be described with reference to FIG. 17. The self-luminous display device 11 according to the fourth embodiment is similar to the configuration of the self-luminous display device 10 described in the first embodiment, except that the capacitance of the pixel 180 is substantially the same, and instead, the capacitance connected to the image-data signal line 321 at the left and right end is different from the other capacitances. The self-luminous display device 11 according to the fourth embodiment is similar to the configuration of the self-luminous display device 11 described in the third embodiment, except that the capacitance connected to the image-data signal line 321 is substantially the same, and instead, the configuration of the source driver circuit is different. Configurations that are the same as or similar to those of the self-luminous display device described in the first embodiment and the third embodiment, and configurations that are the same as or similar to those in FIG. 1 to FIG. 16 will not be described here.

[4-1. Overview of Self-luminous Display Device 11]

An overview of the self-luminous display device 11 according to the fourth embodiment will be described with reference to FIG. 17. FIG. 17 is a schematic diagram showing a configuration of a source driver circuit 111 according to the fourth embodiment. The configuration of the source driver circuit 111 shown in FIG. 17 is an example, and the configuration of the source driver circuit 111 is not limited to the configuration shown in FIG. 17.

As shown in FIG. 16, the self-luminous display device 11 includes the plurality of pixels 180, the source driver circuit 111, the gate driver circuit 120, and the light emission control circuit 130. Each of the source driver circuit 111, the gate driver circuit 120, and the light emission control circuit 130 is connected to the terminal part 150 using the connection wiring 341.

The plurality of pixels 180 of the display region 22 is arranged in a matrix. The display region 22 includes the region 22C and the region 22D. The region 22C is adjacent to the region 22D in the second direction D2 (row direction) and arranged opposite to the left and right ends of the display region 22. However, the present invention is not limited to this, and the region 22C is adjacent to the region 22D in the second direction D2 (row direction) and may be arranged on only one of the left and right sides of the display region 22. The region 22D is arranged so as to be sandwiched between the region 22C in the second direction D2 (row direction). The region 22C may include a column of pixel 180C arranged in the first direction D1 (column direction) of the outer edge of the display region 22, and may include a plurality of columns of pixel 180C. The plurality of pixels 180C arranged in the first direction D1 (column direction) of the region 22C share one image data signal line 321C. In addition, since the capacitance of the pixel 180O and the capacitance of the pixel 180D are the same in the present embodiment, in the case where the pixel 180C and the pixel 180D are not distinguished from each other, they are referred to as the pixel 180.

Similar to the self-luminous display device 11 according to the third embodiment, the source driver circuit 111 is arranged at a position adjacent to the display region 22 in the first direction D1 (column direction). The signal line 321 extends from the source driver circuit 111 in the first direction D1 and is connected to the plurality of pixels 180 arranged in the first direction D1. The source driver circuit 111 includes the plurality of selection circuits 112 as in the first embodiment, and supplies the image data signal SL (m+1) including the data signal VDATA selected by the on-signal supplied to the selection signal and supplied to the input terminal 114, to the image data signal line 321 and the pixel 180 electrically connected to the image data signal line 321. The plurality of pixels 180C arranged in the first direction D1 (column direction) of the region 22C share one selection circuit 112C.

In the present embodiment, the capacitance of the capacitor CS of the pixel 180C arranged in the region 22C and the capacitance of the capacitor CS of the pixel 180D arranged in the region 22D are substantially the same. The capacitance of the image data signal line 321C connected to the pixel 180O arranged in the region 22C and the capacitance of the image data signal line 321D connected to the pixel 180D arranged in the region 22D are substantially the same. On the other hand, the capacitance of the selection circuit 112C connected to the image data signal line 321C is larger than a capacitance of a selection circuit 112D connected to the image data signal line 321D. The capacitance of the selection circuit 112C connected to the image data signal line 321C is preferably 1.1 times or more of the capacitance of the selection circuit 112D connected to the image data signal line 321D. For example, the layout of the electrodes of the selection circuit 112C connected to the image data signal line 321C may be different from that of the selection circuit 112D connected to the image data signal line 321D. For example, the capacitance Cgd (c) may be adjusted by appropriately adjusting the area of the region where the gate electrode of the selection circuit 112C or the wiring connected to the gate electrode overlaps the drain electrode or the wiring connected to the drain electrode. The capacitance Cgd (d) may be adjusted by appropriately adjusting the area of the region where the gate electrode of the selection circuit 112D or the wiring connected to the gate electrode overlaps the drain electrode or the wiring connected to the drain electrode. In this case, the capacitance Cgd (c) of the selection circuit 112C may be larger than the capacitance Cgd (d) of the selection circuit 112D.

Figure 17:
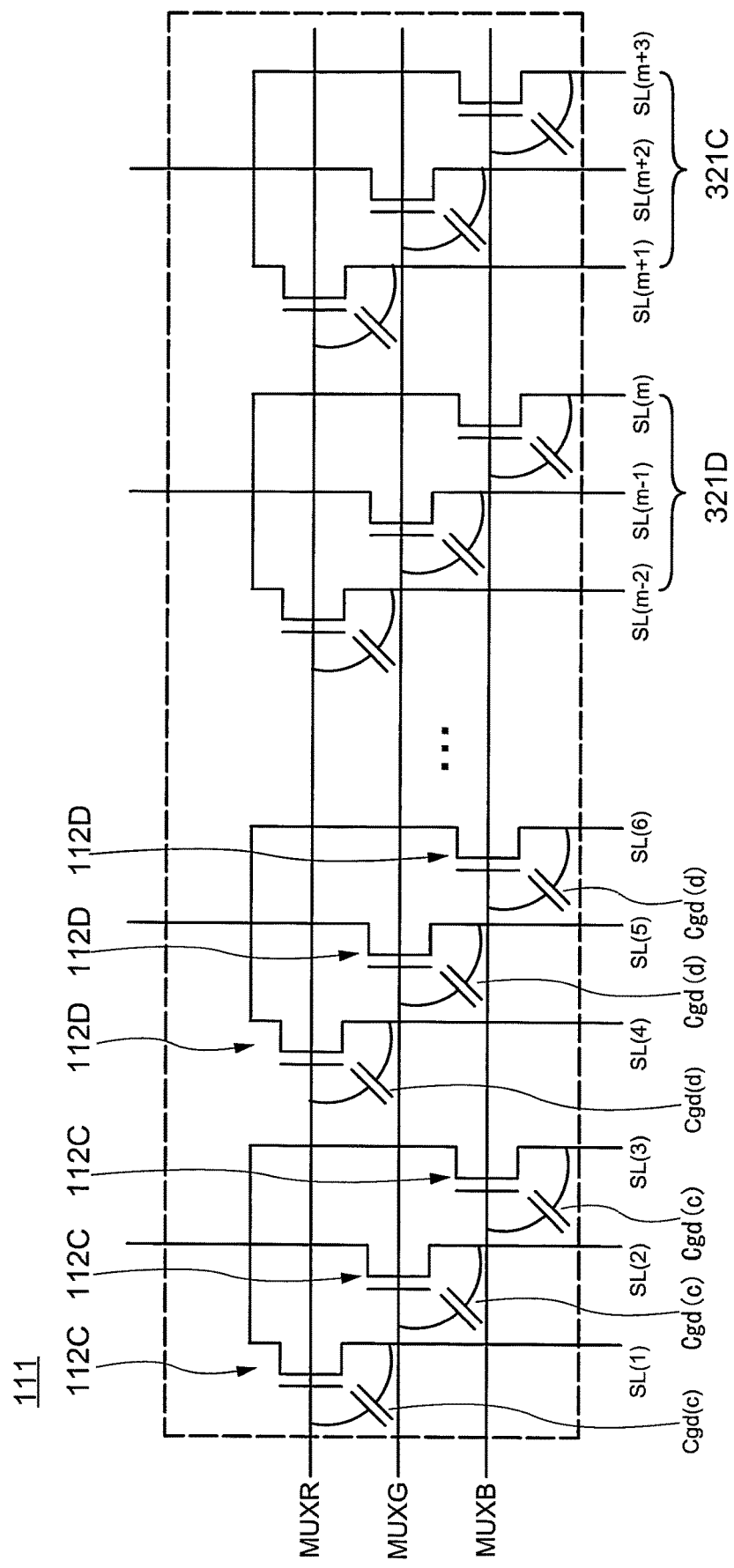
FIG. 17 is a schematic diagram showing a configuration of a source driver circuit according to a fourth embodiment of the present invention.

As in the example shown in FIG. 17, each of the left and right sides of the region 22C may include the plurality of columns of pixel 180C. In the present embodiment, the capacitance of the selection circuit 112C connected to the image data signal line 321C of three columns of R, G, and B is uniformly increased by data signal VDATA1 units supplied from the IC chip 170. However, the present invention is not limited to this, and the capacitance of the selection circuit 112C connected to the pixel 180O arranged at the very end via the image data signal line 321C may be different from the capacitance of the selection circuit 112C connected to the pixel 180C adjacent to the pixel 180D in the region 22D via the image data signal line 321C. The capacitance of the selection circuit 112C connected to the pixel 180C arranged at the very end via the image data signal line 321C may be larger than the capacitance of the selection circuit 112C connected to the pixel 180C adjacent to the pixel 180D in the region 22D via the image data signal line 321C. Within the region 22C, the capacitance may have a negative gradient from the selection circuit 112C connected to the pixel 180C arranged at the very end via the image data signal line 321C to the selection circuit 112C connected to the pixel 180C adjacent to the pixel 180D in the region 22D via the image data signal line 321C. On the other hand, only the capacitance of the selection circuit 112C connected to the signal line 321C (SL (1) and SL (m+3)) may be increased.

In the present embodiment, the capacitance of the selection circuit 112C connected to the pixel 180C arranged in the region 22C via the image data signal line 321C is larger than the capacitance of the selection circuit 112D connected to the pixel 180D arranged in the region 22D via the image data signal line 321D. When the capacitance of the selection circuit 112C is large, the potential drop of the image-data signal line 321C due to the capacitance coupling between the gate and the drain when the selection circuit 112C is turned off increases, and the voltage RDATA (n) applied to the pixel 180C in the sampling period PWR decreases. Therefore, the voltage held in the capacitor CS of the pixel 180O arranged in the region 22C sharing the selection circuit 112C is smaller than the voltage held in the capacitor CS of the pixel 180D arranged in the region 22D sharing the selection circuit 112D. By applying this voltage between the gate and the source of the gate electrode 622 and the first electrode 624 of the second transistor T2, a current smaller than the current flowing through the light emitting element OLED of the pixel 180D arranged in the region 22D flows to the light emitting element OLED of the pixel 180C arranged in the region 22C. In this way, it is possible to eliminate the phenomenon in which the outermost end of the display region emits light more brightly at low brightness, and further improve in-plane uniformity.

5. Fifth Embodiment

A self-luminous display device according to a fifth embodiment will be described with reference to FIG. 18 and FIG. 19. A self-luminous display device 12 according to the fifth embodiment is similar to the configuration of the self-luminous display device 10 described in the first embodiment, except that the capacitance of the pixel 180 is substantially the same, and instead, the driving method of the pixels 180 (pixel circuits) at the upper and lower ends by the scanning signal is different from the other driving methods. Configurations that are the same as or similar to those of the self-luminous display device described in the first embodiment, and configurations that are the same as or similar to those in FIGS. 1 to 17 will not be described here.

[5-1. Overview of Self-Luminous Display Device 12]

An overview of the self-luminous display device 12 according to a fifth embodiment will be described with reference to FIG. 18. FIG. 18 is a schematic diagram showing a configuration of the self-luminous display device 12 according to the fifth embodiment. The configuration of the self-luminous display device 12 shown in FIG. 18 is an example, and the configuration of the self-luminous display device 12 is not limited to the configuration shown in FIG. 18.

Figure 18:
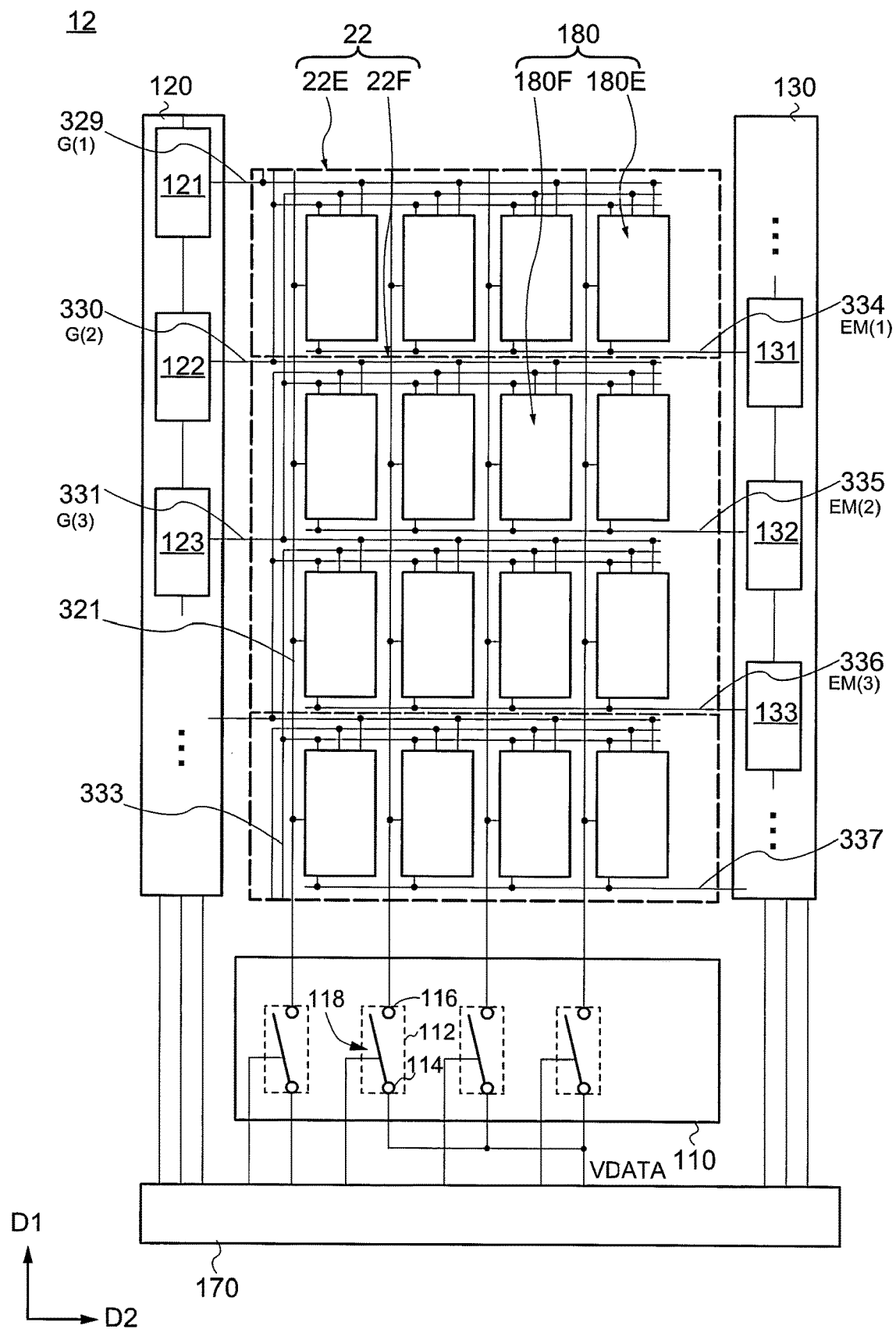
FIG. 18 is a schematic diagram showing a configuration of a self-luminous display device according to a fifth embodiment of the present invention.
Figure 19:
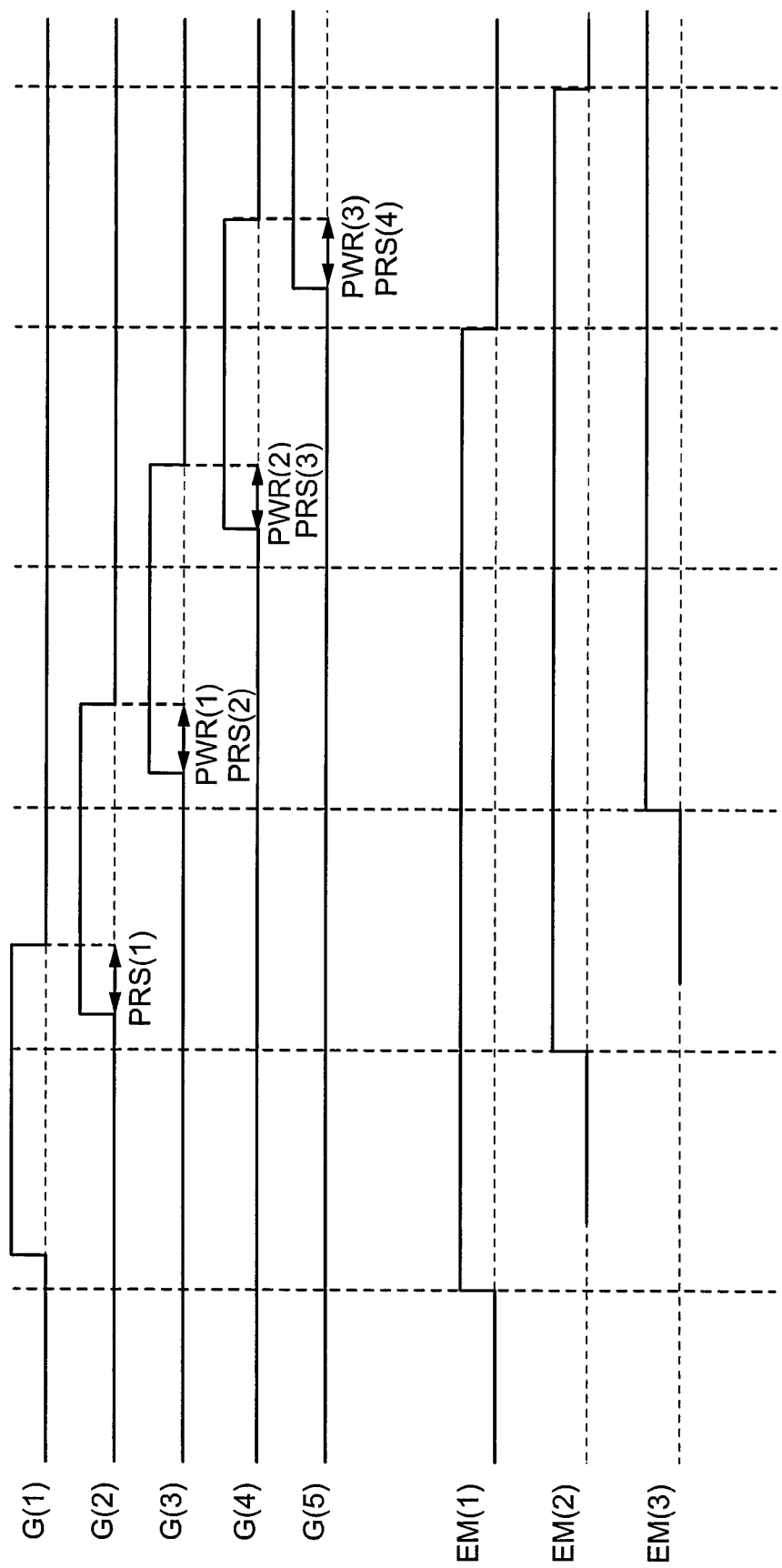
FIG. 19 is a plan view showing the overview of a semiconductor device according to the fifth embodiment of the present invention.

As shown in FIG. 18, the self-luminous display device 12 includes the plurality of pixels 180, the source driver circuit 110, the gate driver circuit 120, and the light emission control circuit 130. Each of the source driver circuit 110, the gate driver circuit 120, and the light emission control circuit 130 is connected to the terminal part 150 using the connection wiring 341.

The plurality of pixels 180 of the display region 22 is arranged in a matrix. The display region 22 includes a region 22E and a region 22F. The region 22E is adjacent to the region 22F in the first direction D1 (column direction) and arranged opposite to the upper and lower ends of the display region 22. The region 22F is arranged so as to be sandwiched between the region 22E in the first direction D1 (column direction). The region 22E may include a row of pixel 180E arranged in the second direction D2 (row direction) of the outer edge of the display region 22, and may include a plurality of rows of pixel 180E. In addition, since a capacitance of the pixel 180E and a capacitance of a pixel 180F are the same in the present embodiment, in the case where the pixel 180E and the pixel 180F are not distinguished from each other, they are referred to as the pixel 180.

Similar to the self-luminous display device 10 according to the first embodiment, the gate driver 120 is arranged at a position adjacent to the display region 22 in the second direction D2 (row direction). The scanning signal lines 329, 330, 331, and 332 extend from the gate driver circuit 120 in the second direction D2 and are connected to the plurality of pixels 180 arranged in the second direction D2. The gate driver circuit 120 includes the plurality of shift registers (for example, shift registers 121, 122, and 123) as in the first embodiment, and sequentially supplies the scanning signals (for example, scanning signal G (n−1), scanning signal G (n), and scanning signal G (n+1)) having different timings to the pixels 180 electrically connected to the scanning signal lines 329, 330, 331, and 332, respectively, based on the control signals such as a clock signal and a start pulse supplied from the IC chip 170.

[5-2. Driving Method of Self-Luminous Display Device 12]

A driving method of the self-luminous display device 12 according to the fifth embodiment will be described with reference to FIG. 19. FIG. 19 is a schematic diagram showing a timing chart of the self-luminous display device 12 according to the fifth embodiment. In the present embodiment, a sampling period PWR (1) of the pixel 180E is different from a sampling period PWR (2) of the pixel 180F. The sampling period PWR (1) of the pixel 180E is longer than the sampling period PWR (2) of the pixel 180F. That is, the time when the scanning signal G (2) and the scanning signal G (3) supplied to the pixel 180E overlap may be longer than the time when the scanning signal G (3) and the scanning signal G (4) supplied to the pixel 180F overlap. For example, the timing at which the scanning signal G (2) is turned off may be slow, and may be earlier than the timing at which the scanning signal G (4) is turned on. A pulse width at which the scanning signal G (2) is on may be longer than that of the other scanning signals G. The timing at which the scanning signal G (3) is turned on may be earlier, and may be later than the timing at which the scanning signal G (1) is turned off. A pulse width at which the scanning signal G (3) is on may be longer than that of the other scanning signals G. Here, the driving method of the pixel 180E arranged in the region 22E of the uppermost end is described. In a similar driving method, the pixel 180E arranged in the region 22E of the lowermost end can be driven.

As shown in FIG. 18, in the present embodiment, each of the region 22E at the upper and lower ends includes one row of pixel 180E. However, the present invention is not limited to this, and each of the region 22E at the upper and lower ends may include a plurality of rows of pixel 180E, and the sampling period PWR of the pixel 180E arranged at the very end may be different from the sampling period PWR of the pixel E adjacent to the pixel 180E in the region 22F. The sampling period PWR of the pixel 180E arranged at the very end may be longer than the sampling period PWR of the pixel E adjacent to the pixel 180F in the region 22F. Within the region 22E, a negative gradient may be provided from the sampling period PWR of the pixel 180E arranged at the very end to the sampling period PWR of the pixel 180E adjacent to the pixel 180F in the region 22F.

In the present embodiment, the sampling period PWR of the pixel 180E arranged in the region 22E is longer than the sampling period PWR of the pixel 180F arranged in the region 22F. When the sampling period PWR is long, discharging in the sampling period PWR proceeds quickly. Therefore, the voltage held in the capacitor CS of the pixel 180E arranged in the region 22E is smaller than the voltage held in the capacitor CS of the pixel 180F arranged in the region 22F. By applying this voltage between the gate and the source of the gate electrode 622 and the first electrode 624 of the second transistor T2, a current smaller than the current flowing through the light emitting element OLED of the pixel 180F arranged in the region 22F flows through the light emitting element OLED of the pixel 180E arranged in the region 22E. In this way, it is possible to eliminate the phenomenon in which the outermost end of the display region emits light more brightly at low brightness, and further improve in-plane uniformity. In addition, the driving method of the self-luminous display device according to the present embodiment can be applied to the self-luminous display device according to the third embodiment or the fourth embodiment. By applying the driving method to these self-luminous display devices, it is possible to eliminate the phenomenon in which the outermost periphery of the display region emits light more brightly and further improve in-plane uniformity.

6. Sixth Embodiment

Figure 20:
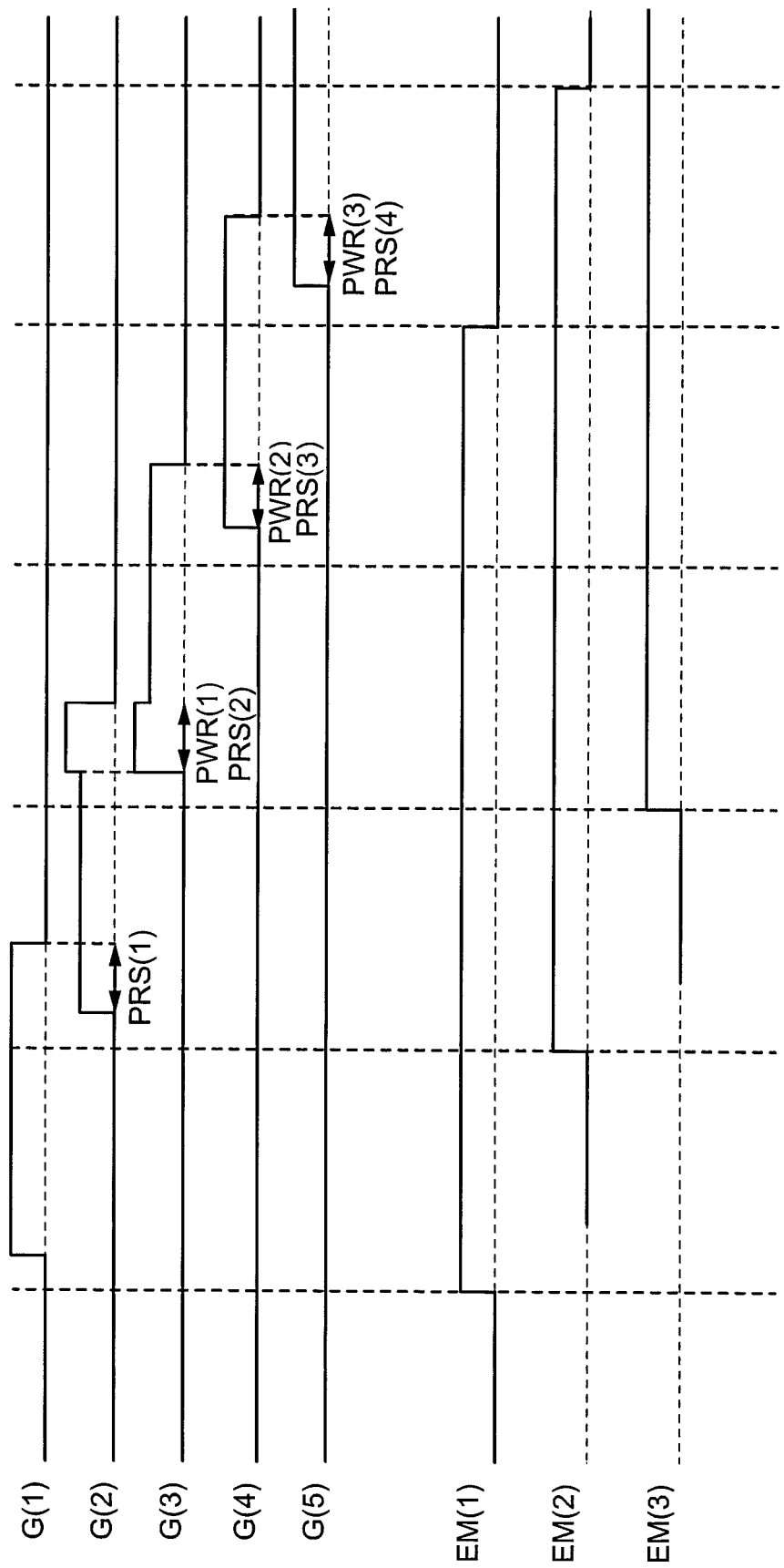
FIG. 20 is a schematic diagram showing a timing chart of a self-luminous display device according to a sixth embodiment of the present invention.

A self-luminous display device according to a sixth embodiment will be described with reference to FIG. 20. The self-luminous display device 12 according to the sixth embodiment is similar to the configuration of the self-luminous display device 10 described in the first embodiment, except that the capacitance of the pixel 180 is substantially the same, and instead, the driving method of the pixels 180 (pixel circuits) at the upper and lower ends by the scanning signal is different from the other driving methods. The self-luminous display device 12 according to the sixth embodiment is similar to the driving method of the pixel 180 (pixel circuit) described in the fifth embodiment except that the sampling period PWR is substantially the same, and instead, the driving voltage of the pixel 180 (pixel circuit) is different. Configurations that are the same as or similar to those of the self-luminous display device described in the first embodiment and the fifth embodiment, and configurations that are the same as or similar to those in FIGS. 1 to 19, will not be described here.

[6-1. Driving Method of Self-Luminous Display Device 12]

The driving method of the self-luminous display device 12 according to the sixth embodiment will be described with reference to FIG. 20. FIG. 20 is a schematic diagram showing a timing chart of the self-luminous display device 12 according to the sixth embodiment. In the present embodiment, the High voltage of the sampling period PWR (1) of the pixel 180E is different from the High voltage of the sampling period PWR (2) of the pixel 180F. The High voltage in the sampling period PWR (1) of the pixel 180E is higher than the High voltage of the sampling period PWR (2) of the pixel 180F. That is, the voltages of the scanning signal G (2) and the scanning signal G (3) in the period in which the scanning signal G (2) and the scanning signal G (3) supplied to the pixel 180E overlap each other may be larger than the voltages of the scanning signal G (3) and the scanning signal G (4) supplied to the pixel 180F in the period in which the scanning signal G (3) and the scanning signal G (4) supplied to the pixel 180F overlap each other. For example, over-driving may be applied to the voltage of the scanning signal G (2) and the scanning signal G (3) in the period in which the scanning signal G (2) and the scanning signal G (3) supplied to the pixel 180E overlap, thereby increasing the voltage. Here, the driving method of the pixel 180E arranged in the region 22E of the uppermost end is described. In a similar driving method, the pixel 180E arranged in the region 22E of the lowermost end can be driven.

As shown in FIG. 18, each of the region 22E at the upper and lower ends includes one row of pixel 180E in the present embodiment. However, the present invention is not limited to this, and each of the region 22E at the upper and lower ends may include the plurality of rows of pixel 180E, in which the voltage of the sampling period PWR of the pixel 180E arranged at the very end and the voltage in the sampling period PWR of the pixel E adjacent to the pixel 180E in the region 22F may be different from each other. The voltage of the sampling period PWR of the pixel 180E arranged at the very end may be larger than the voltage of the sampling period PWR of the pixel E adjacent to the pixel 180F in the region 22F. Within the region 22E, a negative gradient is provided from the voltage of the sampling period PWR of the pixel 180E arranged at the very end to the voltage of the sampling period PWR of the pixel 180E adjacent to the pixel 180F in the region 22F.

In the present embodiment, the voltage of the sampling period PWR of the pixel 180E arranged in the region 22E is larger than the voltage of the sampling period PWR of the pixel 180F arranged in the region 22F. When the voltage of the sampling period PWR is large, the voltage of the gate electrode 622 of the second transistor T2 and the voltage of the second electrode 694 of the capacitor CS are reduced (penetrated) by the capacitive coupling between the gate and the drain of the third transistor T3 (the gate electrode 632 and the first electrode 634) when the third transistor T3 is turned off. Therefore, the voltage held in the capacitor CS of the pixel 180E arranged in the region 22E is smaller than the voltage held in the capacitor CS of the pixel 180F arranged in the region 22F. By applying this voltage between the gate and the source of the gate electrode 622 and the first electrode 624 of the second transistor T2, a current smaller than the current flowing through the light emitting element OLED of the pixel 180F arranged in the region 22F flows through the light emitting element OLED of the pixel 180E arranged in the region 22E. In this way, it is possible to eliminate the phenomenon in which the outermost end of the display region emits light more brightly at low brightness, and further improve in-plane uniformity. In addition, the driving method of the self-luminous display device according to the present embodiment can be applied to the self-luminous display device according to the third embodiment or the fourth embodiment. By applying the driving method to these self-luminous display devices, it is possible to eliminate the phenomenon in which the outermost periphery of the display region emits light more brightly and further improve in-plane uniformity.

7. Seventh Embodiment

Figure 21:
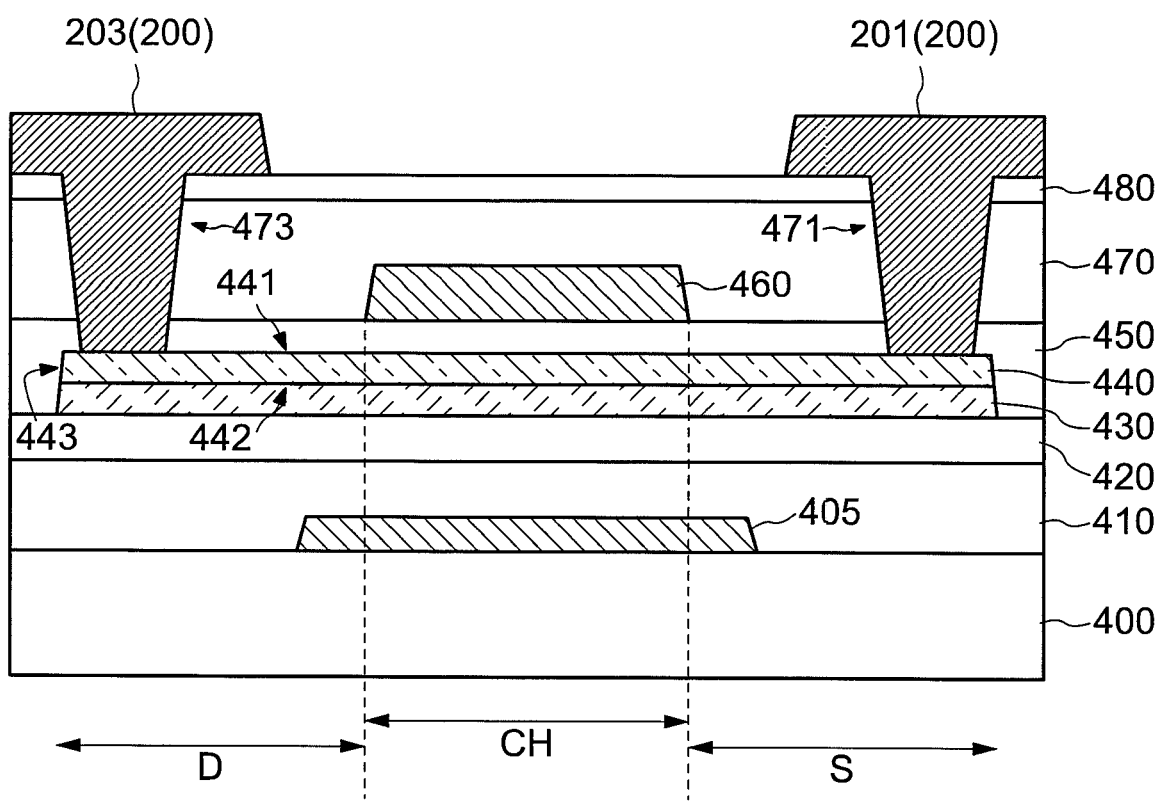
FIG. 21 is a cross-sectional view showing an overview of a semiconductor device according to a seventh embodiment of the present invention.
Figure 22:
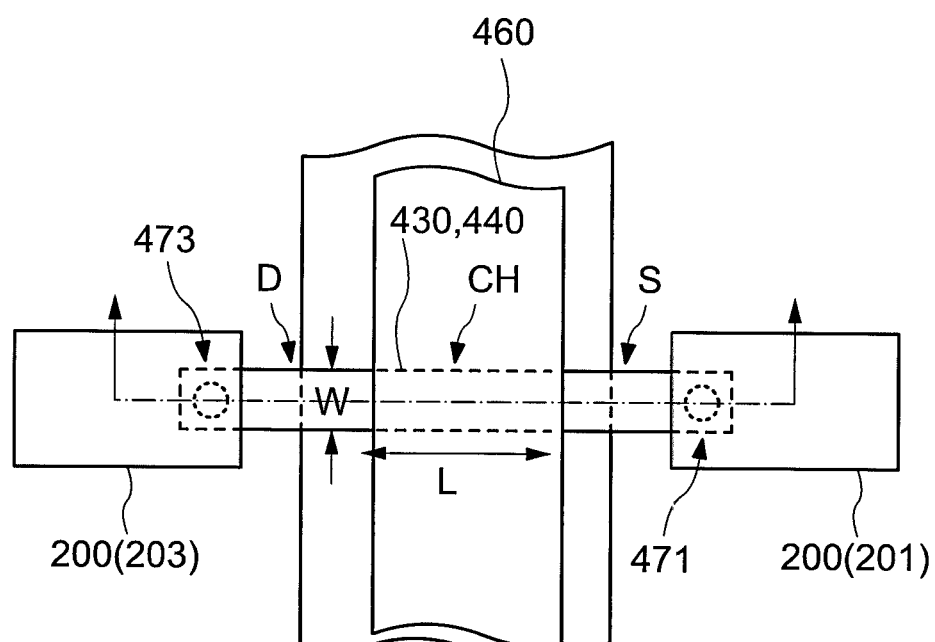
FIG. 22 is a plan view showing an overview of a semiconductor device according to the seventh embodiment of the present invention.
Figure 23:
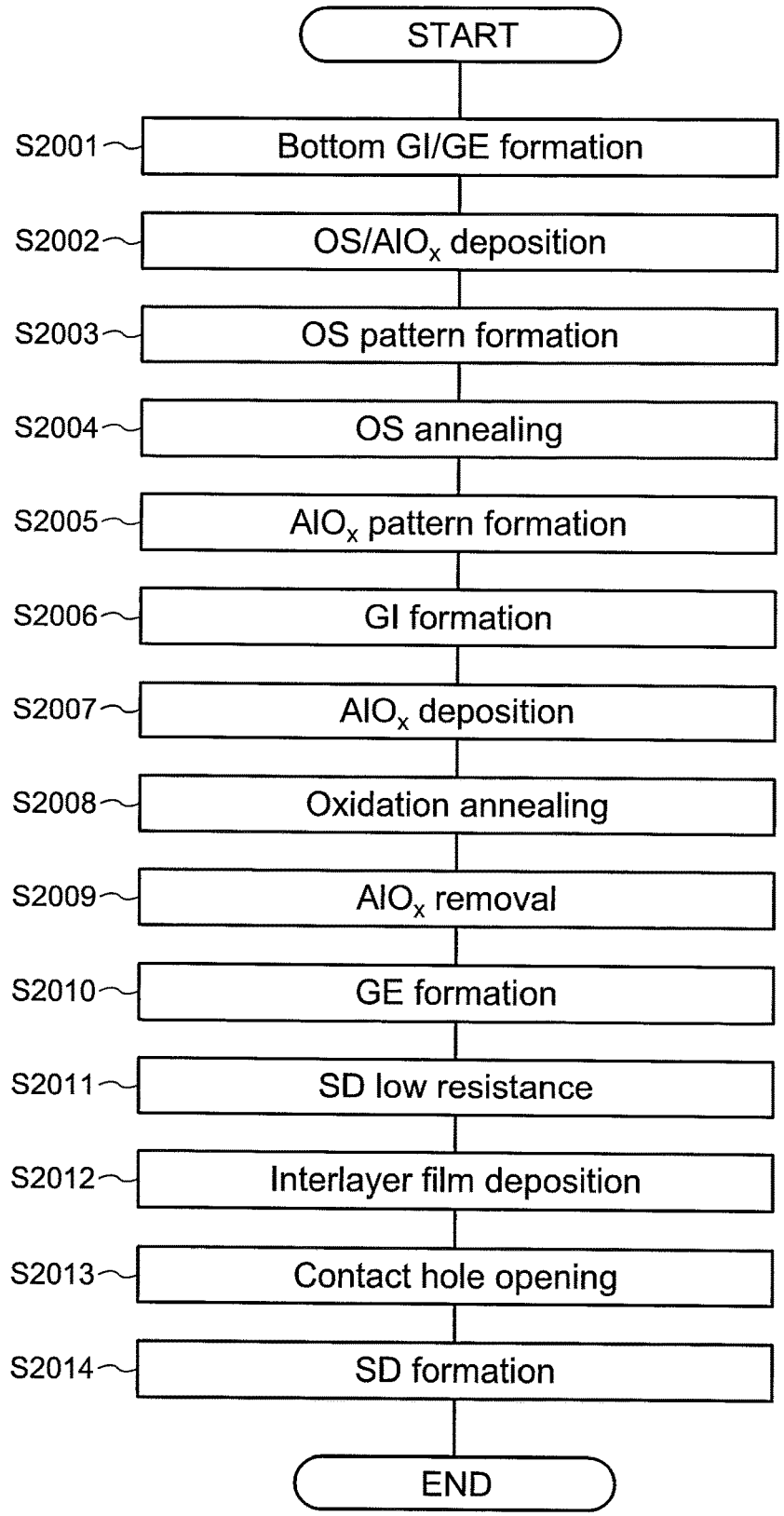
FIG. 23 is a sequence diagram showing a method for manufacturing a semiconductor device according to the seventh embodiment of the present invention.

An example of a method of manufacturing a semiconductor device 40, an electrical characteristic, and a pixel circuit used in a self-luminous display device according to the seventh embodiment will be described with reference to FIG. 21 to FIG. 33. FIG. 21 and FIG. 22 are a cross-sectional view and a plan view showing an overview of the semiconductor device 40 used in the self-luminous display device according to the embodiment of the present invention. FIG. 23 is a sequence diagram showing a method of manufacturing the semiconductor device 40. FIG. 24 to FIG. 32 are cross-sectional views showing a method of manufacturing the semiconductor device 40. FIG. 33 is a schematic diagram showing a configuration of a pixel circuit using the semiconductor device 40. Descriptions of the same or similar configurations as those in FIG. 1 to FIG. 17 will be omitted.

In a description of the seventh embodiment, a direction from a substrate toward an oxide semiconductor layer is referred to as "upper" or "above", and a direction from the oxide semiconductor layer toward the substrate is referred to as "lower" or "below". In the description of the seventh embodiment, for example, the substrate and the oxide semiconductor layer may be arranged upside down. An expression "oxide semiconductor layer on the substrate" merely describes the vertical relationship between an arrangement of the substrate and the oxide semiconductor layer, and other members may be arranged between the substrate and the oxide semiconductor layer. The expression "above" or "below" means a stacking order in a structure in which a plurality of layers is stacked. For example, in the case of expressing the pixel electrode above the transistor, a positional relationship between the transistor and the pixel electrode may be such that the positional relationship between the transistor and the pixel electrode does not overlap in a plan view. On the other hand, the expression "pixel electrode vertically above the transistor" means a positional relationship in which the positional relationship between the transistor and the pixel electrode overlaps in a plan view.

[7-1. Configuration of Semiconductor Device 40]

As shown in FIG. 21, the semiconductor device 40 is arranged above a substrate 400. The semiconductor device 40 includes a gate electrode 405, gate insulating layers 410 and 420, a metal oxide layer 430, an oxide semiconductor layer 440, a gate insulating layer 450, a gate electrode 460, insulating layers 470 and 480, a source electrode 201, and a drain electrode 203. In the case where the source electrode 201 and the drain electrode 203 are not particularly distinguished from each other, they may be collectively referred to as a source/drain electrode 200.

The gate electrode 405 is arranged on the substrate 400. The gate insulating layer 410 and the gate insulating layer 420 are arranged on the substrate 400 and the gate electrode 405. The metal oxide layer 430 is arranged on the gate insulating layer 420. The metal oxide layer 430 is in contact with the gate insulating layer 420. The oxide semiconductor layer 440 is arranged on the metal oxide layer 430. The oxide semiconductor layer 440 is in contact with the metal oxide layer 430. A surface of a main surface of the oxide semiconductor layer 440 in contact with the metal oxide layer 430 is referred to as a lower surface 442. An end portion of the metal oxide layer 430 and an end portion of the oxide semiconductor layer 440 substantially coincide with each other.

A semiconductor layer or an oxide semiconductor layer is not arranged between the metal oxide layer 430 and the substrate 400 in the seventh embodiment.

Although a configuration in which the metal oxide layer 430 is in contact with the gate insulating layer 420, and the oxide semiconductor layer 440 is in contact with the metal oxide layer 430 is exemplified in the seventh embodiment, the configuration is not limited to this. Other layers may be arranged between the gate insulating layer 420 and the metal oxide layer 430, and other layers may be arranged between the metal oxide layer 430 and the oxide semiconductor layer 440.

Although sidewalls of the metal oxide layer 430 and sidewalls of the oxide semiconductor layer 440 are arranged in a straight line in FIG. 21, the configuration is not limited to this. An angle of the side wall of the metal oxide layer 430 with respect to a main surface of the substrate 400 may be different from an angle of the side wall of the oxide semiconductor layer 440. A cross-sectional shape of the side wall of at least one of the metal oxide layer 430 and the oxide semiconductor layer 440 may be curved.

The gate electrode 460 faces the oxide semiconductor layer 440. The gate insulating layer 450 is arranged between the oxide semiconductor layer 440 and the gate electrode 460. The gate insulating layer 450 is in contact with the oxide semiconductor layer 440. A surface of the main surface of the oxide semiconductor layer 440 in contact with the gate insulating layer 450 is referred to as an upper surface 441. A surface between the upper surface 441 and the lower surface 442 is referred to as a side surface 443. The insulating layers 470 and 480 are arranged on the gate insulating layer 450 and the gate electrode 460. Openings 471 and 473 that reach the oxide semiconductor layer 440 are arranged in the insulating layers 470 and 480. The source electrode 201 is arranged inside the opening 471. The source electrode 201 is in contact with the oxide semiconductor layer 440 at a bottom portion of the opening 471. The drain electrode 203 is arranged inside the opening 473. The drain electrode 203 is in contact with the oxide semiconductor layer 440 at a bottom portion of the opening 473.

The gate electrode 405 has a function as a bottom gate of the semiconductor device 40 and a function as a light shielding film for the oxide semiconductor layer 440. The gate insulating layer 410 functions as a barrier film that shields impurities that diffuse from the substrate 400 toward the oxide semiconductor layer 440. The gate insulating layers 410 and 420 each have a function as a gate insulating layer with respect to the bottom gate. The metal oxide layer 430 is a layer containing a metal oxide containing aluminum as a main component, and has a function as a gas barrier film for shielding a gas such as oxygen or hydrogen.

The oxide semiconductor layer 440 is divided into a source region S, a drain region D, and a channel region CH. The channel region CH is a region of the oxide semiconductor layer 440 vertically below the gate electrode 460. The source region S is a region of the oxide semiconductor layer 440 that does not overlap the gate electrode 460 and is closer to the source electrode 201 than the channel region CH. The drain region D is a region of the oxide semiconductor layer 440 that does not overlap the gate electrode 460 and is closer to the drain electrode 203 than the channel region CH. The oxide semiconductor layer 440 in the channel region CH has physical properties as a semiconductor. The oxide semiconductor layer 440 in the source region S and the drain region D has physical properties as a conductor.

The gate electrode 460 functions as a light shielding film for the top gate and the oxide semiconductor layer 440 of the semiconductor device 40. The gate insulating layer 450 has a function as a gate insulating layer with respect to the top gate, and has a function of releasing oxygen by a heat treatment in a manufacturing process. The insulating layers 470 and 480 have a function of insulating the gate electrode 460 and the source/drain electrode 200 and reducing parasitic capacitance therebetween. An operation of the semiconductor device 40 is mainly controlled by a voltage supplied to the gate electrode 460. An auxiliary voltage is supplied to the gate electrode 405. However, in the case where the gate electrode 405 is simply used as a light shielding film, a specific voltage may not be supplied to the gate electrode 405 and may be floating. That is, the gate electrode 405 may be simply referred to as a "light shielding film".

In the fourth embodiment, although a configuration in which a dual-gate transistor in which a gate electrode is arranged both above and below the oxide semiconductor layer is used as the semiconductor device 40 is exemplified, the configuration is not limited to this configuration. For example, a bottom-gate transistor in which the gate electrode is arranged only below the oxide semiconductor layer, or a top-gate transistor in which the gate electrode is arranged only above the oxide semiconductor layer may be used as the semiconductor device 40. The above configuration is merely an embodiment, and the present invention is not limited to the above configuration.

As shown in FIG. 22, in a plan view, a planar pattern of the metal oxide layer 430 is substantially the same as a planar pattern of the oxide semiconductor layer 440. Referring to FIG. 18 and FIG. 19, the lower surface 442 of the oxide semiconductor layer 440 is covered with the metal oxide layer 430. In particular, in the fourth embodiment, all of the lower surface 442 of the oxide semiconductor layer 440 is covered with the metal oxide layer 430. In the direction D1, a width of the gate electrode 405 is larger than a width of the gate electrode 460. The direction D1 is a direction connecting the source electrode 201 and the drain electrode 203, and is a direction indicating a channel length L of the semiconductor device 40. Specifically, a length in the direction D1 of the region where the oxide semiconductor layer 440 and the gate electrode 460 overlap (channel region CH) is the channel length L, and a width in the direction D2 of the channel region CH is a channel width W.

Although a configuration in which all of the lower surface 442 of the oxide semiconductor layer 440 is covered with the metal oxide layer 430 is exemplified in the fourth embodiment, the configuration is not limited to this. For example, a part of the lower surface 442 of the oxide semiconductor layer 440 may not be in contact with the metal oxide layer 430. For example, all of the lower surface 442 of the oxide semiconductor layer 440 in the channel region CH may be covered with the metal oxide layer 430, and all or a part of the lower surface 442 of the oxide semiconductor layer 440 in the source region S and the drain region D may not be covered with the metal oxide layer 430. That is, all or a part of the lower surface 442 of the oxide semiconductor layer 440 in the source region S and the drain region D may not be in contact with the metal oxide layer 430. However, in the above configuration, a part of the lower surface 442 of the oxide semiconductor layer 440 in the channel region CH may not be covered with the metal oxide layer 430, and another part of the lower surface 442 may be in contact with the metal oxide layer 430.

In the fourth embodiment, although the gate insulating layer 450 is formed over the entire surface and the openings 471 and 473 are arranged in the gate insulating layer 450, the configuration is not limited to this configuration. The gate insulating layer 450 may be patterned in a shape different from the shapes in which the openings 471 and 473 are arranged. For example, the gate insulating layer 450 may be patterned so as to expose all or a part of the oxide semiconductor layer 440 in the source region S and the drain region D. That is, the gate insulating layer 450 in the source region S and the drain region D may be removed, and the oxide semiconductor layer 440 and the insulating layer 470 may be in contact with each other in these regions.

In FIG. 22, although a configuration in which the source/drain electrode 200 does not overlap the gate electrode 405 and the gate electrode 460 in a plan view is exemplified, the configuration is not limited to this configuration. For example, in a plan view, the source/drain electrode 200 may overlap at least one of the gate electrode 405 and the gate electrode 460. The above configuration is merely an embodiment, and the present invention is not limited to the above configuration.

[7-2. Material of Each Member of Semiconductor Device 40]

A rigid substrate having translucency, such as a glass substrate, a quartz substrate, and a sapphire substrate, is used as the substrate 400. In the case where the substrate 400 needs to have flexibility, a substrate containing a resin such as a polyimide substrate, an acrylic substrate, a siloxane substrate, or a fluororesin substrate is used as the substrate 400. In the case where a substrate containing a resin is used as the substrate 400, impurities may be introduced into the resin in order to improve heat resistance of the substrate 400. In particular, in the case where the semiconductor device 40 is used in a top emission type self-luminous display device, since the substrate 400 does not need to be transparent, impurities that deteriorate transparency of the substrate 400 may be used.

A general metal material is used as the gate electrode 405, the gate electrode 460, and the source/drain electrode 200. For example, aluminum (Al), titanium (Ti), chromium (Cr), cobalt (Co), nickel (Ni), molybdenum (Mo), hafnium (Hf), tantalum (Ta), tungsten (W), bismuth (Bi), silver (Ag), copper (Cu), and alloys or compounds thereof are used as the members. The above materials may be used as the gate electrode 405, the gate electrode 460, and the source/drain electrode 200 in a single layer or in a stacked layer.

A general insulating material is used as the gate insulating layers 410 and 420 and the insulating layers 470 and 480. For example, inorganic insulating layers such as silicon oxide ($SiO_x$), silicon oxynitride ($SiO_xN_y$), silicon nitride ($SiN_x$), silicon nitride oxide ($SiN_xO_y$), aluminum oxide ($AlO_x$), aluminum oxynitride ($AlO_xN_y$), aluminum nitride oxide ($AlN_xO_y$), and aluminum nitride ($AlN_x$) are used as the insulating layers.

An insulating layer containing oxygen among the insulating layers described above is used as the gate insulating layer 450. For example, an inorganic insulating layer such as silicon oxide ($SiO_x$), silicon oxynitride ($SiO_xN_y$), aluminum oxide ($AlO_x$), or aluminum oxynitride ($AlO_xN_y$) is used as the gate insulating layer 450.

An insulating layer having a function of releasing oxygen by a heat treatment is used as the gate insulating layer 420. For example, the temperature of the heat treatment in which the gate insulating layer 420 releases oxygen is 600° C. or less, 500° C. or less, 450° C. or less, or 400° C. or less. That is, for example, the gate insulating layer 420 emits oxygen at a heat treatment temperature performed in the manufacturing process of the semiconductor device 40 in the case where the glass substrate is used as the substrate 500.

An insulating layer with few defects is used as the gate insulating layer 450. For example, in the case where a composition ratio of oxygen in the gate insulating layer 450 is compared with a composition ratio of oxygen in an insulating layer having the same composition as that of the gate insulating layer 450 (hereinafter referred to as "other insulating layer"), the composition ratio of oxygen in the gate insulating layer 450 is closer to a stoichiometric ratio with respect to the insulating layer than the composition ratio of oxygen in the other insulating layer. Specifically, in the case where silicon oxide ($SiO_x$) is used for each of the gate insulating layer 450 and the insulating layer 480, a composition ratio of oxygen in the silicon oxide used as the gate insulating layer 450 is closer to a stoichiometric ratio of silicon oxide than a composition ratio of oxygen in the silicon oxide used as the insulating layer 480. For example, a layer in which no defects are observed when evaluated by electron spin resonance (ESR) may be used as the gate insulating layer 450.

$SiO_xN_y$ and $AlO_xN_y$ described above are silicon-containing and aluminum-containing compounds that contain a smaller proportion (x>y) of nitrogen (N) than oxygen (O). $SiN_xO_y$ and $AlN_xO_y$ are silicon-containing and aluminum-containing compounds that contain a lower proportion of oxygen than nitrogen (x>y).

A metal oxide layer containing aluminum as a main component is used as the metal oxide layer 430 and a metal oxide layer 490 used in the manufacturing process as described later. For example, an inorganic insulating layer such as aluminum oxide ($AlO_x$), aluminum oxynitride ($AlO_xN_y$), aluminum nitride oxide ($AlN_xO_y$), or aluminum nitride ($AlN_x$) is used as the metal oxide layer 430 (or the metal oxide layer 490). The "metal oxide layer containing aluminum as a main component" means that a ratio of aluminum contained in the metal oxide layer 430 (or the metal oxide layer 490) is 1% or more of the total amount of the metal oxide layer 430 (or the metal oxide layer 490). The ratio of aluminum contained in the metal oxide layer 430 (or the metal oxide layer 490) may be 5% or more and 70% or less, 10% or more and 60% or less, or 30% or more and 50% or less of the entire metal oxide layer 430. The ratio may be a mass ratio or a weight ratio.

A metal oxide having characteristics of a semiconductor can be used as the oxide semiconductor layer 440.

The oxide semiconductor layer 440 may be amorphous or crystalline. In addition, the oxide semiconductor layer 440 may be a mixed phase of amorphous and crystal. A crystalline oxide semiconductor is less likely to form oxygen vacancies than an amorphous oxide semiconductor.

In the semiconductor device 40, in a heat treatment process of the manufacturing process, hydrogen is released from a layer (for example, the gate insulating layers 410 and 420) arranged closer to the substrate 400 than the oxide semiconductor layer 440, and the hydrogen reaches the oxide semiconductor layer 440, so that oxygen vacancies are generated in the oxide semiconductor layer 440. This generation of the oxygen vacancy is more significant as a pattern size of the oxide semiconductor layer 440 becomes larger. In order to suppress the generation of such oxygen vacancies, it is necessary to suppress the hydrogen from reaching the lower surface 442 of the oxide semiconductor layer 440. The above is the first issue.

Apart from the problems described above, there is the following second problem. The upper surface 441 of the oxide semiconductor layer 440 is affected by a process (for example, a patterning process or an etching process) after the oxide semiconductor layer 440 is formed. On the other hand, the lower surface 442 of the oxide semiconductor layer 440 (the surface of the oxide semiconductor layer 440 on the substrate 400 side) is not affected as described above.

Therefore, oxygen vacancies formed on the upper surface 441 of the oxide semiconductor layer 440 are larger than oxygen vacancies formed on the lower surface 442 of the oxide semiconductor layer 440. That is, the oxygen vacancies in the oxide semiconductor layer 440 are not uniformly present in a thickness direction of the oxide semiconductor layer 440, but are present in a non-uniform distribution in the thickness direction of the oxide semiconductor layer 440. Specifically, the oxygen vacancies in the oxide semiconductor layer 440 are smaller toward the lower surface 442 of the oxide semiconductor layer 440 and larger toward the upper surface 441 of the oxide semiconductor layer 440.

In the case where an oxygen supply process is uniformly performed on the oxide semiconductor layer 440 having the oxygen vacancy distribution as described above, when oxygen is supplied in an amount necessary for repairing the oxygen vacancy formed on the upper surface 441 side of the oxide semiconductor layer 440, oxygen is excessively supplied to the lower surface 442 side of the oxide semiconductor layer 440. As a result, on the lower surface 442 side, a defect level different from the oxygen vacancy is formed due to the excess oxygen, and a phenomenon such as a characteristic variation in a reliability test or a decrease in field effect mobility occurs. Therefore, in order to suppress such a phenomenon, it is necessary to supply oxygen to the upper surface 441 side of the oxide semiconductor layer 440 while suppressing the supply of oxygen to the lower surface 442 side of the oxide semiconductor layer 440.

The problem described above is a newly recognized problem in the process leading to the present invention, and is not a problem that has been conventionally recognized. In the conventional configuration and manufacturing method, there is a relationship of a trade-off between the initial characteristics and the reliability test, in which the characteristic variation due to the reliability test occurs even if the initial characteristics of the semiconductor device are improved by the oxygen supply process to the oxide semiconductor layer. However, with the configuration according to the fourth embodiment, the problem described above is solved, and good initial characteristics and reliability test results of the semiconductor device 40 can be obtained.

[7-4. Manufacturing Method of Semiconductor Device 40]

A method of manufacturing the semiconductor device 40 will be described with reference to FIG. 23 to FIG. 32. Here, an example of a method of manufacturing the semiconductor device 40 in which aluminum oxide is used as the metal oxide layers 430 and 490 will be described.

Figure 24:
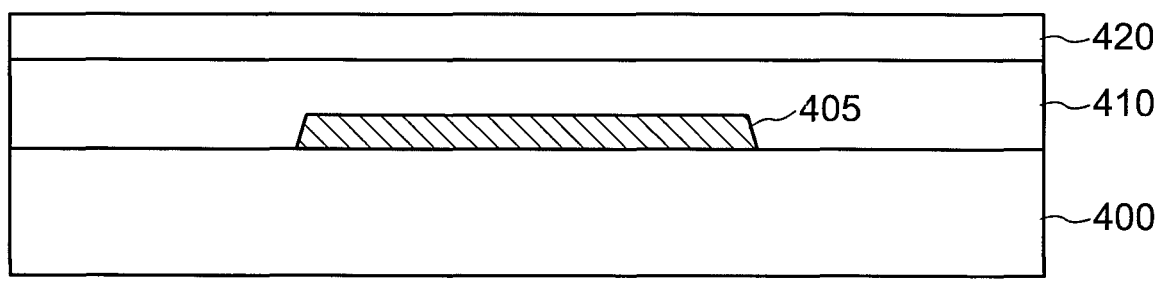
FIG. 24 is a cross-sectional view showing the method for manufacturing a semiconductor device according to the seventh embodiment of the present invention.
Figure 25:
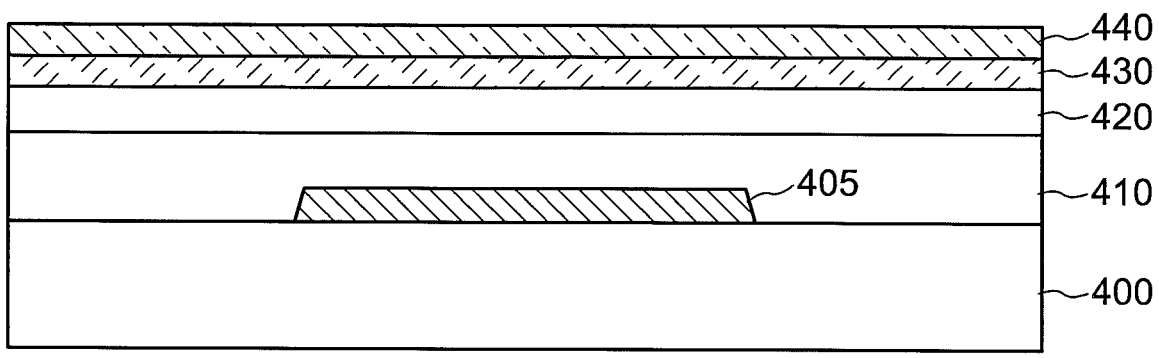
FIG. 25 is a cross-sectional view showing the method for manufacturing a semiconductor device according to the seventh embodiment of the present invention.

As shown in FIG. 23 and FIG. 24, the gate electrode 405 as a bottom gate is formed on the substrate 400, and the gate insulating layers 410 and 420 are formed on the gate electrode 405 ("Bottom GI/GE formation" in step S2001 of FIG. 23). For example, silicon nitride is formed as the gate insulating layer 410. For example, silicon oxide is formed as the gate insulating layer 420. The gate insulating layers 410 and 420 are formed by a CVD (Chemical Vapor Deposition) method. One or both of the gate insulating layers 410 and 420 may be referred to as a "first insulating layer".

For example, the gate insulating layer 410 can block impurities that diffuse from the substrate 400 side toward the oxide semiconductor layer 440 by using silicon nitride as the gate insulating layer 410. The silicon oxide used as the gate insulating layer 420 is a physical silicon oxide that releases oxygen by a heat treatment.

As shown in FIG. 23 and FIG. 24, the metal oxide layer 430 and the oxide semiconductor layer 440 are formed on the gate insulating layer 420 ("OS/AlO$_x$ film formation" in step S2002 of FIG. 23). This process may be referred to as a process in which the gate insulating layers 410 and 420 are formed on the substrate 400 and the metal oxide layer 430 is formed on the gate insulating layers 410 and 420. Alternatively, this process may be referred to as a process in which the metal oxide layer 430 is formed on the substrate 400 and the oxide semiconductor layer 440 is formed on the metal oxide layer 430. Specifically, the oxide semiconductor layer 440 is formed in contact with the metal oxide layer 430. The metal oxide layer 430 and the oxide semiconductor layer 440 are formed by a sputtering method or an atomic layer deposition method (ALD).

A thickness of the metal oxide layer 430 is, for example, 1 nm or more and 100 nm or less, 1 nm or more and 50 nm or less, 1 nm or more and 30 nm or less, or 1 nm or more and 10 nm or less. In the fourth embodiment, aluminum oxide is used as the metal oxide layer 430. Aluminum oxide has a high barrier property against gas.

In the fourth embodiment, the aluminum oxide used as the metal oxide layer 430 blocks hydrogen and oxygen released from the gate insulating layer 420, and suppresses the released hydrogen and oxygen from reaching the oxide semiconductor layer 440.

A thickness of the oxide semiconductor layer 440 is, for example, 10 nm or more and 100 nm or less, 15 nm or more and 70 nm or less, or 20 nm or more and 40 nm or less.

In the case where the oxide semiconductor layer 440 is formed by a sputtering method, the oxide semiconductor layer 440 is formed while controlling the temperature of an object to be film-formed (the substrate 400 and the structure formed thereon).

If the film formation is performed on the object to be film-formed by a sputtering method, ions generated in a plasma and atoms recoiled by the sputtering target collide with the object to be film-formed, so that the temperature of the object to be film-formed increases with the film forming process. In order to control the temperature of the object to be film-formed as described above, for example, the film formation can be performed while cooling the object to be film-formed. For example, it is possible to cool the object to be film-formed from the other side of a surface to be film-formed so that the temperature of the surface to be film-formed of the object to be film-formed (hereinafter referred to as "film formation temperature") is 100° C. or less, 70° C. or less, 50° C. or less, or 30° C. or less.

Figure 26:
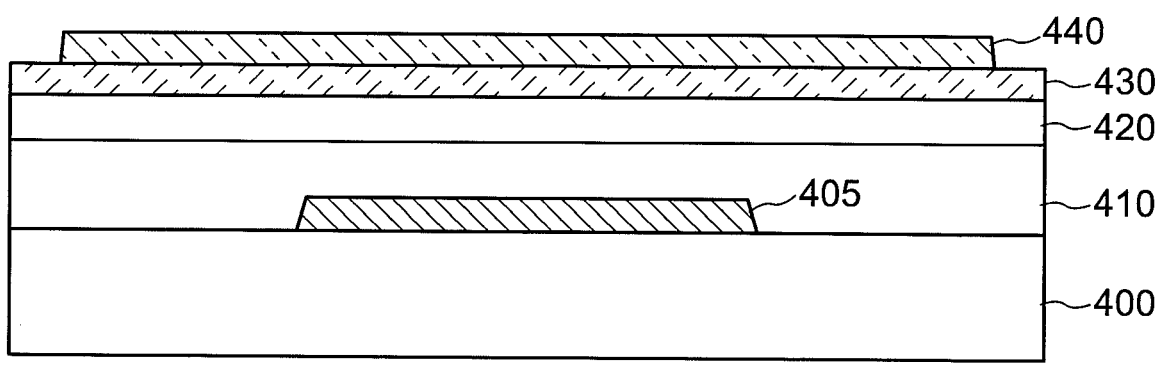
FIG. 26 is a cross-sectional view showing the method for manufacturing a semiconductor device according to the seventh embodiment of the present invention.

As shown in FIG. 23 and FIG. 26, a pattern of the oxide semiconductor layer 440 is formed ("OS patterning" in step S2003 of FIG. 23). Although not shown, a resist mask is formed on the oxide semiconductor layer 440, and the oxide semiconductor layer 440 is etched using the resist mask. Wet etching may be used, or dry etching may be used for the oxide semiconductor layer 440. Wet etching can be performed using an acidic etchant. For example, oxalic acid or hydrofluoric acid can be used as the etchant.

After the oxide semiconductor layer 440 is patterned, the oxide semiconductor layer 440 is subjected to the heat treatment (OS annealing) ("OS annealing" in step S2004 in FIG. 23).

Figure 27:
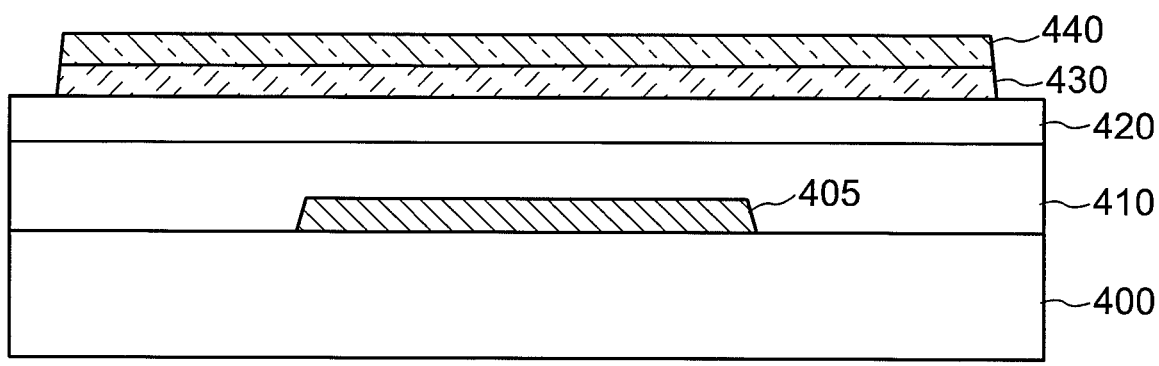
FIG. 27 is a cross-sectional view showing the method for manufacturing a semiconductor device according to the seventh embodiment of the present invention.

As shown in FIG. 23 and FIG. 27, a pattern of the metal oxide layer 430 is formed ("AlO$_x$ patterning" in step S2005 of FIG. 23). Wet etching may be used, or dry etching may be used for etching the metal oxide layer 430.

Figure 28:
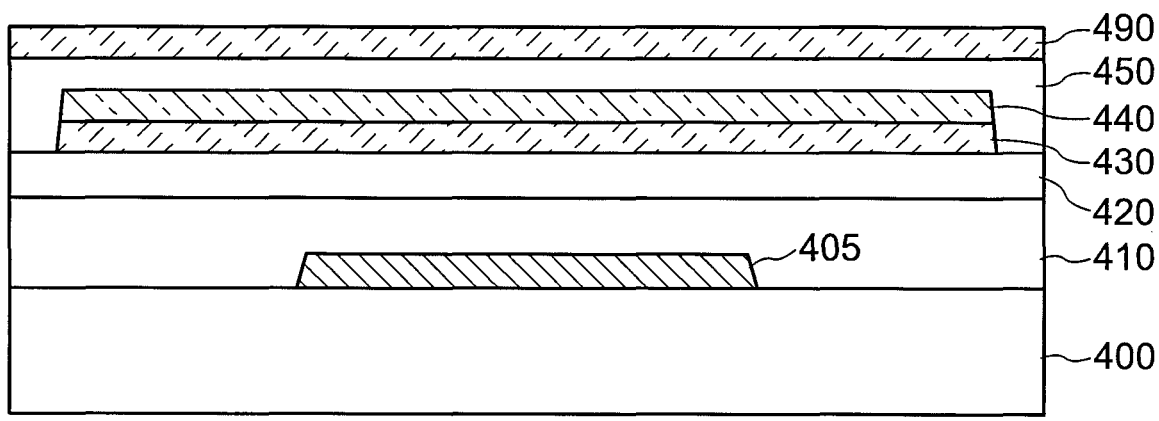
FIG. 28 is a cross-sectional view showing the method for manufacturing a semiconductor device according to the seventh embodiment of the present invention.

As shown in FIG. 23 and FIG. 28, the gate insulating layer 450 is arranged over the oxide semiconductor layer 450 ("GI formation" in step S2006 of FIG. 23). For example, silicon oxide is formed as the gate insulating layer 450. The gate insulating layer 450 is formed by the CVD method. For example, the gate insulating layer 450 may be formed at a film forming temperature of 350° C. or higher in order to form the insulating layer having less defects. A thickness of the gate insulating layer 450 is, for example, 50 nm or more and 300 nm or less, 60 nm or more and 200 nm or less, or 70 nm or more and 150 nm or less. After the gate insulating layer 450 is formed, oxygen may be implanted into a portion of the gate insulating layer 450. The gate insulating layer 450 may be referred to as a "second insulating layer". The metal oxide layer 490 is formed on the gate insulating layer 450 ("AlO$_x$ film formation" in step S2007 in FIG. 23). The metal oxide layer 490 is formed by a sputtering method. Oxygen is implanted into the gate insulating layer 450 by forming the metal oxide layer 490.

A thickness of the metal oxide layer 490 is, for example, 5 nm or more and 100 nm or less, 5 nm or more and 50 nm or less, 5 nm or more and 30 nm or less, or 7 nm or more and 15 nm or less. In the fourth embodiment, aluminum oxide is used as the metal oxide layer 490. Aluminum oxide has a high barrier property against gas. In the fourth embodiment, aluminum oxide used as the metal oxide layer 490 suppresses oxygen implanted into the gate insulating layer 450 when the metal oxide layer 490 is formed from being diffused outward.

For example, in the case where the metal oxide layer 490 is formed by a sputtering method, a process gas used in sputtering remains in the film of the metal oxide layer 490. For example, in the case where Ar is used as the process gas for sputtering, Ar may remain in the film of the metal oxide layer 490. Residual Ar can be detected by a SIMS (Secondary Ion Mass Spectrometry) analysis on the metal oxide layer 490.

With the gate insulating layer 450 formed on the oxide semiconductor layer 440 and the metal oxide layer 490 formed on the gate insulating layer 450, a heat treatment for supplying oxygen (oxidation annealing) to the oxide semiconductor layer 440 is performed ("oxidation annealing" in step S2008 of FIG. 23). In other words, the metal oxide layer 430 and the oxide semiconductor layer 440 patterned as described above are subjected to the heat treatment (oxidation annealing). Many oxygen vacancies are generated on the upper surface 441 and the side surface 443 of the oxide semiconductor layer 440 in a process between the formation of the oxide semiconductor layer 440 and the formation of the gate insulating layer 450 on the oxide semiconductor layer 440. Oxygen released from the gate insulating layers 420 and 450 is supplied to the oxide semiconductor layer 440 by the oxidation annealing, and the oxygen vacancies are repaired.

Oxygen emitted from the gate insulating layer 420 by the oxidation annealing is blocked by the metal oxide layer 430, and thus oxygen is hardly supplied to the lower surface 442 of the oxide semiconductor layer 440. Oxygen emitted from the gate insulating layer 420 diffuses from a region where the metal oxide layer 430 is not formed to the gate insulating layer 450 arranged on the gate insulating layer 420, and reaches the oxide semiconductor layer 440 via the gate insulating layer 450. As a result, the oxygen emitted from the gate insulating layer 420 is hardly supplied to the lower surface 442 of the oxide semiconductor layer 440, and is mainly supplied to the side surface 443 and the upper surface 441 of the oxide semiconductor layer 440. Further, oxygen emitted from the gate insulating layer 450 is supplied to the upper surface 441 and the side surface 443 of the oxide semiconductor layer 440 by oxidation annealing. Although there is a case where hydrogen is released from the gate insulating layers 410 and 420 by the oxidation annealing, the hydrogen is blocked by the metal oxide layer 430.

As described above, by the process of the oxidation annealing, it is possible to supply oxygen to the upper surface 441 and the side surface 443 of the oxide semiconductor layer 440 having a large amount of oxygen vacancies while suppressing the supply of oxygen to the lower surface 442 of the oxide semiconductor layer 440 having a small amount of oxygen vacancies.

Similarly, in the oxidation annealing described above, oxygen implanted in the gate insulating layer 440 is blocked by the metal oxide layer 490, and thus is suppressed from being released into the atmosphere. Accordingly, the oxygen is efficiently supplied to the oxide semiconductor layer 440 by the oxidation annealing, and the oxygen vacancies are repaired.

Figure 29:
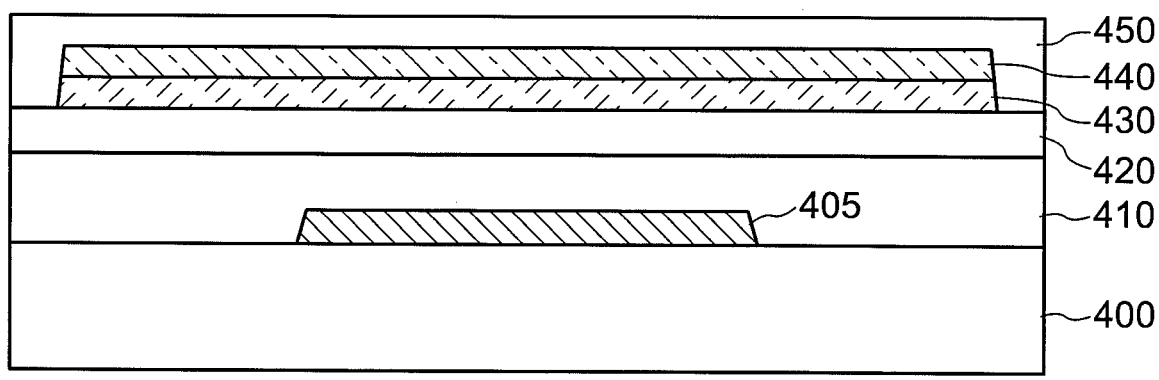
FIG. 29 is a cross-sectional view showing the method for manufacturing a semiconductor device according to the seventh embodiment of the present invention.

As shown in FIG. 23 and FIG. 29, after the oxidation annealing, the metal oxide layer 490 is etched (removed) ("AlO$_x$ removal" in step S2009 of FIG. 23). Wet etching may be used, or dry etching may be used as the etching of the metal oxide layer 490. For example, dilute hydrofluoric acid (DHF) is used in the wet etching process. The metal oxide layer 490 formed on the entire surface is removed by the etching. In other words, the metal oxide layer 490 is removed without using a mask. In other words, all of the metal oxide layer 490 in the region overlapping the oxide semiconductor layer 440 formed in one pattern is removed by etching at least in a plan view.

Figure 30:
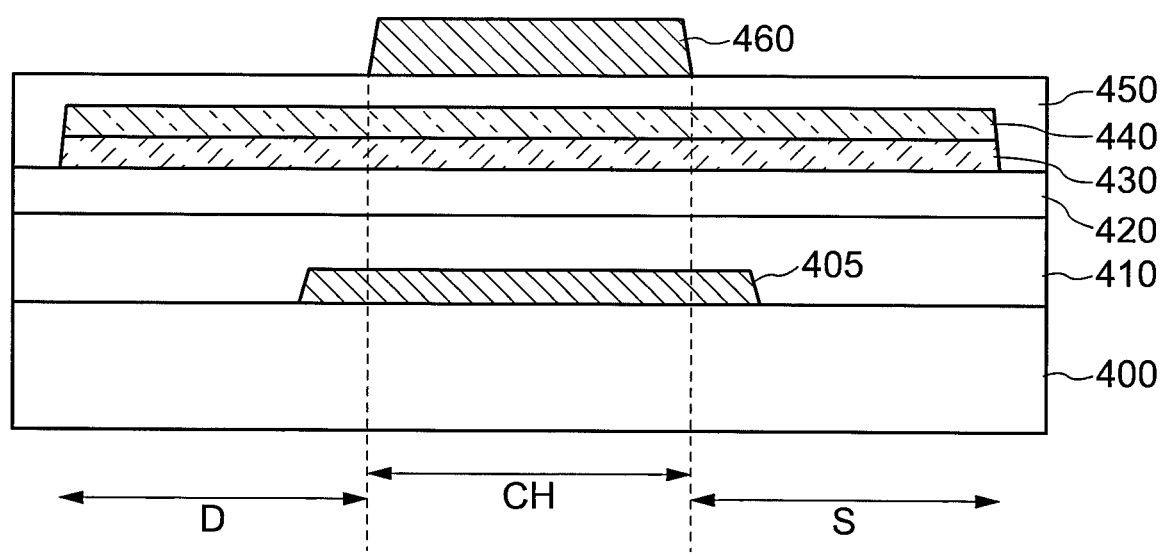
FIG. 30 is a cross-sectional view showing the method for manufacturing a semiconductor device according to the seventh embodiment of the present invention.

As shown in FIG. 23 and FIG. 30, the gate electrode 460 is formed on the gate insulating layer 450 ("GE formation" in step S2010 of FIG. 23). The gate electrode 460 is formed by a sputtering method or an atomic layer deposition method, and is patterned through a photolithography process. As described above, the gate electrode 450 is formed so as to be in contact with the gate insulating layer 450 exposed by removing the metal oxide layer 490.

With the gate electrode 460 patterned, a resistance of the source region S and the drain region D of the oxide semiconductor layer 440 is reduced ("SD resistance reduction" in step S2011 of FIG. 23). Specifically, impurities are implanted from the gate electrode 460 side to the oxide semiconductor layer 440 via the gate insulating layer 450 by ion implantation. For example, argon (Ar), phosphorus (P), and boron (B) are implanted into the oxide semiconductor layers 440 by the ion implantation. Oxygen vacancies are formed in the oxide semiconductor layer 440 by the ion implantation, thereby reducing the resistance of the oxide semiconductor layer 440. Since the gate electrode 460 is arranged above the oxide semiconductor layer 440 functioning as the channel region CH of the semiconductor device 40, no impurities are implanted into the oxide semiconductor layer 440 on the channel region CH.

Figure 31:
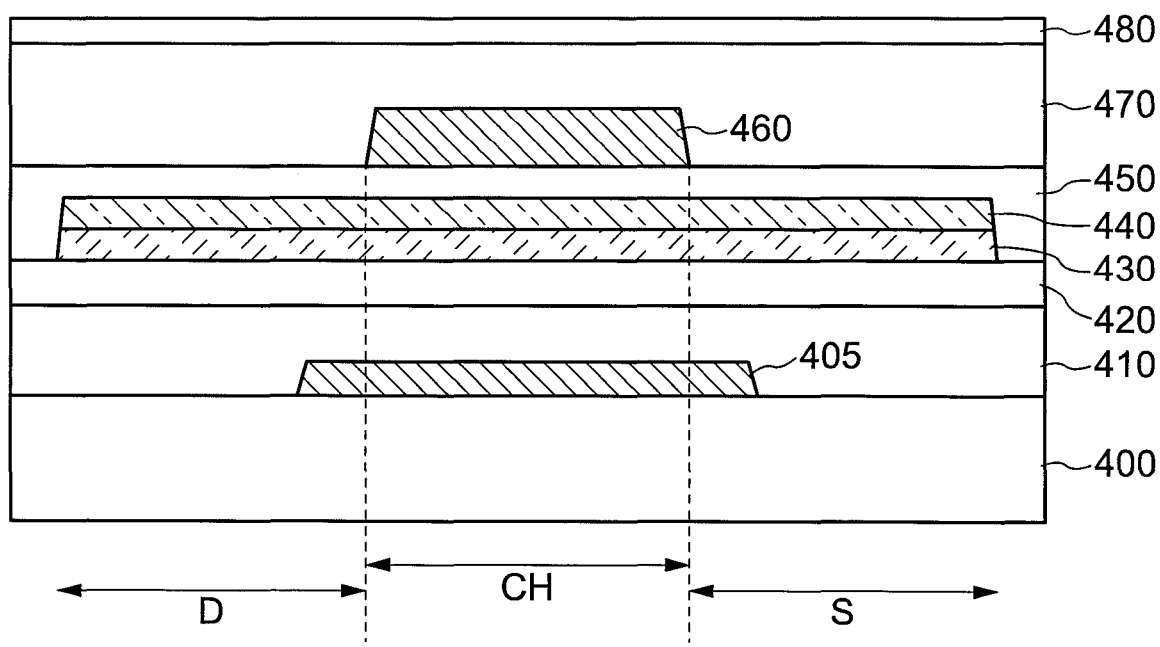
FIG. 31 is a cross-sectional view showing the method for manufacturing a semiconductor device according to the seventh embodiment of the present invention.

As shown in FIG. 23 and FIG. 31, the insulating layers 470 and 480 are formed as interlayer films on the gate insulating layer 450 and the gate electrode 460 ("interlayer film formation" in step S2012 of FIG. 23). The insulating layers 470 and 480 are formed by the CVD method. For example, silicon nitride is formed as the insulating layer 470, and silicon oxide is formed as the insulating layer 480. The materials used for the insulating layers 470 and 480 are not limited to the above. A thickness of the insulating layer 470 is 50 nm or more and 500 nm or less. A thickness of the insulating layer 480 is 50 nm or more and 500 nm or less.

Figure 32:
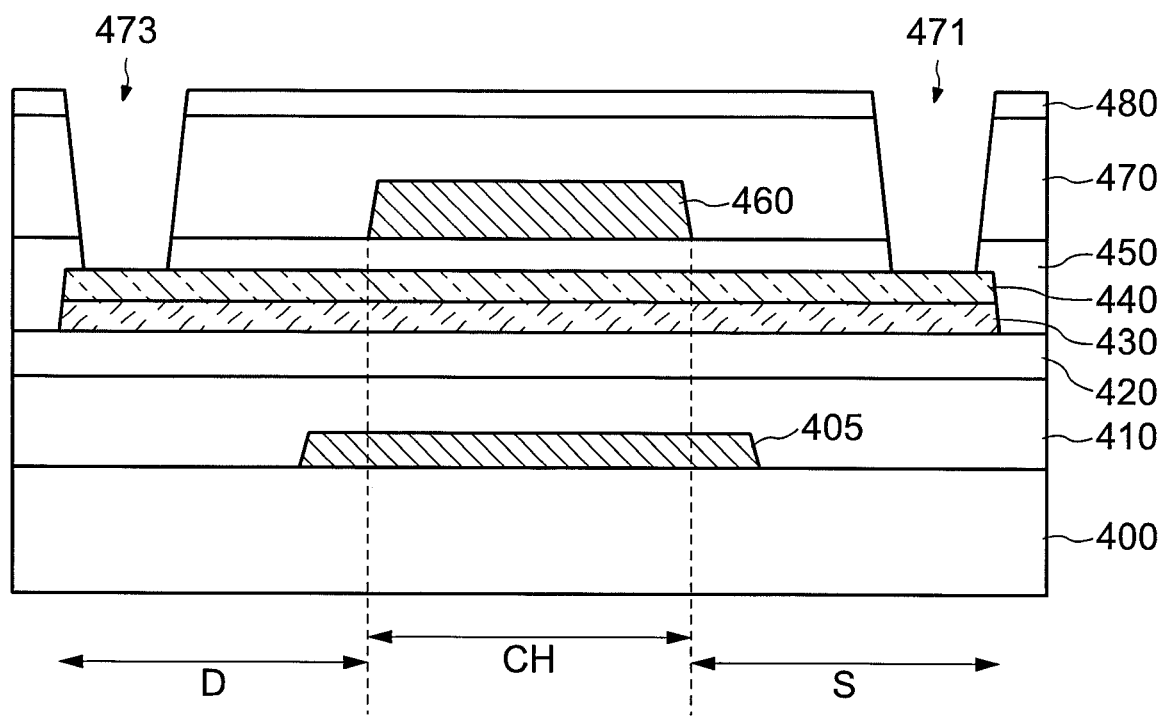
FIG. 32 is a cross-sectional view showing the method for manufacturing a semiconductor device according to the seventh embodiment of the present invention.
Figure 33:
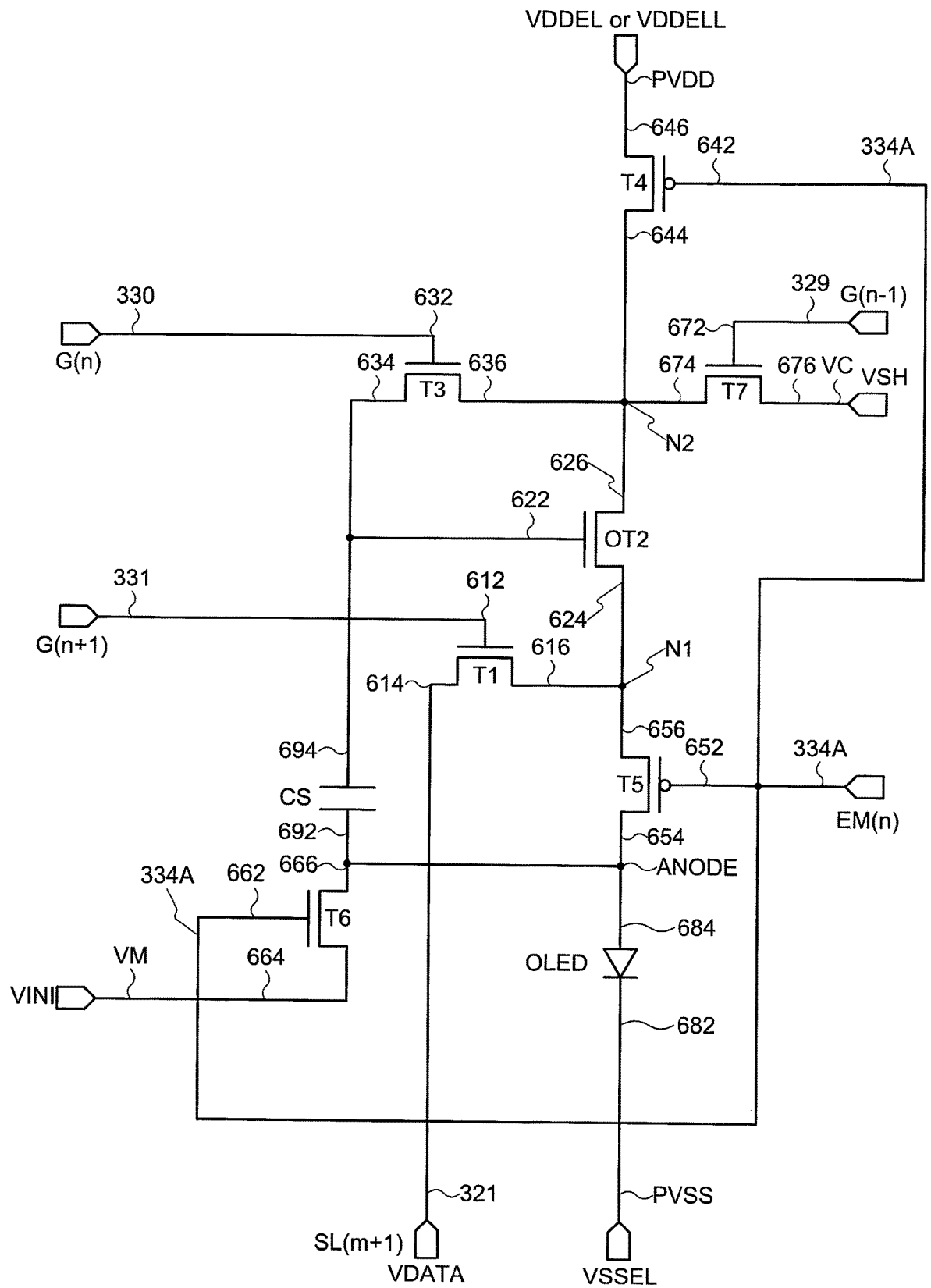
FIG. 33 is a schematic diagram showing a configuration of a pixel circuit according to the seventh embodiment of the present invention.

As shown in FIG. 23 and FIG. 32, the openings 471 and 473 are formed in the gate insulating layer 450 and the insulating layers 470 and 480 ("contact openings" in step S2013 of FIG. 23). The opening 471 exposes the oxide semiconductor layer 440 in the source region S. The opening 473 exposes the oxide semiconductor layer 440 in the drain region D. The semiconductor device 40 shown in FIG. 23 is completed by forming the source/drain electrode 200 on the oxide semiconductor layer 440 and the insulating layer 480 exposed by the openings 471 and 473 ("SD formation" in step S2044 in FIG. 23).

[7-5. Configuration of Pixel 180]

A pixel circuit 183 according to the seventh embodiment will be described with reference to FIG. 33. The semiconductor device 40 is used for a channel region CH of a second transistor OT2 in the pixel circuit shown in FIG. 33. The second transistor OT2 is a transistor called a driving transistor. The channel region CH of the second transistor OT2 according to the seventh embodiment is formed using the oxide semiconductor layer 440, whereas a channel region of a second transistor TR according to the first embodiment is formed using, for example, a low-temperature polysilicon layer (LTPS layer) or an oxide semiconductor layer having properties different from those of the oxide semiconductor layer 440.

In addition, the pixel circuit according to the fourth embodiment shown in FIG. 33 is a circuit in which the second transistor T2 of the pixel circuit 181 according to the first embodiment described with reference to FIG. 4 is replaced with the second transistor OT2 formed using the semiconductor device 40. Configurations and functions of the pixel circuit according to the seventh embodiment other than the second transistor OT2 are the same as the configuration and function of the pixel circuit 181 according to the first embodiment described with reference to FIG. 4. Therefore, descriptions will be omitted. In addition, although the channel regions of the transistors (the first transistor T1, the third transistor T3 to the seventh transistor T7) other than the second transistor OT2 are formed using, for example, a low-temperature polysilicon layer (LTPS layer), the configuration is not limited to this. The semiconductor device 40 may be used in the channel region CH of the third transistor T3 within the pixel circuit shown in FIG. 33.

Each of the embodiments described above or a part of each of the embodiments described above as the embodiment of the present invention can be appropriately combined as long as they do not conflict with each other.

It is to be understood that the present invention provides other functional effects that are different from the operational effects provided by the aspects of the embodiments described above, and those that are obvious from the description of the present specification or those that can be easily predicted by a person skilled in the art.

What is claimed is:
1. A display device comprising:
a substrate including a display region;
a first pixel arranged in a first region on an outer edge of the display region;
a second pixel arranged in a second region surrounded by the first region; and
a light emitting element electrically connected to a reference voltage line to which a reference voltage is supplied;
wherein
each of the first pixel and the second pixel comprises:
a first transistor controlled using a second control signal to which a first control signal has been shifted, the first transistor electrically connected between an image data signal line and a first node;
a second transistor electrically connected between the first node and a second node;
a first capacitor electrically connected to a gate electrode of the second transistor;
a third transistor controlled to supply a threshold voltage of the second transistor to the gate electrode of the second transistor and the first capacitor using the first control signal to which a third control signal has been shifted, the third transistor electrically connected between the second node and a gate electrode of the second transistor;
a fourth transistor controlled using a fourth control signal, the fourth transistor electrically connected between the second node and a driving power supply line to which a drive voltage is supplied;
a fifth transistor controlled using the fourth control signal, the fifth transistor electrically connected to the light emitting element and the first node;
a sixth transistor controlled to supply an initialization voltage to the light emitting element, a terminal of the fifth transistor connected to the light emitting element, and the first capacitor, the sixth transistor electrically connected to the light emitting element; and
a seventh transistor controlled to supply a reset voltage to the gate electrode of the second transistor and the first capacitor using the third control signal, the seventh transistor electrically connected to the second node;
wherein
a capacitance of a capacitor connected to the gate electrode of the second transistor of the first pixel is different from a capacitance of a capacitor connected to the gate electrode of the second transistor of the second pixel.

2. The display device according to claim 1, further comprising:
a control circuit shifting and outputting the third control signal, the first control signal, and the second control signal, sequentially.

3. The display device according to claim 2, further comprising:
a light emission control circuit that controls a timing of supplying the fourth control signal to the fourth transistor and the fifth transistor.

4. The display device according to claim 3, wherein
the first transistor, the second transistor, the third transistor, the sixth transistor, and the seventh transistor are n-channel field-effect transistors, the fourth transistor and the fifth transistor are p-channel field-effect transistors, and
the sixth transistor is controlled using the fourth control signal.

5. The display device according to claim 4, wherein
the light emission control circuit supplies an on signal to the fourth control signal, and
the control circuit supplies an on signal to the third control signal, supplies an on signal to the first control signal, supplies an off signal to the second control signal, and supplies the reset voltage to the second node, the gate electrode, and the first capacitor.

6. The display device according to claim 4, wherein
the light emission control circuit supplies an on signal to the fourth control signal, and
the control circuit supplies an off signal to the third control signal, supplies an on signal to the first control signal, supplies an on signal to the second control signal, and supplies an image data signal from the image data signal line to the first node, the second node and the gate electrode.

7. The display device according to claim 4, wherein
the light emission control circuit supplies an off signal to the fourth control signal, and
the control circuit supplies an off signal to the third control signal, supplies an off signal to the first control signal, supplies an off signal to the second control signal, and supplies an image data signal from the image data signal line to the first node and the light emitting element.

8. The display device according to claim 4, wherein
a channel region of each of the fourth transistor, the fifth transistor and the sixth transistor include a low temperature polysilicon, and
a channel region of the second transistor includes an oxide semiconductor.

9. A display device comprising:
a substrate including a display region;
a light emitting element electrically connected to a reference voltage line to which a reference voltage is supplied;
a third pixel arranged in a third region including a first end of the display region; and
a fourth pixel arranged in a fourth region adjacent to the third region, wherein
each of the third pixel and the fourth pixel comprises:
a first transistor controlled using a second control signal to which a first control signal has been shifted, the first transistor electrically connected between an image data signal line and a first node;
a second transistor electrically connected between the first node and a second node;
a first capacitor electrically connected to a gate electrode of the second transistor;
a third transistor controlled to supply a threshold voltage of the second transistor to the gate electrode of the second transistor and the first capacitor using the first control signal to which a third control signal has been shifted, the third transistor electrically connected between the second node and a gate electrode of the second transistor;
a fourth transistor controlled using a fourth control signal, the fourth transistor electrically connected between the second node and a driving power supply line to which a drive voltage is supplied;
a fifth transistor controlled using the fourth control signal, the fifth transistor electrically connected to the light emitting element and the first node;
a sixth transistor controlled to supply an initialization voltage to the light emitting element, a terminal of the fifth transistor connected to the light emitting element, and the first capacitor, the sixth transistor electrically connected to the light emitting element; and
a seventh transistor controlled to supply a reset voltage to the gate electrode of the second transistor and the first capacitor using the third control signal, the seventh transistor electrically connected to the second node; wherein
a capacitance of a capacitor connected to the image data signal line connected to the third pixel is different from a capacitance of a capacitor connected to the image data signal line connected to the fourth pixel.

10. The display device according to claim 9, further comprising:
a light emission control circuit that controls a timing of supplying the fourth control signal to the fourth transistor and the fifth transistor,
wherein
the third control signal, the first control signal, and the second control signal are shifted and output sequentially.

11. The display device according to claim 9, wherein
the third pixel is arranged in plural in the third region and shares at least one image data signal line, and
the fourth pixel is arranged in plural in the fourth region and shares at least one image data signal line.

12. The display device according to claim 9, wherein
the first transistor, the second transistor, the third transistor, the sixth transistor, and the seventh transistor are n-channel field-effect transistors, the fourth transistor and the fifth transistor are p-channel field-effect transistors, and
the sixth transistor is controlled using the fourth control signal.

* * * * *